United States Patent
Zuckerman et al.

(10) Patent No.: US 8,938,549 B2
(45) Date of Patent: *Jan. 20, 2015

(54) REDUCTION OF PEAK-TO-AVERAGE TRAFFIC RATIO IN DISTRIBUTED STREAMING SYSTEMS

(75) Inventors: Gal Zuckerman, Petah-Tikva (IL); Gil Thieberger, Kiryat Tivon (IL)

(73) Assignee: Aster Risk Management LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/579,774

(22) Filed: Oct. 15, 2009

(65) Prior Publication Data
US 2010/0094969 A1    Apr. 15, 2010

Related U.S. Application Data

(60) Provisional application No. 61/105,683, filed on Oct. 15, 2008, provisional application No. 61/251,437, filed on Oct. 14, 2009.

(51) Int. Cl.
*G06F 15/16* (2006.01)
*H04L 29/08* (2006.01)
*G06F 17/30* (2006.01)
*H03M 13/37* (2006.01)

(52) U.S. Cl.
CPC ........ *H04L 67/1008* (2013.01); *H04L 67/1097* (2013.01); *H04L 67/101* (2013.01); *H04L 67/1002* (2013.01); *G06F 17/30781* (2013.01); *G06F 17/30206* (2013.01); *H04L 67/1091* (2013.01); *H03M 13/3761* (2013.01); *H03M 13/37* (2013.01); *H04L 67/1021* (2013.01); *H04L 67/1012* (2013.01); *H04L 67/1023* (2013.01)

USPC .......................................... 709/231; 709/226

(58) Field of Classification Search
None
See application file for complete search history.

(56) References Cited

U.S. PATENT DOCUMENTS

| | | | |
|---|---|---|---|
| 5,603,029 A | 2/1997 | Aman | |
| 6,031,818 A * | 2/2000 | Lo et al. | 370/216 |
| 6,463,454 B1 | 10/2002 | Lumelsky | |
| 6,760,723 B2 * | 7/2004 | Oshinsky et al. | 707/3 |
| 6,772,217 B1 * | 8/2004 | Baumann et al. | 709/232 |
| 6,950,895 B2 | 9/2005 | Bottom | |
| 7,149,797 B1 | 12/2006 | Weller | |
| 7,174,385 B2 | 2/2007 | Li | |

(Continued)

FOREIGN PATENT DOCUMENTS

WO    WO 01/90903    11/2001

OTHER PUBLICATIONS

Suh, Push-to-Peer Video-on-Demand system design and evaluation, Thomson Technical Report, Nov. 29, 2006.

(Continued)

*Primary Examiner* — Bunjob Jaroenchonwanit
(74) *Attorney, Agent, or Firm* — Brundidge & Stanger, P.C.

(57) ABSTRACT

Reduction of peak-to-average traffic ratio in distributed streaming systems, including a large number of fractional-storage CDN servers accessed via the Internet, and storing erasure-coded fragments encoded with a redundancy factor greater than one from streaming contents, and a very large number of assembling devices obtaining the fragments from the servers in order to reconstruct the streaming contents. The assembling devices are spread over different time zones spanning at least three hours and balance the bandwidth load between the servers.

20 Claims, 46 Drawing Sheets

(56) References Cited

U.S. PATENT DOCUMENTS

| | | | |
|---|---|---|---|
| 7,292,602 B1 | 11/2007 | Liu | |
| 7,328,280 B2 | 2/2008 | Takeda | |
| 7,353,252 B1 | 4/2008 | Yang | |
| 7,480,848 B2 | 1/2009 | JiJina | |
| 7,584,285 B2 | 9/2009 | Hudson | |
| 7,649,895 B2 | 1/2010 | Kadar | |
| 7,818,430 B2* | 10/2010 | Zuckerman et al. | 709/226 |
| 7,818,441 B2* | 10/2010 | Zuckerman et al. | 709/230 |
| 7,818,445 B2* | 10/2010 | Zuckerman et al. | 709/231 |
| 7,822,855 B2* | 10/2010 | Zuckerman et al. | 709/226 |
| 7,822,856 B2* | 10/2010 | Zuckerman et al. | 709/226 |
| 7,822,869 B2* | 10/2010 | Zuckerman et al. | 709/231 |
| 7,827,296 B2* | 11/2010 | Zuckerman et al. | 709/230 |
| 7,840,679 B2* | 11/2010 | Zuckerman et al. | 709/226 |
| 7,840,680 B2* | 11/2010 | Zuckerman et al. | 709/226 |
| 7,844,712 B2* | 11/2010 | Zuckerman et al. | 709/226 |
| 2001/0042073 A1* | 11/2001 | Saether et al. | 707/202 |
| 2001/0052016 A1* | 12/2001 | Skene et al. | 709/226 |
| 2002/0065932 A1* | 5/2002 | Kobayashi | 709/233 |
| 2002/0141343 A1 | 10/2002 | Bays | |
| 2004/0117455 A1* | 6/2004 | Kaminsky et al. | 709/214 |
| 2004/0215741 A1 | 10/2004 | Watson | |
| 2004/0215806 A1* | 10/2004 | Brenner et al. | 709/232 |
| 2005/0021762 A1 | 1/2005 | Gbadegesin | |
| 2005/0033856 A1 | 2/2005 | Li | |
| 2005/0175008 A1 | 8/2005 | Thompson | |
| 2006/0005224 A1 | 1/2006 | Dunning | |
| 2006/0029037 A1 | 2/2006 | Chen | |
| 2006/0156198 A1* | 7/2006 | Boyce et al. | 714/774 |
| 2006/0265190 A1 | 11/2006 | Hein | |
| 2007/0055765 A1* | 3/2007 | Lisiecki et al. | 709/223 |
| 2007/0130361 A1 | 6/2007 | Li | |
| 2007/0133420 A1 | 6/2007 | Guven | |
| 2007/0153782 A1* | 7/2007 | Fletcher et al. | 370/389 |
| 2007/0174192 A1 | 7/2007 | Gladwin | |
| 2007/0174792 A1 | 7/2007 | Howard | |
| 2007/0177739 A1* | 8/2007 | Ganguly et al. | 380/277 |
| 2007/0268966 A1 | 11/2007 | Kim | |
| 2008/0016194 A1* | 1/2008 | Chetuparambil et al. | 709/223 |
| 2008/0046596 A1* | 2/2008 | Afergan et al. | 709/247 |
| 2008/0059631 A1* | 3/2008 | Bergstrom et al. | 709/224 |
| 2008/0065745 A1* | 3/2008 | Leighton et al. | 709/219 |
| 2008/0065975 A1 | 3/2008 | Massoulie | |
| 2008/0098123 A1* | 4/2008 | Huang et al. | 709/231 |
| 2008/0134258 A1 | 6/2008 | Goose | |
| 2008/0140826 A1* | 6/2008 | McColgan et al. | 709/224 |
| 2008/0144724 A1* | 6/2008 | Luo et al. | 375/240.26 |
| 2008/0155061 A1* | 6/2008 | Afergan et al. | 709/218 |
| 2008/0189429 A1* | 8/2008 | DaCosta | 709/231 |
| 2008/0221856 A1* | 9/2008 | Dubnicki et al. | 703/21 |
| 2008/0235391 A1* | 9/2008 | Painter et al. | 709/232 |
| 2008/0253564 A1 | 10/2008 | Kahn | |
| 2008/0256418 A1 | 10/2008 | Luby | |
| 2008/0282112 A1 | 11/2008 | Bailey | |
| 2008/0301746 A1 | 12/2008 | Wiser | |
| 2008/0307107 A1 | 12/2008 | Chen | |
| 2008/0313241 A1* | 12/2008 | Li et al. | 707/202 |
| 2009/0007196 A1* | 1/2009 | Ganesan | 725/87 |
| 2009/0024754 A1* | 1/2009 | Setton et al. | 709/231 |
| 2009/0025048 A1 | 1/2009 | Ganesan | |
| 2009/0077254 A1 | 3/2009 | Darcie | |
| 2009/0083394 A1 | 3/2009 | Diot | |
| 2009/0106441 A1 | 4/2009 | Zuckerman | |
| 2009/0150518 A1* | 6/2009 | Lewin et al. | 709/219 |
| 2009/0177760 A1* | 7/2009 | Gonzalez et al. | 709/219 |
| 2009/0182815 A1* | 7/2009 | Czechowski et al. | 709/206 |
| 2009/0248872 A1 | 10/2009 | Luzzatti | |
| 2009/0276402 A1 | 11/2009 | Stiers | |
| 2009/0313114 A1* | 12/2009 | Arampatzis | 705/14.45 |
| 2009/0327079 A1* | 12/2009 | Parker et al. | 705/14.55 |
| 2010/0036954 A1 | 2/2010 | Sakata | |

OTHER PUBLICATIONS

Suh, Push-to-Peer Video-on-Demand system: design and evaluation; Thomson Technical Report, Nov. 29, 2006.

Rodriguez, Parallel-Access for Mirror Sites in the Internet, Proceedings of IEEE INFOCOM, 2000.

Lee, Performance Analysis of a Pull-Based Parallel Video Server; IEEE Transactions on Parallel and Distributed Systems, Dec. 2000.

Cleversafe, A Paradigm Shift in Digital Assest Storage, Cleversafe Whitepaper 2008.

Lee, Parallel video servers: a tutorial, Multimedia, IEEE, Apr.-Jun. 1998.

Huang, Loss-resilient On-demand Media Streaming Using Priority Encoding, Proc. of ACM Multimedia 2004, Oct. 2004.

Arnab, e-SAFE: An Extensible, Secure and Fault Tolerant Storage System, Georgia Tech, 2005.

Wu, Segment-Based Proxy Caching of Multimedia Streams, WWW10, May 2001.

Kostic, Maintaining high bandwidth under dynamic network conditions, Proc. USENIX'05, Anaheim, CA, USA, Apr. 2005.

Suh, Push-to-Peer Video-on-Demand system: design and evaluation, 2007.

Mitzenmacher, Digital Fountains: A Survey and Look Forward, Information Theory Workshop, 2004. IEEE, Oct. 24-29, 2004.

Agarwal, Fast data access over asymmetric channels using fair and secure bandwidth sharing, International Conference on Distributed Computing Systems, 2006.

Dimakis, Network Coding for Distributed Storage Systems, Proc. of IEEE INFOCOM, 2007.

Kostic, High-bandwidth data dissemination for large-scale distributed systems, ACM Transactions on Computer Systems, vol. 26, No. 1, Article 3, Feb. 2008.

Mahanti, Scalable on-demand media streaming with packet loss recovery, SIGCOMM'01, Aug. 2001.

Kubiatowicz, OceanStore: An Architecture for Global-Scale Persistent Storage, ASPLOS 2000, Cambridge, Massachusetts, Nov. 2000.

Dony, Video-on-Demand over Internet. A Survey of Existing Systems and Solutions, Universitaires Notre-Dame de la Paix, 2008.

Suh, Push-to-Peer Video-on-Demand system, design and evaluation, 2007.

Mitzenmacher, Digital Fountains: A Survey and Look Forward, IEEE Information Theory Workshop, Oct. 2004.

Agarwal, Fast data access over asymmetric channels using fair and secure bandwidth sharing, International Conference on Distributed Computing Systems, 2006.

Wu, Segment Based Proxy Caching of Multimedia Streams, WWW10, May 2001.

Huang, Loss-resilient On-demand Media Streaming Using Priority Encoding, Proc, of ACM Multimedia, Oct. 2004.

Dony, Video-on-Demand over Internet. A Survey of Existing Systems and Solutions, Universitaires Norte-Dame de la Paix, 2008.

Kostic, High-bandwidth data dissemination for large-scale distributed systems, ACM Transactions on Computer Systems, vol. 26 No. 1, Article 3, Feb. 2008.

Cleversafe, A Paradigm Shift in Digital Asset Storage, Cleversafe Whitepaper, 2008.

Lee, Parallel video servers: a tutorial, IEEE Multimedia, Apr.-Jun. 1998.

Lee, Performance Analysis of a Pull-Based Parallel Video Server, IEEE Transactions on Parallel and Distributed Systems, Dec. 2000.

Agarwala et al., e-SAFE: An Extensible, Secure and Fault Tolerant Storage System, 2007, IEEE, retrieved from the Internet (URL: ieeexplore.ieee.org/xpls/abs_all.jsp?arnumber=4274909&tag=1), pp. 1-10 as printed.

Pitkanen et al., Erasure Codes for Increasing the Availability of Grid Data Storage, 2006, IEEE, retrieved from the Internet (URL: ieeexplore.ieee.org/xpls/abs_all.jsp?arnumber=1602318, pp. 1-10 as printed.

Wu et al., Optimal Peer Selection for Minimum-Delay Peer-to-Peer Streaming with Rateless Codes, ACM, 2005, Retrieved from the Internet: <portal.acm.org/citation.cfm?id=1099394>, pp. 1-10 as printed.

Wagner et al., Streaming of Scalable Video From Multiple Servers Using Rateless Codes, IEEE, 2006, Retrieved from the Internet: <ieeexplore.ieee.org/xpls/abs_all.jsp?arnumber=4036896&tag=1>, pp. 1-4 as printed.

(56) References Cited

OTHER PUBLICATIONS

Xu et al., On Peer-to-Peer Media Streaming, IEEE, ICDCS '02, 2002, retrieved from the internet <url:ieeexplore.ieee.org/xpls/abs_all.jsp?arnumber=1022274>,pp. 1-9 as printed.

Drougas et al., Load Balancing Techniques for Distributed Stream Processing Applications in Overlay Environments, ISORC, 2006, Retrieved from the internet: <cs.ucr.edu/%7Evana/publications.htm>, pp. 1-9 as printed.

* cited by examiner

| Content 100 | | | |
|---|---|---|---|
| 104a | 104b | 104c | 104d |

| 104aa | 104bb | 104cc | 104dd |
|---|---|---|---|

FIG. 8

| Content 100 | | | | | | | |
|---|---|---|---|---|---|---|---|

105EP

| 105a | 105b | 105c | 105d | 105e | 105f | 105g | 105h |
|---|---|---|---|---|---|---|---|

FIG. 9

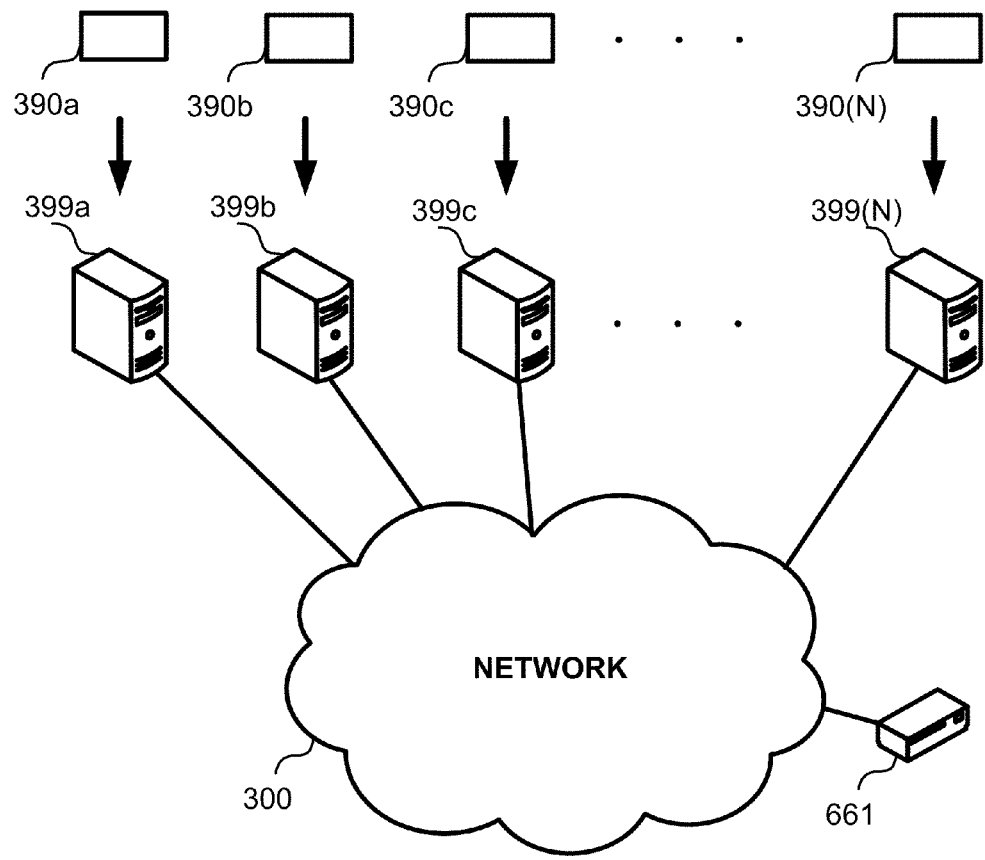
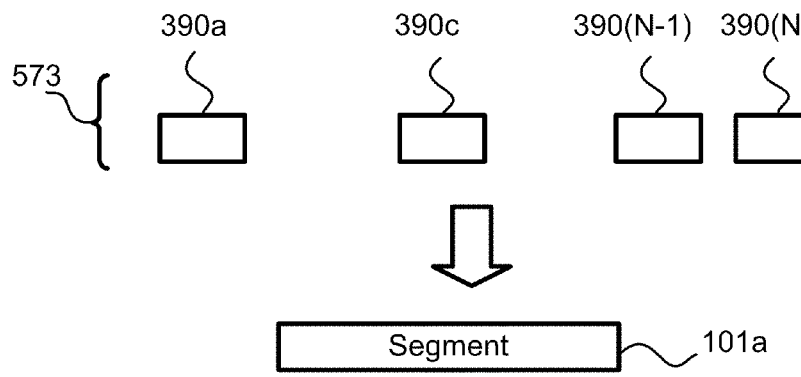
FIG. 12

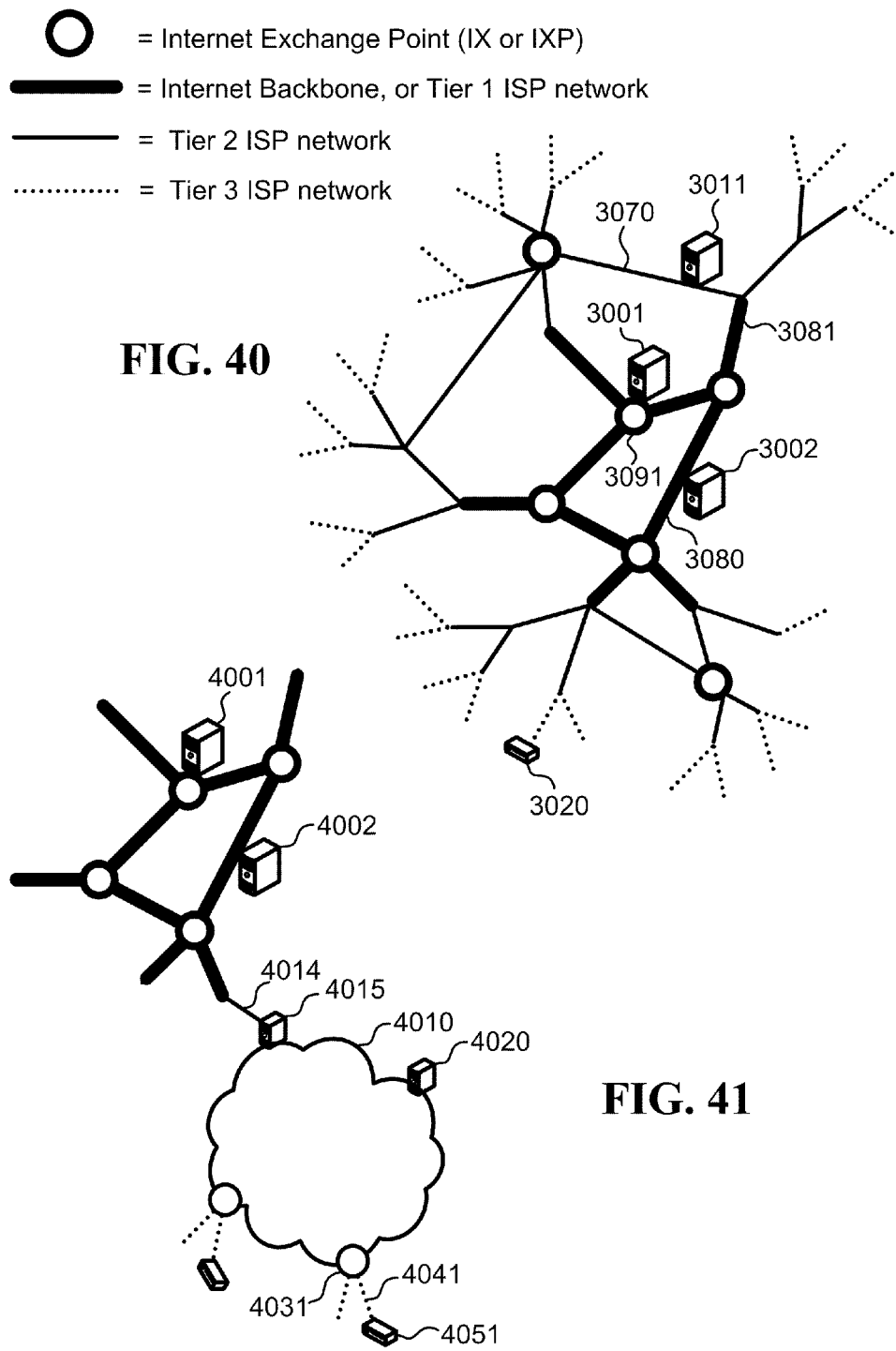

REDUCTION OF PEAK-TO-AVERAGE TRAFFIC RATIO IN DISTRIBUTED STREAMING SYSTEMS

CROSS-REFERENCE TO RELATED APPLICATIONS

This application claims the benefit of U.S. Provisional Patent Application No. 61/105,683, filed Oct. 15, 2008, and U.S. Provisional Patent Application No. 61/251,437, filed Oct. 14, 2009.

BACKGROUND

The average utilization of Internet bandwidth by content-delivering servers is usually high during peak-demand periods and low during other periods. Therefore, operating a local system, such as an edge caching storage system, may result in unsatisfactory content delivery efficiency. In addition, commonly used techniques of distributed streaming require all or most of the streaming content to be stored in multiple locations. These techniques require large amounts of storage. Moreover, commonly used Content Delivery Networks (CDN) either cache content at the edges of the Internet, or use dedicated communication lines to transport content from aggregation centers to locations near end users. These CDNs require large amounts of storage to cache content, or expensive dedicated communication lines to connect content aggregation centers to locations near end users.

BRIEF SUMMARY

In one embodiment, a streaming system comprising: a large number of fractional-storage CDN servers accessed via the Internet, and configured to store erasure-coded fragments associated with streaming contents; and a very large number of assembling devices configured to obtain the fragments from the servers in order to reconstruct the streaming contents; the assembling devices are spread over different time zones spanning at least three hours; wherein the assembling devices are further configured to balance the bandwidth load between the servers.

In one embodiment, a streaming system comprising: fractional-storage CDN servers connected to the Internet via multiple connections having an aggregated outgoing bandwidth B, configured to store, at an average storage gain >2, erasure-coded fragments associated with streaming contents; and a large number of assembling devices, spread over different time zones spanning at least three hours, configured to retrieve the fragments from the servers using a fragment pull protocol to reconstruct streaming contents; wherein the assembling devices are further configured to balance any bandwidth load between the servers via the fragment pull protocol, provided that the resulting throughput at which the servers provide fragments does not exceed B.

In one embodiment, a distributed streaming system, comprising: fractional-storage servers connected to the Internet via connections having an aggregated outgoing bandwidth B, configured to deliver erasure-coded fragments associated with streaming contents, at an aggregated rate that can approach B, to almost any combination of recipients spread over the globe; the system is characterized by a daily peak to average streaming traffic ratio that is much lower than the daily peak to average streaming traffic demand generated by streaming recipients in a single time zone.

Implementations of the disclosed embodiments involve performing or completing selected tasks or steps manually, semi-automatically, fully automatically, and/or a combination thereof. Moreover, depending upon actual instrumentation and/or equipment used for implementing the disclosed embodiments, several embodiments could be achieved by hardware, by software, by firmware, or a combination thereof. In particular, with hardware, embodiments of the invention could exist by variations in the physical structure. Additionally, or alternatively, with software, selected functions of the invention could be performed by a data processor, such as a computing platform, executing software instructions or protocols using any suitable computer operating system. Moreover, features of the embodiments may be combined.

BRIEF DESCRIPTION OF THE DRAWINGS

The embodiments are herein described, by way of example only, with reference to the accompanying drawings. No attempt is made to show structural details of the embodiments in more detail than is necessary for a fundamental understanding of the embodiments. In the drawings:

FIG. 8 and FIG. 9 illustrate different embodiments of content segmentation.

FIG. 12 illustrates an assembling device obtaining erasure-coded fragments from fractional-storage servers.

FIG. 40 illustrates fractional-storage servers located on the Internet backbone.

FIG. 41 illustrates an assembling server located at a network juncture.

DETAILED DESCRIPTION

Figure 1:
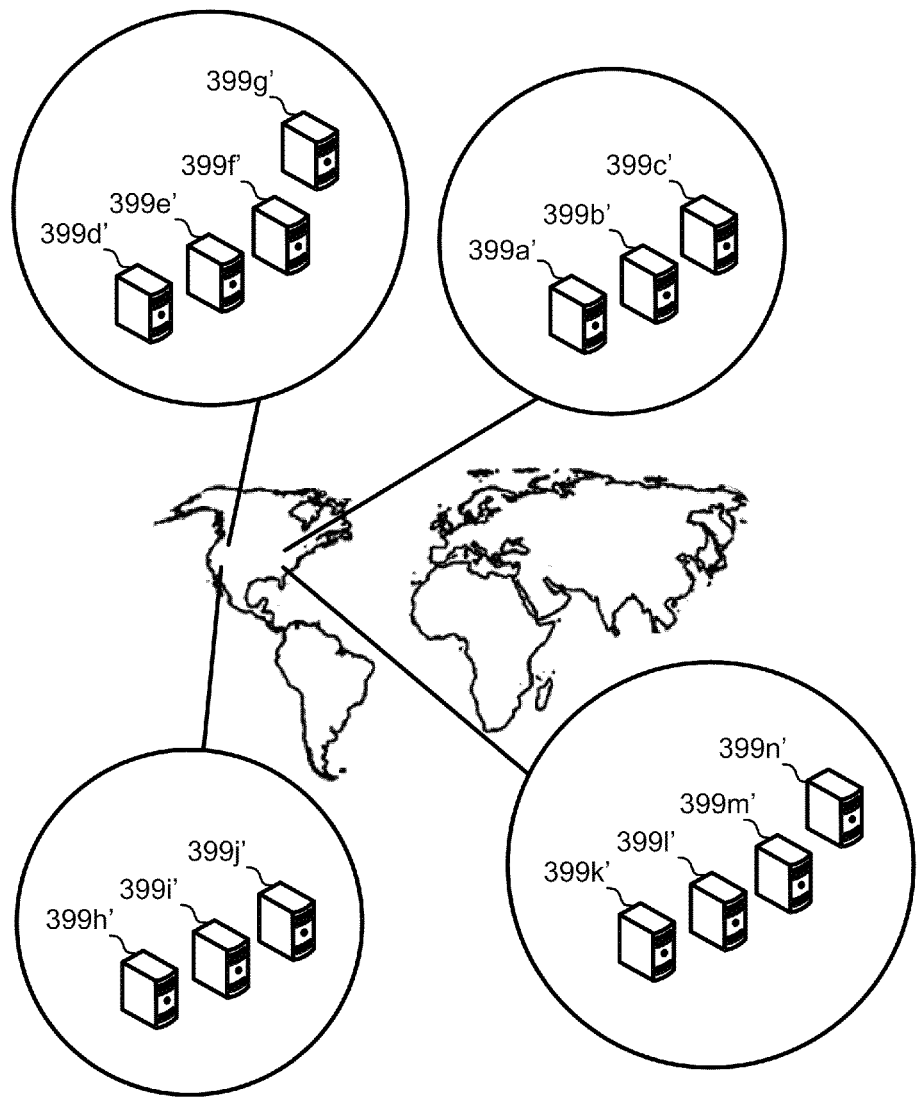
FIG. 1 illustrates US-based fractional-storage servers delivering erasure-coded fragments to assembling devices spread over the globe.

FIG. 1 illustrates one embodiment in which US-based fractional-storage servers $399a'$ to $399n'$ deliver erasure-coded fragments to assembling devices spread over the globe (not illustrated in the figure). The erasure-coded fragments are associated with segments of contents, and the assembling devices decode the erasure-coded fragments to reconstruct the segments of the contents. The assembling devices spread over the globe induce a total fragment traffic from the US-based servers having a reduced peak-to-average traffic ratio, as compared to the fragment traffic induced by assembling devices located in any single time zone. In one example, 5,000 fractional-storage servers located in the US service 10 million assembling device subscribers spread over the globe. At a first period during the day, the servers deliver erasure-coded fragments concurrently to 2 million assembling devices located primarily in Japan. At a second period during the day, the servers deliver erasure-coded fragments concurrently to 2 million assembling devices located primarily in Europe. At a third period during the day, the servers deliver erasure-coded fragments concurrently to 2.5 million assembling devices located primarily on the East Coast, and ½ million assembling devices located primarily on the West Coast. At a fourth period during the day, the servers deliver erasure-coded fragments concurrently to ½ million assembling devices located primarily on the East Coast, and 2.5 million assembling devices located primarily on the West Coast. According to this example, the servers are capable of delivering a peak fragment traffic resulting from the demand of at least 3 million assembling devices concurrently.

Figure 2:
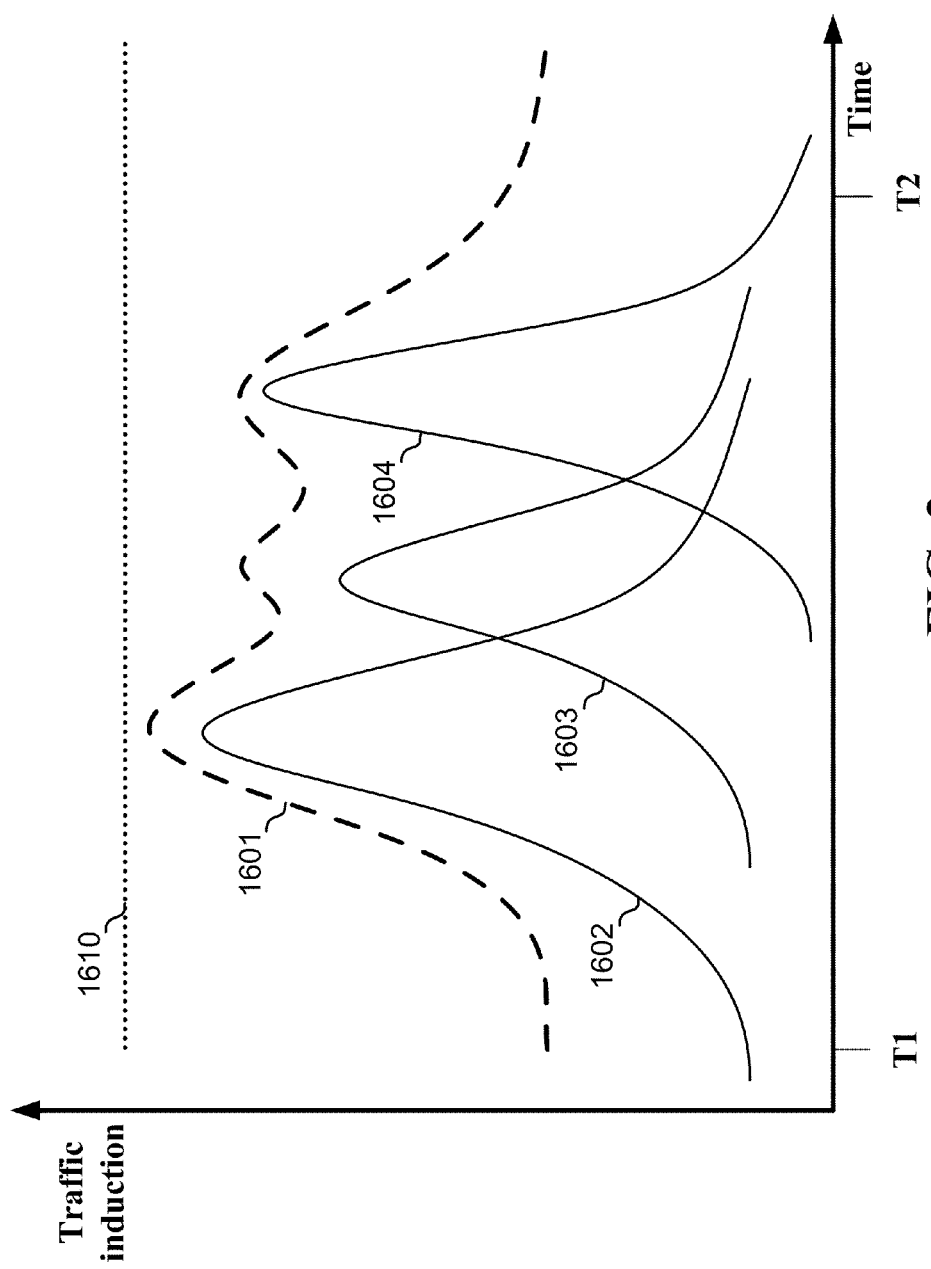
FIG. 2 illustrates peak-to-average traffic ratios generated by assembling devices distributed over different time zones.

FIG. 2 illustrates one embodiment in which assembling devices distributed over different time zones together induce fragment traffic having a reduced peak-to-average traffic ratio, as compared to the fragment traffic induced by assembling devices located in any single time zone. Graph 1602 illustrates the fragment traffic induced by assembling devices located at a first time zone. The peak of graph 1602 occurs during the late afternoon, local time of the first time zone. Similarly, graphs 1603 and 1604 illustrate induced traffic from second and third time zones. Since the first, second and third time zones are different, the peak traffic of each graph occurs at a different time. The peak-to-average fragment traffic ratios of graphs 1602 to 1604 are relatively high, since most of the traffic is generated close to the peak demand. In the case of video traffic, a daily peak-to-average traffic ratio of about six is expected during one day, starting at T1 and ending at T2. The combined traffic induced by all assembling devices is the sum of graphs 1602 to 1604, which is schematically illustrated as graph 1601. Since the peaks of graphs 1602 to 1604 occur at different times, the combined traffic 1601 behaves much more smoothly and has peaks close to the peaks of graphs 1602 to 1604, resulting in a much lower peak-to-average traffic ratio, which in some embodiments is about two or three. This means that the fractional-storage servers can be utilized during longer periods of the day when servicing assembling devices located at different time zones. In one embodiment, the distribution of the assembling devices to the different time zones results in an approximately flat traffic during the day, having a peak-to-average traffic ratio approaching one. Such a distribution is challenging in real life deployments, but can be approached by engineering the distribution of the assembling devices over the globe.

In one embodiment, the severs are connected to the Internet using guaranteed fixed bandwidth communication links, and can together deliver to the Internet fragment traffic of 1610 all day. In this case, it is clear that traffic graph 1601 utilizes the fixed bandwidth capacity 1610 better than any of the graphs 1602 to 1604, since it approaches the maximal capacity for longer periods over the day.

In one embodiment, the servers are spread over two or more continents, and some of the fragments associated with the same segments are stored on different servers located on different continents. This achieves content placement diversity, and results in better immunity to different network and server faults.

Figure 3:
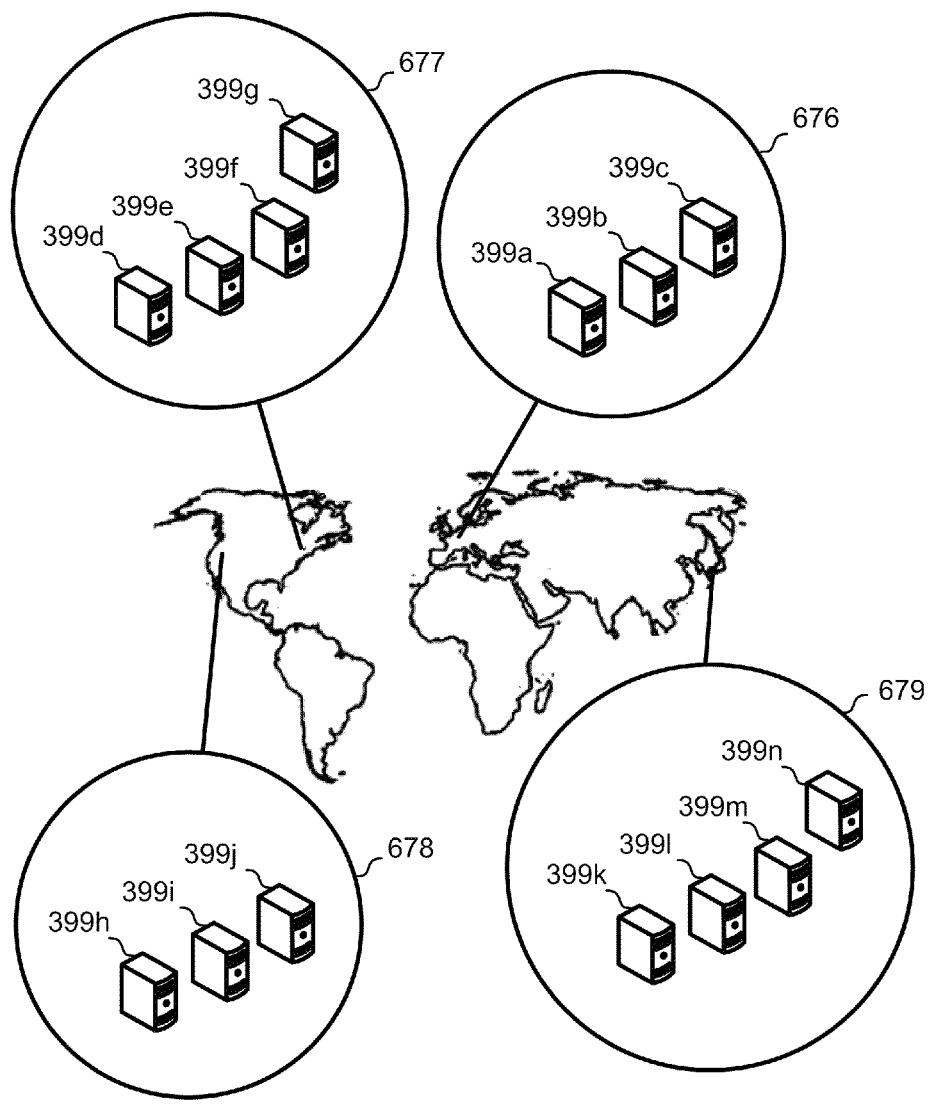
FIG. 3 illustrates geographically distributed fractional-storage servers.

FIG. 3 illustrates one example of geographically distributed fractional-storage servers $399a$ to $399n$, in which servers $399a$ to $399c$ are located in Europe 676, servers $399d$ to $399g$ are located on the east coast of the US 677, servers $399h$ to $399i$ are located on the west coast of the US 678 and servers $399k$ to $399n$ are located in Japan 679. Assembling devices all over the world obtain erasure-coded fragments from the globally distributed fractional-storage servers. The characteristics of the fractional-storage system, according to some embodiments, allow the globally distributed assembling devices to exploit the outgoing bandwidth of the globally distributed fractional-storage servers approximately up to the point where all servers 399a to 399n utilize their available outgoing bandwidth for content delivery.

In one embodiment, the main demand for fragments shifts between the different global locations as the day elapses. For example, at 8 pm Pacific Standard Time, the main fragment demand is generated from the US west coast. At that time, the local time in the east coast is late evening, the time in Europe and Japan is early morning and noon respectively, and thus very little fragment demand is generated from these regions. The high fragment demand load generated from the west coast is spread across all of the fractional-storage servers. As the day elapses, the load generated from the west coast declines, and the main load shifts to Japan as time there becomes afternoon. When that happens, the servers are still able to supply all content demands, as they are still able to deliver maximal bandwidth to assembling devices in Japan. As the cycle continues, the main load shifts again from Japan to Europe, from Europe to the US east coast, and from there back to the US west coast, following a 24-hour cycle. In some embodiments, the servers are able to deliver maximal fragment traffic, resulting from peak demands occurring during a day cycle, to anywhere on the globe.

In one example, there are 14 globally distributed fractional-storage servers; each server has a bandwidth of B, and the total capacity of the array is 14×B. Assuming the total global peak demand during the daily cycle does not exceed Bg, then the system is balanced and can meet all demands during the daily cycle if Bg<14×B, meaning that B>Bg/14. In this example, all servers may be at, or may approach, their peak bandwidth capabilities for a relatively long period, and feature relatively short idle periods. In one example, the number of servers in the global array is 10,000, from which 2,500 are located on the US west coast, 2,500 on the east coast, 2,500 in Europe and 2,500 in Japan. In one example, the number of servers in the global array is 1,000, from which 100 are located on the west coast, 700 on the east coast, 100 in Europe and 100 in Japan.

In one embodiment, multiple contents originating from multiple global locations (and therefore expected to require high loads at different times of day), are all stored on the globally distributed fractional-storage servers. Therefore, the system's bandwidth capacity equals the aggregated bandwidth of its server members, optionally regardless of which content generates high load, regardless of when the load is generated during the day, and regardless of where the load is generated from.

In one embodiment, at some point in time, some portions of the Internet may become congested at some global locations. The global system assures that servers not affected by the congestion handle the excess load, such that operation close to peak bandwidth performance is still possible.

In one embodiment, the globally distributed assembling devices retrieve fragments from the fractional-storage servers using a fragment pull protocol, and determining which servers deliver fragments to which assembling devices load balances the distributed system. In one embodiment, the globally distributed assembling devices obtain fragments from fractional-storage servers using a push protocol with multiple sub-transmissions, and determining which servers deliver fragments via the sub-transmissions to which assembling devices load balances the distributed system.

In one embodiment, the servers are spread over different time zones. Different servers located at different time zones usually encounter peak load conditions at different times, especially if they share resources, such as communication link to the Internet, processing resources, storage, Tier-1 ISP networks, backbone networks, or any other resources with local servers delivering general Internet traffic. Load conditions may refer to actual load on the servers, load on a communications link connecting the server to the Internet, load on a local backbone or Tier-1 network, or any type of condition in which additional fragment traffic will contribute to service degradation. In the case of a load condition, the system may refrain from obtaining fragments from servers that directly contribute to the load, and try to obtain fragments from servers that do not directly contribute to the load. Servers encountering load conditions below a certain threshold are usually found somewhere, as they are spread over different time zones, and these servers may be the preferred fragment sources.

Figure 4:
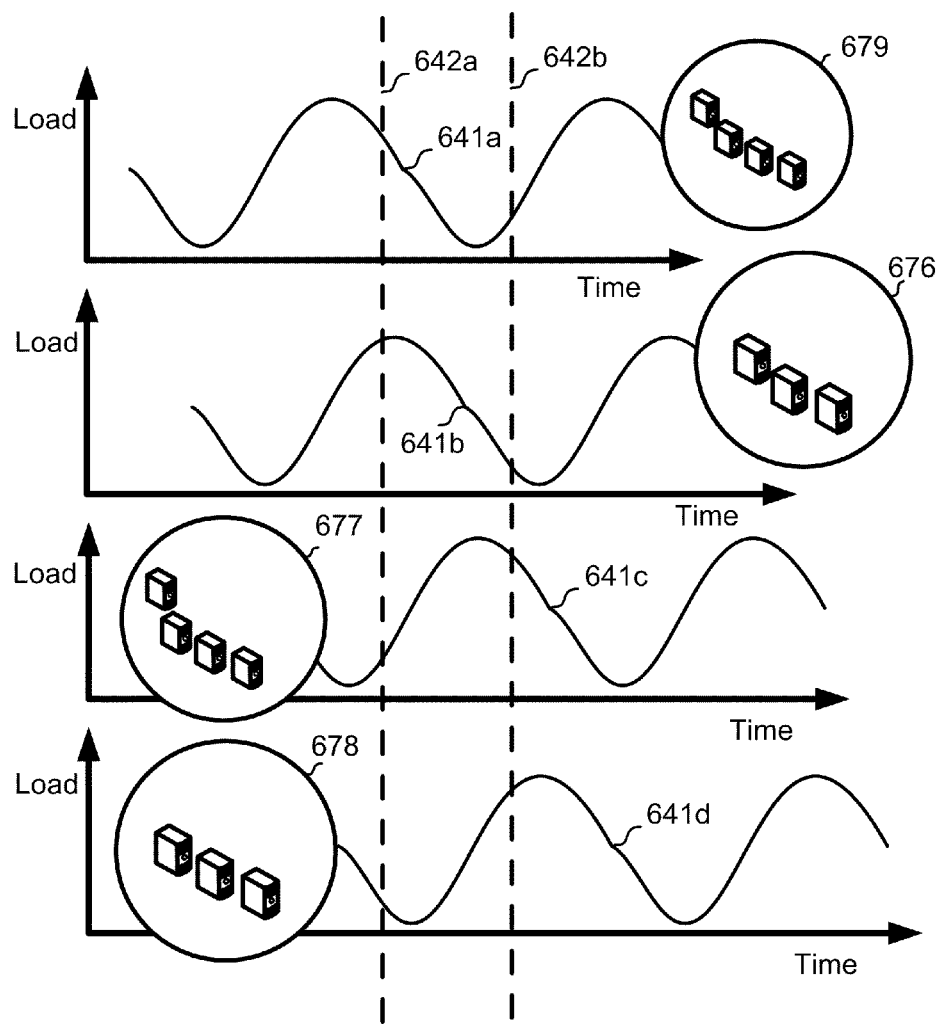
FIG. 4 illustrates different loads at different times for different time zones.

FIG. 4 illustrates one example of different loads at different times for different time zones. Graphs 641a, 641b, 641c and 641d represent load levels encountered by server groups 679, 676, 677 and 678 respectively, located in the Far East, Europe, the US east coast, and the US west coast respectively. In one example, the loads refer to traffic levels on communication links connecting the data centers, in which the servers are placed, to the Internet. In this case, the traffic may be general Internet traffic generated by servers and other application/s not necessarily related to fragment delivery, and the communication links can also be referred to as shared links, as they are used to transport both fragment traffic and general Internet traffic. During a 24-hour period, all encountered load levels complete one cycle. The load level graphs are shifted in time in respect to each other, according to the time shifts between the various time zones around the world in which the different server groups are located. As an example, graph 641a represents load encountered by the servers in the Far East, with a peak load occurring about 7 hours before graph 641b representing load encountered by the servers in Europe.

At each arbitrary point in time, server groups around the world may encounter different load conditions. As an example, at point 642a, server group 679 encounters medium load conditions, server group 676 encounters peak load conditions, and server groups 677 and 678 encounter low load conditions. Therefore, at the point in time 642a, it is beneficial for assembling devices to obtain erasure-coded fragments only from server groups 677, 678, and maybe 679. Server group 676 encounters peak load conditions, and therefore will not be approached by the assembling devices. At a different point in time 642b, the worldwide load conditions change, such that server groups 679 and 676 encounter low load conditions, and server groups 677 and 678 encounter high load conditions. At this point, assembling devices will obtain fragments from servers groups 679 and 676 and will refrain from approaching server groups 677 and 678.

In one embodiment, the load conditions encountered by each server group, or by specific servers, are published by the servers. In one embodiment, the load condition level encountered by each server is sent to each assembling device as a response to an erasure-coded fragment request.

In one embodiment, the communication link transporting fragments from a server or group of servers to the Internet is owned by a data center operator. The data center operator publishes the load condition associated with the link. The published information is used to select servers that transmit fragments via relatively unloaded links as compared to other links.

In one embodiment, the load conditions encountered by a server are detected by an outside source, such as an assembling device or a control server, using one of the following methods: (i) detecting an increased latency in responding to a request such as a fragment pull protocol request, (ii) detecting a certain level of latency variance, (iii) detecting a certain level of packet or fragment loss, and/or (iv) detecting outages in server's traffic.

Figure 5:
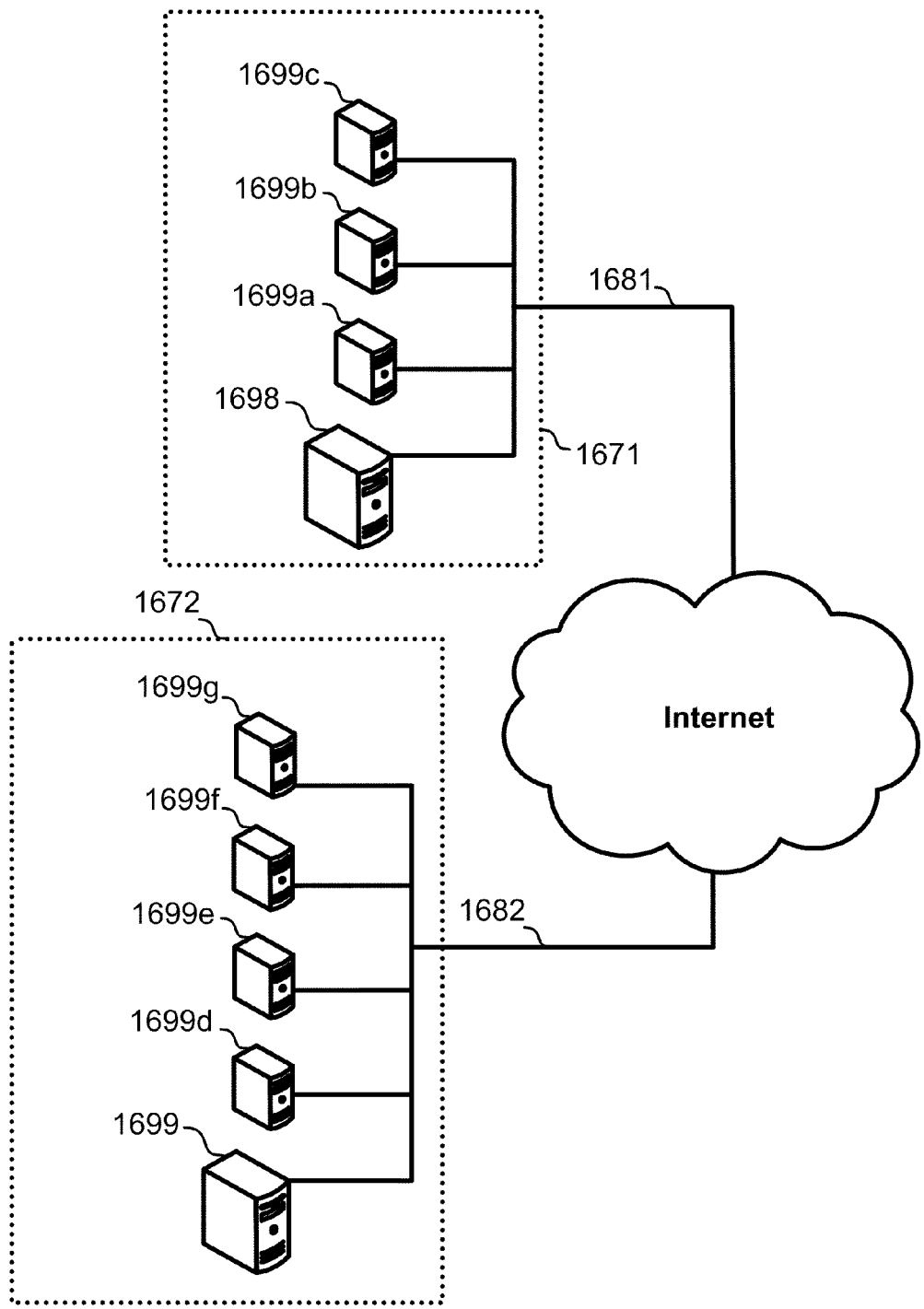
FIG. 5 illustrates data centers communicating via shared links.

FIG. 5 illustrates one embodiment of data centers communicating via shared links. Fractional-storage servers 1699a to 1699c are collocated with at least one general server 1698 in a data center 1671. All the servers are connected to the Internet via a shared communication link 1681. Therefore, erasure-coded fragment traffic transmitted by the fractional-storage servers and general Internet traffic transmitted by the general server are mixed together on the shared link 1681. Similarly, fractional-storage servers 1699d to 1699g are collocated with at least one general server 1699 in a data center 1672, and share the same communication link 1682 to the Internet. In one embodiment, the fractional-storage servers are selected for fragment transmittal when the communication link through which they transmit fragments to the Internet is loaded below a certain level. This principle is demonstrated by the following example: assuming that any three fractional-storage servers out of 1699a to 1699g store a decodable set of fragments, the three servers will be selected according to the load of the link through which they communicate. If the general server 1698 transmits a high level Internet traffic via link 1681, and this traffic is close to the maximum capacity of the link, then using any of servers 1699a to 1699c is not advisable. Instead, in a case where the general server 1699 does not create a high level traffic and link 1682 is relatively free to transport fragments, any three servers out of servers 1699d to 1699g may be used. When the fractional-storage servers deliver fragments to many assembling devices, servers transmitting via relatively unloaded links are preferred, such that the end effect is that servers 1699d to 1699g deliver a higher fragment load than servers 1699a to 1699c. In other words, servers 1699d to 1699g participate in more sub-sets of servers delivering decodable sets of fragments to assembling devices than servers 1699a to 1699c.

In one embodiment, the data center, such as 1671 and/or 1682, is an Internet service provider connected to the Internet via a fixed bandwidth link, which is used as a shared communication link to servers transmitting general Internet traffic and fractional-storage servers transmitting fragments. In one embodiment, the data center is a colocation center, having a limited link capacity to the Internet. In one embodiment, the data center or the shared link is operated by an Internet bandwidth provider. In one embodiment, the data center is operated by an ISP.

Figure 6:
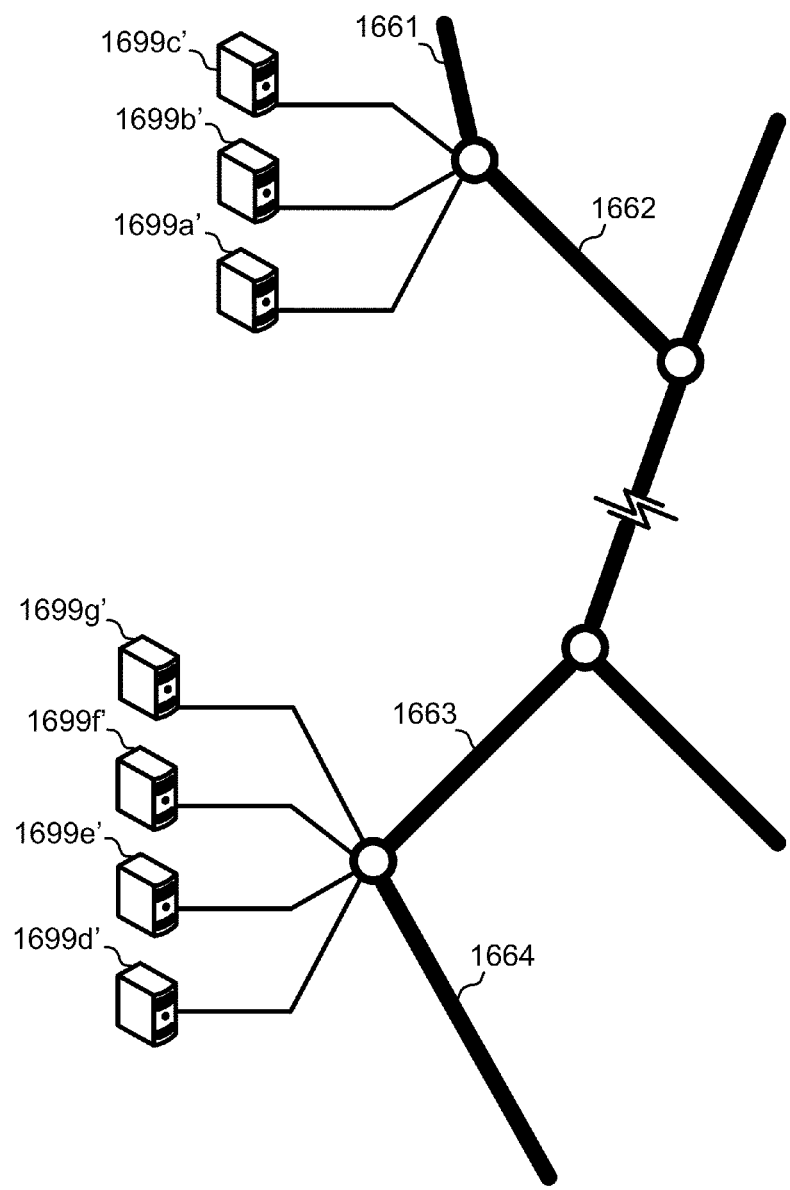
FIG. 6 illustrates fractional-storage servers communicating via shared networks.

FIG. 6 illustrates one embodiment of alternative servers communicating via shared networks. Fractional-storage servers 1699a' to 1699c' transmit erasure-coded fragment traffic over Internet backbone networks or Tier-1 networks 1661 and 1662. The fragment traffic and the general Internet traffic transported via the networks are mixed together on the networks. Similarly, fractional-storage servers 1699d' to 1699g' are connected to Internet backbone networks or Tier-1 networks 1663 and 1664. In one embodiment, the fractional-storage servers are selected for fragment transmittal when the networks through which they transmit fragments to the Internet are loaded below a certain level. This principle is demonstrated by the following example: assuming that any three fractional-storage servers out of 1699a' to 1699g' store a decodable set of fragments, the three servers will be selected according to the load of the network through which they communicate. If the general Internet traffic transported via networks 1661, 1662 is close to the maximal capacity of the networks, then using any of servers 1699a' to 1699c' is not advisable. Instead, in a case where networks 1663, 1664 are relatively unloaded with general Internet traffic, any three servers out of servers 1699d' to 1699g' may be used. When the fractional-storage servers deliver fragments to many assembling devices, servers transmitting via relatively unloaded networks are preferred, such that the end effect is that servers 1699d' to 1699g' deliver a higher fragment throughput than servers 1699a' to 1699c'. In other words, servers 1699d' to 1699g' participate in more sub-sets of servers delivering decodable sets of fragments to assembling devices than servers 1699a' to 1699c'.

In one embodiment, the servers 1699a' to 1699c' and/or 1699d' to 1699g' are connected to the backbone network or Tier-1 network via an Internet Exchange Point ("IX/IXP"). In one embodiment, the servers are connected to the backbone network or Tier-1 network via a router of the network or Tier-1 network, and are placed in a data center belonging to the backbone network or Tier-1 network operator.

In one embodiment, the traffic loads on the shared links 1681 and 1682, or shared networks 1661, 1662 and 1663, 1664 change to below a first level and above a second level, and the servers are dynamically selected accordingly. In one embodiment, the changes in the traffic loads result from changes in local Internet traffic demands during a 24-hour cycle. Different servers are located in different time zones, such that the peak of the changing traffic load occurs at different times for different servers. Servers transmitting via relatively unloaded links or networks are preferred over servers transmitting via relatively loaded links or networks as the load cycle progresses. In one embodiment, the load changes below a first level and above a second level for different links or networks at different times, and the servers are selected accordingly. For example, only servers that communicate via links or networks loaded below the first level are approached by the assembling devices.

In one embodiment, the load level metrics used to determine fractional-storage server selection preferences are approximately inversely proportional to the level of unutilized bandwidth left in shared links 1681 and 1682 or shared networks 1661, 1662 and 1663, 1664, or any other shared links or networks of similar nature. The higher the unutilized bandwidth left in a link or network, the higher the preference of using fractional-servers transmitting via that link or network. In one embodiment, the level of unutilized bandwidth is made available by the data center, and is represented in bits per second or as a percentage value out of the shared link's bandwidth capacity.

In one embodiment, the load level metrics used to determine fractional-storage server selection preferences are proportional to the level of general Internet traffic on shared links 1681 and 1682 or shared networks 1661, 1662 and 1663, 1664. The lower the general traffic transported via a link or network, the higher the preference of using fractional-servers transmitting via that link or network.

In one embodiment, when the shared link or network is loaded below a first level, the number of sub-sets in which the servers accessed via the shared link or network are allowed to participate is increased in order to increase the fragment consumption from these servers. When the shared link is loaded beyond a second level, the number of sub-sets is decreased. In one example, the amount of fragment traffic transmitted by a server is directly coupled to the number of sub-sets in which the server participates.

In one embodiment, the maximum number of sub-sets of servers delivering decodable fragments to assembling devices in which the servers accessed via the shared links 1681 and 1682 or shared networks 1661, 1662 and 1663, 1664 are allowed to participate is approximately a decreasing function of the throughput of the general Internet traffic via the shared link or network. In one example, as the general traffic increases, the server participates in fewer sub-sets, and above a certain point the server does not participate in any of the sub-sets.

In one embodiment, an assembling device will refrain from requesting fragments from a server encountering load conditions close to maximal load, or above a certain threshold. This mechanism may be used to lower the cost of placing a server or a virtual server in a colocation center or any other data center, as the geographically distributed fractional-storage servers do not consume bandwidth and/or processing resources during peak load periods. Furthermore, this mechanism may be used to lower the cost of Internet bandwidth connections to the geographically distributed fractional-storage servers, as the servers do not consume Internet bandwidth during peak load periods.

The term "erasure coding" as used herein denotes a process in which a sequence of erasure-coded fragments can be generated from a segment such that the segment can be reconstructed from any or almost any subset of the erasure-coded fragments of size equal to or somewhat larger than the size of the segment (sometimes may be referred to as "enough erasure-coded fragments" or "sufficient subset of fragments"). Examples of erasure codes include, but are not limited to, rateless codes, Reed-Solomon codes, Tornado codes, Viterbi codes, Turbo codes, any Block codes, any Convolutional codes, and any other codes that are usually used for forward error correction (FEC).

The term "rateless coding" as used herein denotes refers to a type of erasure coding in which a very long, potentially limitless, sequence of rateless-coded fragments can be generated from a segment such that the segment can be reconstructed from any or almost any subset of the rateless-coded fragments of size equal to or somewhat larger than the size of the segment (sometimes may be referred to as "enough rateless-coded fragments"). Examples of rateless codes include, but are not limited to, Raptor codes, LT codes, online codes, any Fountain codes, and any other Rateless codes.

The term "erasure-coded fragment" denotes a fragment comprising data encoded with an erasure code (which may also be a rateless code in some embodiments). The term "rateless-coded fragment" denotes a fragment comprising data encoded with a rateless code.

The term "assembling device" as used herein denotes a computing device that retrieves erasure-coded fragments from servers over a network. The assembling device may perform one or more of the following: (i) Decode the retrieved erasure-coded fragments into segments. (ii) Present the content reconstructed from the retrieved erasure-coded fragments. (iii) Act as a bandwidth amplification device, by receiving, storing, and forwarding erasure-coded fragments. In some embodiments, the assembling device may be any device located at the user premises, like an STB, PC, gaming console, DVD player, PVR device, or any other device able to retrieve erasure-coded fragments from a communication network. In some embodiments, the assembling device may be an assembling server. In some embodiments, the assembling device may be any computational device with access to a communication network, located at a central office, data center, BRAS location, ISP premises, or any other place with direct network connectivity. In one embodiment, the assembling device is coupled to a display device used for content presentation.

The abbreviation CDN denotes "Content Delivery Network". The term "CDN server" as used herein denotes a server having one or more of the following characteristics: (i) A bandwidth (CDN_BW) that is much greater than the average bandwidth consumed by a user premises device (User_BW) receiving video streaming content. In some examples, the CDN_BW is at least 10 times, 100 times, 1,000 times, or 10,000 times greater than the User_BW. (ii) The server is located outside the last mile communication infrastructure of the end users, such that the CDN server and the end users are located in different networks. For example, the CDN server is not located under a BRAS, while the end users are located under a BRAS. Moreover, in some embodiments, the CDN servers are deployed over a wide area across the Internet and optionally located close to or on the Internet backbone. In some embodiments, the CDN server does not usually retrieve and play streaming content. In some embodiments, the CDN server has a much greater storage space than the storage space of an average player of streaming content.

The term "fractional-storage server" in the context of erasure-coded fragments (also applicable to "fractional-storage CDN server"), as used herein denotes a server that (i) stores less than the minimum quantity of erasure-coded fragments required to decode the erasure-coded fragments, and (ii) where at least a meaningful quantity of the stored erasure-coded fragments is not stored in order to be consumed by the fractional-storage server.

The term "streaming content" as used herein denotes any type of content that can begin playing as it is being delivered. Streaming content may be delivered using a streaming protocol, a progressive download protocol, or any other protocol enabling a client to begin playing the content as it is being delivered. Moreover, the term "streaming protocol" includes "progressive download protocol". In addition, the verb "streaming" refers to using a streaming protocol, using a progressive download protocol, or using any other protocol enabling the receiver to begin playing the content as it is being delivered.

In some embodiments, expressions like "approximately sequential segments" may denote one or more of the following non-limiting options: segments that are sequential (in time or according to a file's order), segments that are approximately sequential (such as segments with some interlace, or segments without a great amount of non-sequential data), segments generated sequentially and/or approximately sequentially from different components of content (such as storing the i-frames and p-frames of a compressed content in different segments), and/or other sequential or approximately sequential segmentation after classification or separation into different components and/or elements.

Figure 7:
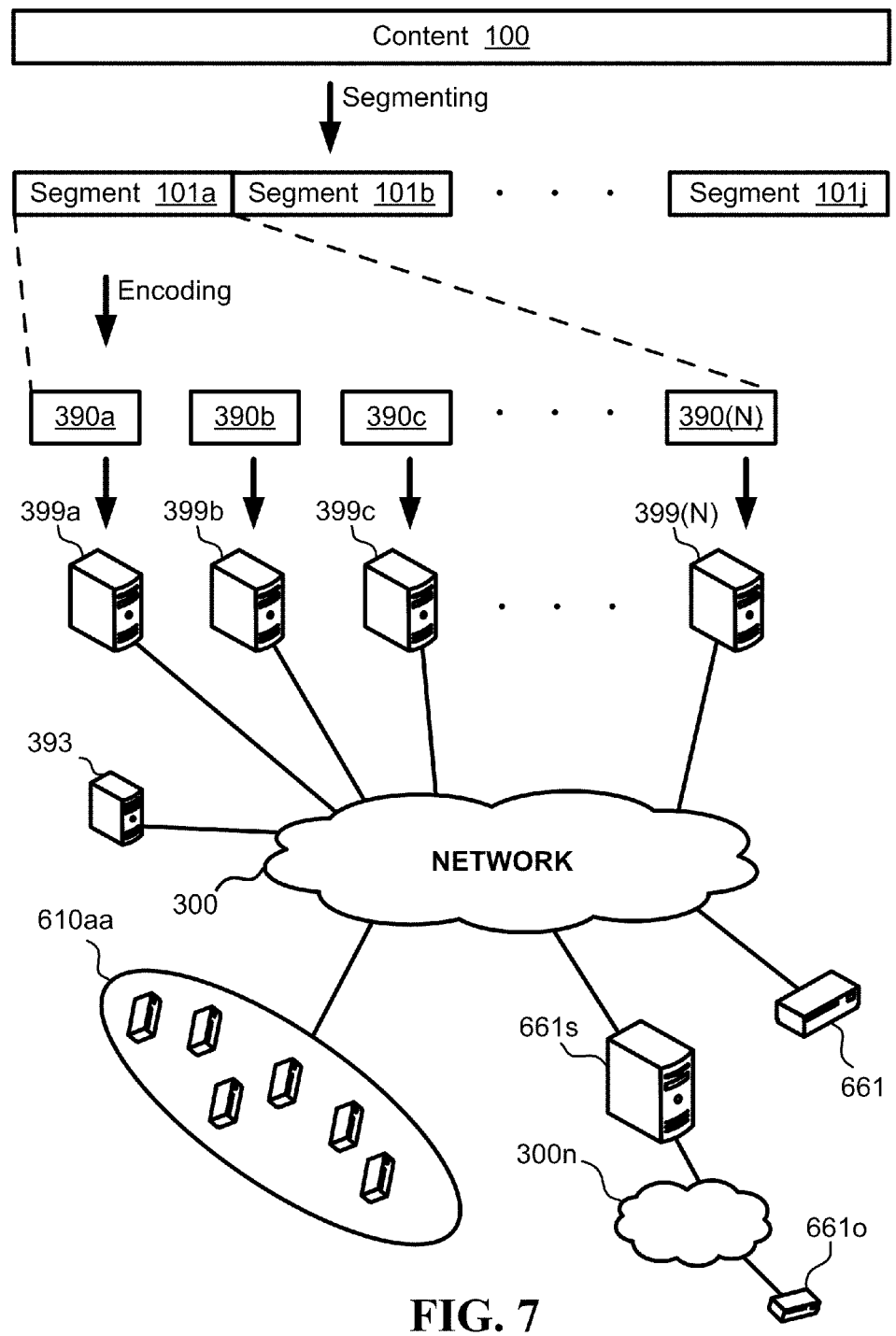
FIG. 7 illustrates one embodiment of segmenting content, encoding the segments into erasure-coded fragments, distributing the fragments to fractional-storage servers, and obtaining the fragments by assembling devices and assembling servers.

FIG. 7 illustrates one embodiment of a fractional-storage system storing erasure-coded fragments. Content 100, which may optionally be streaming content, is segmented into content segments 101a, 101b to 101j (for brevity referred to as segments). Each of the segments is encoded into erasure-coded fragments. For example, segment 101a is encoded into erasure-coded fragments 390a to 390(N). The erasure-coded fragments are distributed to the fractional-storage servers 399a to 399(N) and/or to the bandwidth amplification devices 610aa. The erasure-coded fragments are then obtained by assembling devices like 661 or proxy servers like proxy server 661s from the fractional-storage servers 399a to 399(N) and/or the bandwidth amplification devices 610aa. The obtained erasure-coded fragments are decoded to reconstruct the segments. The proxy server 661s may broadcast/multicast and/or re-stream the reconstructed content, optionally using standard streaming technique, to its client(s) 6610, optionally over network 300n. In some embodiments, the content distribution is performed in real time. In some embodiments, the content assembly is performed in real time and the presentation starts a short time after the content request.

Similarly to content 100, additional contents are segmented, encoded into erasure-coded fragments, and distributed to the fractional-storage servers and/or to the bandwidth amplification devices. Each segment may be reconstructed independently of other segments by obtaining and decoding enough erasure-coded fragments generated from that segment.

In some embodiments, the encoding scheme is erasure codes and/or rateless codes. In some embodiments, the fractional-storage servers 399a to 399(N) are Content Delivery Network (CDN) servers, optionally accessed over the public Internet. In some embodiments, the control, management, content reception, content segmentation, segment encoding, erasure-coded fragment distribution, allocation of bandwidth amplification devices, and/or other kind of central supervision and operation may be performed by managing server(s) 393, which may be a part of the CDN network. It is noted that the term "fractional-storage server" is not limited to a large server and, according to the context, may include a fractional-storage bandwidth amplification device, a fractional-storage peer server, or other types of fractional-storage servers.

In one embodiment, different quantities of erasure-coded fragments are generated per different segments. In one embodiment, some segments store data that is considered more important than data stored in other segments, and relatively more erasure-coded fragments are generated from the segments storing the more important data than from the segments storing the less important data.

In one example, a compressed video content is segmented into segments storing i-frames and segments storing p-frames. Optionally, all segments are approximately of the same size, and more erasure-coded fragments are generated from the segments storing the i-frames than from the segments storing the p-frames. Alternatively, the segments storing the i-frames are shorter than the segments storing the p-frames, and approximately the same quantity of erasure-coded fragments are generated from the segments storing the i-frames and from the segments storing the p-frames.

In one example, a DCT content is segmented into segments storing low frequencies and segments storing high frequencies. Optionally, all segments are approximately of the same size, and more erasure-coded fragments are generated from the segments storing the low frequencies than from the segments storing the high frequencies, where in addition, the size of the erasure-coded fragments generated from the segments storing the low frequencies is smaller than the size of the erasure-coded fragments generated from the segments storing the high frequencies. Alternatively, the segments storing the low frequencies are shorter than the segments storing the high frequencies, and approximately the same quantity of erasure-coded fragments are generated from the segments storing the low frequencies and from the segments storing the high frequencies.

In one embodiment, in order to reduce the time to play from requesting a content until the content begins playing, or the time from jumping to a specific location within the content until playing from that location, the assembling device may significantly increase its average consumption rate of erasure-coded fragments for some time, for example, 2 to 50 times higher than its steady state consumption rate of erasure-coded fragments. When many assembling devices simultaneously attempt to retrieve the same content using high consumption rate of erasure-coded fragments, some servers may become saturated because of the peak in the demand. Therefore, in one embodiment, the number of unique erasure-coded fragments a fractional-storage server can supply in such cases is increased. Moreover, in one embodiment, the erasure-coded fragments are retrieved from nearby servers in order to achieve low latency; but the nearby servers may not store sufficient unique erasure-coded fragments per the required segments. Therefore, an extra quantity of erasure-coded fragments is generated from segments expected to require the higher consumption rate of erasure-coded fragments, such as the segments at the beginning of a content, and/or segments at some predefined trick play start points. In one embodiment, the extra quantity of erasure-coded fragments is distributed among more servers. As a result, the load of retrieving the erasure-coded fragments is distributed among more servers, which in turn, weakens the peak effect.

In some embodiments, the content is segmented into a plurality of segments to enable beginning to play the content as it is being obtained, and optionally enable trick play. The different segments may or may not be of the same size.

The following embodiments discuss different methods for segmenting the content. In one embodiment, at least one portion of the content is segmented into multiple segments in sizes within a first size range, and the remainder of the content is segmented into a plurality of segments in sizes within a second size range (additional size/s may be added similarly). The sizes included in the second size are larger than the sizes included in the first size range. Pluralities of erasure-coded fragments are generated from each of the segments. The segments of sizes within the first size range are better suited for fast retrieval, and the segments of sizes within the second size range are better suited for high-gain storage. In one example, the segments in sizes within the first size range belong to approximately the beginning of the content. In one example, the segments in sizes within the first size range belong to locations within the content requiring trick play access. In one embodiment, the segments of the first type are encoded into fewer fragments than the segments of the second type. This allows a fast retrieval of the shorter segments.

In one embodiment, a first sub-group of the servers stores segments of the first type, and a second sub-group of the servers stores segments of the second type, whereby the first and the second sub-groups may overlap. In one example, the sub-group storing the short segments comprises a large number of servers, in order to facilitate high level of availability and responsiveness.

In one embodiment, the segments of the first type are encoded with a first redundancy factor, and the segments of the second type are encoded with a second redundancy factor, where the first redundancy factor is significantly higher than the second redundancy factor. In one example, the high redundancy factor allows the fragments of the short segment to be available on a large number of servers. In one example, the fragments associated with the first type of segments are stored on a significant amount of the servers, such that an assembling device can potentially retrieve a decodable set of fragments from nearby servers.

The term "redundancy factor" as used herein denotes the following ratio: (total size of the unique erasure-coded fragments generated from a segment and actually stored on the servers)/(size of the segment).

In one embodiment, an assembling device reconstructs segments of streaming content by obtaining, from fractional-storage servers, decodable sets of erasure-coded fragments associated with the first or the second type of segments. Each type of segment requires different amount of fragments in order to be decoded. The assembling device obtains the fragments according to information describing the position of the different types of segments within the streaming content. In one example, the information contains the number of fragments needed to decode the different types of segments. In one example, content is composed of one initial short segment requiring 20 fragments for reconstruction, followed by 1,000 long segments, each requiring 200 fragments for reconstruction. The assembling devices receive information from a control server regarding the above structure, and obtain at least 20 fragments for the first segment, followed by at least 200 fragments for each additional segment.

In one example, the content 100 is a 1 GByte encoded H.264 file, storing a 2-hour motion picture, and is segmented into approximately 10,000 segments of approximately 100 Kbytes each. In another example, the content 100 is a 4 MByte web-site information (HTML, FLASH, or any other combination of information that encodes the presentation of a website), and is segmented into 4 segments of approximately 1 MByte each.

In one example, the content supports streaming presentation, and the segments are small enough to enable presentation shortly after beginning the reception of the first segment(s). For example, each segment may include 96 KByte, allowing a 5 Mbps receiver to download the segment in approximately 0.2 seconds, and optionally begin the presentation shortly thereafter.

In one embodiment, the time to play is reduced by segmenting certain portions of the content into smaller segments, while the remaining portions are segmented into larger segments. A smaller segment can be retrieved faster, while a larger segment may be better optimized for storage gain and/or efficient transmission.

In one embodiment, the short segments are 96 Kbytes in size, and the long segments are 960 Kbytes in size. The redundancy factors used for encoding short and long segments into fragments are 100 and 5 respectively. 1500 Bytes fragments are used for both sizes. The short segments are therefore encoded into (96K/1500)×100=6,400 fragments, from which only about 64 are needed for reconstruction, and the long segments are encoded into (960K/1500)×5=3,200 fragments, from which only about 640 are needed for reconstruction. Short segments are reconstructed more quickly than long ones, as they require fewer fragments to be decoded. Optionally, each fragment is stored on a different server, resulting in a storage gain of 64 for short segments, and 640 for long segments.

Assuming all segments have approximately the same size and all fragments generated from the segments have approximately the same size (without limiting any of the embodiments), the term "storage gain" as used herein denotes the following ratio: (size of a segment)/(size of an erasure-coded fragment). If the server stores more than one erasure-coded fragment per segment, the storage gain denotes the following ratio: (size of segment)/((size of erasure-coded fragment)* (number of stored erasure-coded fragments per segment)).

FIG. 8 illustrates one example in which the content 100 is segmented into segments, such that the first segment 104*a* is smaller than the consecutive segment 104*b*, which is smaller than following segments 104*c* and 104*d*. In another example, the content 100 is segmented into segments, such that the first several segments (e.g. 104*aa* and 104*bb*, which are the same size), are smaller than consecutive segments (e.g. 104*cc* and 104*dd*, which are the same size).

FIG. 9 illustrates one example in which the content 100 is segmented into cyclic sets of successive segments increasing in size. For example, 105*b* is equal or larger in size than 105*a*, and so on, up to segment 105*d*; 105*f* is equal or larger in size than 105*e*, and so on, up to segment 105*h*. In one example, segment 105*e* is equal in size to segment 105*a*. Point 105EP represents the ending of the first set, and the beginning of the second set.

In one embodiment, segments are created on-the-fly, such as during a live event or when the content is made available to the segmentation process as an on-going stream. In one embodiment, the content supports streaming presentation, and the segments are of the small size, to enable content presentation shortly after beginning the reception of the first segment (or any other segment). In addition, the erasure-coded fragments are kept as small as possible, while still enabling efficient transport over an IP network. For example, each erasure-coded fragment is about 1500 Bytes and can be transported using one IP packet.

It is to be noted that streaming content may also be manifested as an intermediate product of a process. For example, in a case where a video camera outputs erasure-coded fragments that can be decoded into streaming content, the intermediate data from which the erasure-coded fragments are generated is considered to be streaming content (even if the video camera does not output that intermediate data). Moreover, streaming content may include: content that is produced and then immediately transmitted to a receiving server, content that is produced but stored for any length of time before being transmitted to a receiving server, content that is transmitted to a receiving server and then immediately sent from the receiving server to a client, content that is transmitted to a receiving server, then buffered for some time at the receiving server and then sent from the receiving server to a client, content that is solely played at a client, and content that is manipulated or changed or reacted to at the client while a continuation of the content is still being played at the client.

Figure 10:
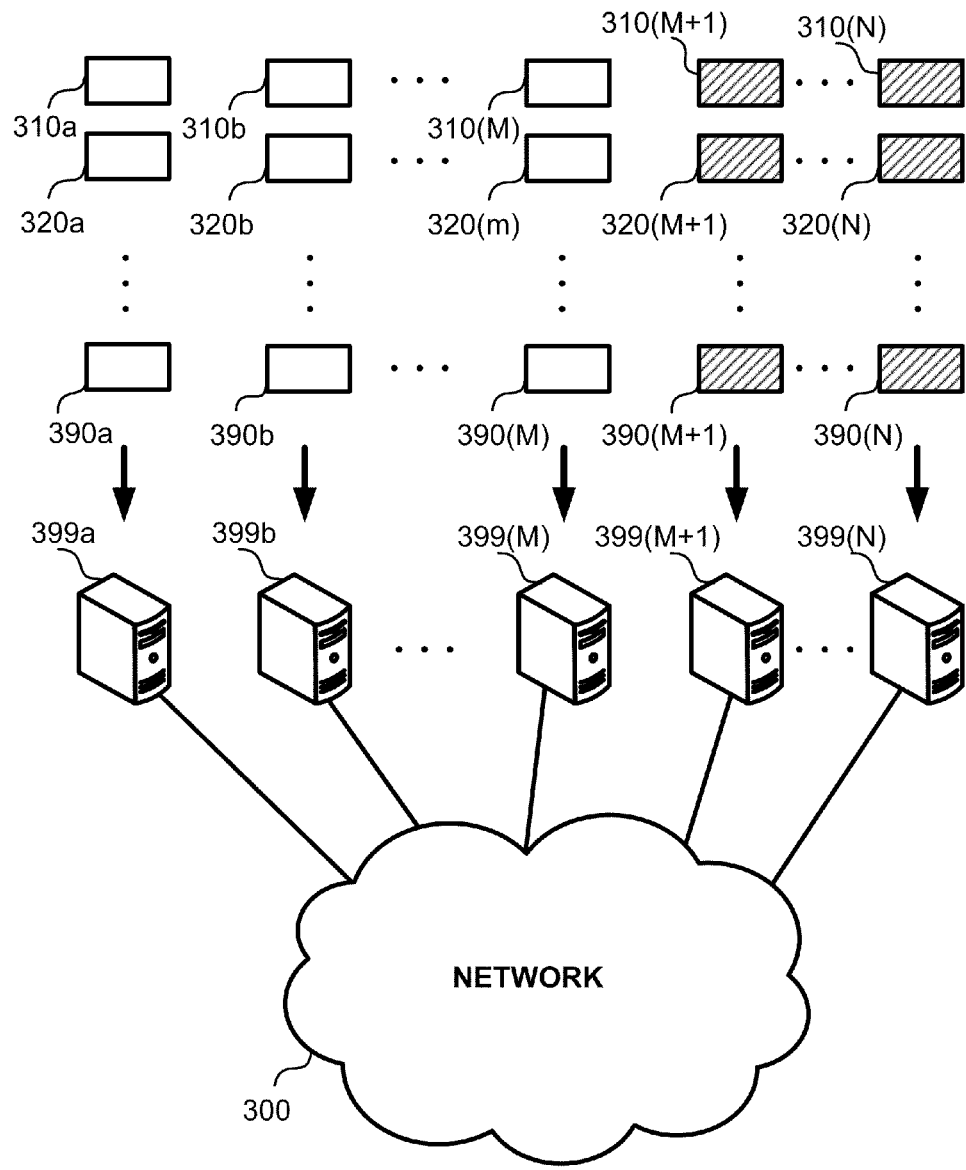
FIG. 10 illustrates distribution and storage of erasure-coded fragments on fractional-storage servers.

FIG. 10 (without the fragments marked with dashed lines) illustrates one example of distributing the erasure-coded fragments to 'M' CDN servers 399*a* to 399(M), connected to a network 300. Encoded fragments 310*a* to 310(M) of a first segment are sent for storage in servers 399*a* to 399(M) respectively. Similarly, erasure-coded fragments 320*a* to 320 (M) of a second segment are sent for storage in servers 399*a* to 399(M) respectively. In addition, other erasure-coded fragments associated with other segments of other contents, illustrated as erasure-coded fragments 390*a* to 390(M), are sent for storage in servers 399*a* to 399(M) respectively. The number of unique erasure-coded fragments from each segment that are stored on the servers (399*a* to 399(M)) is equal to M in this example, where M may be smaller than the maximum number of unique erasure-coded fragments, meaning that only a subset of the potential erasure-coded fragments are actually stored. It is also possible to store the maximum number of unique erasure-coded fragments, or store more than one unique erasure-coded fragment per segment per server. The network 300 may be the Internet for example, or any other data network connecting multiple nodes, such as a private IP network, or a Wide Area Network ("WAN"). In one embodiment, the fragments marked with dashed lines illustrate one example where (N-M) additional servers are added to the array, and (N-M) new unique erasure-coded fragments per segment per content (310(M+1) to 310(N), 320(M+1) to 320(N), and 390(M+1) to 390(N)) are generated and added to the array. In one embodiment, only M out of the maximum possible erasure-coded fragments (L) are actually generated for storage in the first place. In one embodiment, when the additional N-M erasure-coded fragments are needed for storage (e.g., when additional servers are made available), the remainder of the N-M erasure-coded fragments are actually generated. Any time that additional unique erasure-coded fragments are needed, this process of calculating the additional erasure-coded fragments is repeated, up to the point that all L possible erasure-coded fragments are used.

In one embodiment, and especially when using rateless coding, L may be chosen as a sufficiently large number to account for any realistic future growth of the server array. For example, a segment of 96 Kbytes is expanded using a rateless code with a ratio of 1 to 2^16 original symbols to encoded data, into an encoding symbol of potential size 6.29 GBytes.

Assuming a 1500 Bytes erasure-coded fragment size, then potentially 4.19 million unique erasure-coded fragments can be generated. Now, it is safe to assume that for all practical uses, the server array will not grow to more than 4.19 million nodes, and may contain several thousands of servers, meaning that the encoded data can be used in all cases where additional unique erasure-coded fragments are needed, by generating new erasure-coded fragments out of the segment. Optionally, a server may store erasure-coded fragments for only some of the segments.

In one example of redundancy factor and storage gain (without the fragments marked with dashed lines), server 399a stores only erasure-coded fragment 310a from a first segment, erasure-coded fragment 320a from a second segment, and erasure-coded fragment 390a from a third segment. Assuming that: (i) the segment size is 1024 Kbytes; (ii) the segment is encoded using erasure code into a 4096 KByte encoded segment; (iii) the encoded segment is segmented into 256 erasure-coded fragments of size 4096/256=16 KByte; and (iv) the erasure-coded fragments are stored on 256 servers (M=256); it turns out that each server stores only a 1/64 portion of the original size of the segment. This means that each server can manage with only 1/64 of the storage requirements in comparison to a situation where it had to store the entire segment. In addition, there are 256 erasure-coded fragments altogether from each encoded segment, meaning that an assembling device that is assembling the erasure-coded fragments from the servers need only select slightly more than 64 erasure-coded fragments in order to completely reconstruct the segment, and it can select whichever slightly more than 64 erasure-coded fragments it desires out of the 256 possibly available. The redundancy factor in this example is approximately 256/64=4. All contents in this example enjoy a factor of 64 in storage gains, meaning that server 399a, for example, stores only 1/64 of the information associated with the first segments and any additional segments belonging to other contents. In one example, each server supports high volume storage of between about 500 GByte and 500 TBytes, optionally utilizing hard drive, Solid State Drive, or any other high volume storage device(s). In these cases, each server may store many millions of erasure-coded fragments, associated with millions of segments, belonging to hundreds of thousands of different contents, and possibly more.

In one embodiment, new content initially encoded with a low redundancy factor is distributed to an initial number of fractional-storage servers. As the content is distributed to more servers, additional unique fragments are encoded and therefore the redundancy factor increases. Optionally, as the content's popularity increases, and/or as the load on the fractional-storage servers increases, the redundancy factor is increased, and vice versa.

In one embodiment, multiple unique erasure-coded fragments per segment of a new content are distributed to an initial number of fractional-storage servers with a low storage gain (i.e. each server stores multiple unique erasure-coded fragments per encoded segment). As the content is distributed to more fractional-storage servers, some of the erasure-coded fragments stored on the initial number of fractional-storage servers are removed and thereby the storage gain is increased. Optionally, as the demand for the content increases, the storage gain is decreased, and vice versa.

Figure 11:
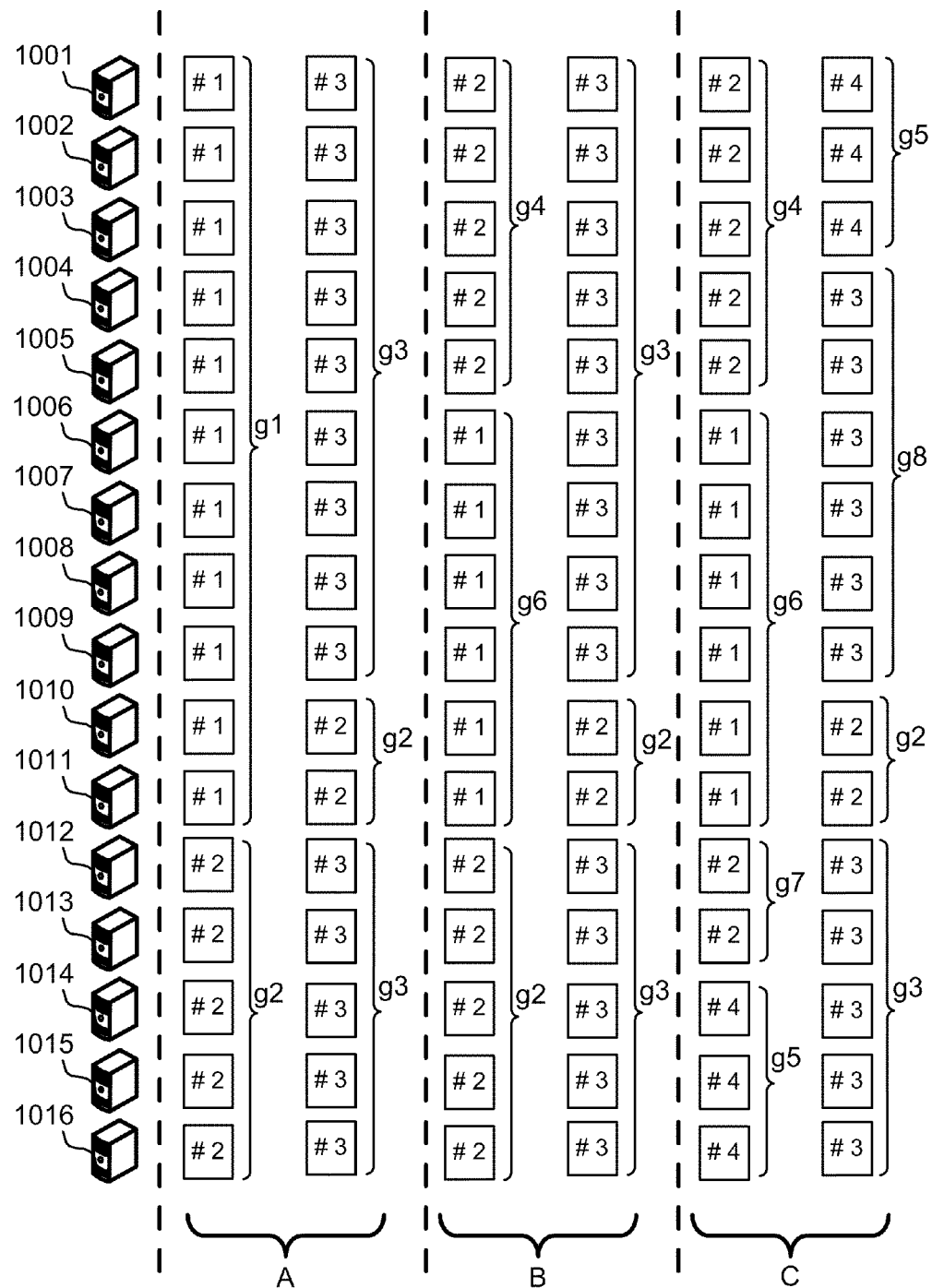
FIG. 11 illustrates three examples of changes made to redundancy factors according to changes in demand.

FIG. 11 illustrates three examples (each depicted by one of the columns A-C) of changing the redundancy factor according to the demand. Column A illustrates one simplified example of a storage array including 16 servers (1001 to 1016). Each server stores up to 2 different erasure-coded fragments, and can service an erasure-coded fragment transmission bandwidth of up to B. Assuming three contents (#1, #2, and #3) processed to segments and erasure-coded fragments with a storage gain of 4.

Assuming content #1 is the most popular, and requires a peak bandwidth of 11×B. Since each server can service up to bandwidth B, at least 11 servers are needed to service content #1 bandwidth requirements. Content #1 is therefore encoded into 11 unique erasure-coded fragments per segment, illustrated as group g1 of erasure-coded fragments stored on servers 1001 to 1011. Out of these 11 erasure-coded fragments, it is sufficient to obtain slightly more than 4 erasure-coded fragments in order to reconstruct a segment of content #1. Therefore, the resulting redundancy factor of the stored fragments associated with content #1 is approximately 11/4=2.75. Content #2 requires less bandwidth, and manages with a peak of 7×B. It is therefore encoded into 7 unique erasure-coded fragments per segment, illustrated as group g2 of erasure-coded fragments on servers 1010 to 1016. Therefore, the redundancy factor of the stored fragments associated with content #2 is 7/4=1.75. Content #3 requires a peak bandwidth of 5×B, but for some reason (for example, being a more critical content), it is encoded into 14 erasure-coded fragments per segment, illustrated as group g3 of erasure-coded fragments on servers 1001 to 1009 and 1012 to 1016. Therefore, the redundancy factor of the stored fragments associated with content #3 is 14/4=3.5. This concludes the storage availability of the servers in this example, as every server stores two erasure-coded fragments.

Column B illustrates an example where content #2 becomes more popular than content #1, and therefore requires more bandwidth and hence more of a redundancy factor. This is achieved by eliminating 5 erasure-coded fragments associated with content #1 that were previously stored on servers 1001 to 1005, and replacing them with 5 new unique erasure-coded fragments g4 associated with content #2. This brings the total number of erasure-coded fragments per segments of content #1 and #2 to 6 and 12 respectively. In column C, new content #4 is stored on servers 1001 to 1003 and 1014 to 1016 (illustrated as g5), by eliminating 3 erasure-coded fragments of content #1 and 3 erasure-coded fragments of content #2.

Throughout the examples of FIG. 11, a record of "what erasure-coded fragments are stored where" may be: (i) kept in each of the servers 1001 to 1016. In this case, when an assembling device is assembling content #2, it will send a query to servers 1001 to 1016, asking which one is storing erasure-coded fragments of content #2; (ii) kept in a control server. In this case, an assembling device will ask the control server to send back a list of all servers storing erasure-coded fragments of its required content.

With reference to FIG. 11, the following embodiments discuss various alternative ways to distribute the erasure-coded fragments among the various servers.

In one embodiment, the erasure-coded fragments associated with a first segment of a first content are stored on exactly the same servers as the erasure-coded fragments associated with a second segment of the first content. In one embodiment, the erasure-coded fragments associated with the first and the second segments of the first content are stored on different servers.

In one embodiment, different servers have different maximal bandwidths. The process that assigns erasure-coded fragments to servers takes that into account, and selects the different servers and the number of erasure-coded fragments per segment such that the integration of bandwidth over all selected servers yields the desired content's peak bandwidth.

In one embodiment, different servers have different bandwidth quota per content. The process that assigns erasure-coded fragments of a new content to servers takes that into account, and selects the different servers and the number of erasure-coded fragments per segment such that the integration of bandwidth quotas over all selected servers yields the desired content's peak bandwidth.

In some embodiments, each server stores a different number of erasure-coded fragments, and has a different bandwidth quota per content. The following examples describe possible processes for assigning erasure-coded fragments of a new content to servers. A first example including: (i) Identifying all servers with enough storage space to accommodate the new erasure-coded fragments. (ii) Sorting the identified servers by bandwidth quota (optionally, highest to lowest). (iii) Integrating the bandwidth quotas from the sorted list, up to the point where the resulting integrated bandwidth equals the content's desired bandwidth. All of the servers in the list up to the equality point are then selected as hosts for the new erasure-coded fragments. A second example including: (i) Identifying all servers with enough storage space to accommodate the new erasure-coded fragments. (ii) Approximately randomly selecting servers out of the identified list, up to the point where the resulting integrated bandwidth equals the desired bandwidth for the content. All of the chosen servers are then selected as hosts for the new erasure-coded fragments. A third example including: (i) Identifying all servers with available bandwidth quota for the new erasure-coded fragments. (ii) Sorting the identified servers by available storage space (available to unavailable). (iii) Integrating the bandwidth quotas from the list sorted by storage, up to the point where the resulting integrated bandwidth equals the desired bandwidth for the content. All of the servers in the list up to the equality point are then selected as hosts for the new fragments.

The term "approximately random" as used herein refers to, but is not limited to, random, pseudo random, and/or based on a long list of numbers featuring very low autocorrelation and very low correlation with other similar lists of numbers.

FIG. 12 illustrates one embodiment of a server array including fractional-storage servers 399a to 399(N) storing erasure-coded fragments 390a to 390(N) associated with content. In order for assembling device 661 to reconstruct a segment 101a of the content, it has to retrieve at least K erasure-coded fragments. In one example, k=4 and the assembling device 661 chooses approximately randomly from which servers to retrieve the 4 different erasure-coded fragments. It chooses to retrieve fragments 390a, 390c, 390(N−1) and 390(N), which are noted as group 573, and reconstruct the segment 101a. Consequent segments of the content are reconstructed in a similar fashion, and the content may eventually be fully retrieved by combining all relevant segments. If the assembling device 661 cannot reconstruct the segment 101a, it retrieves one or more additional unique erasure-coded fragments, and tries again.

In one embodiment, the content being distributed supports stream presentation, and segment 101a is of small size, to enable content presentation by assembling device 661 shortly after beginning the reception of the segment (or any other segment of the content). For example, segment 101a is 96 KByte, allowing a 5 Mbps download speed receiver to obtain the entire segment (by requesting enough erasure-coded fragments to enable the reconstruction of the segment, and such that the total size received of all requested erasure-coded fragments is slightly larger than the segment) after approximately 0.2 seconds from request, and beginning the presentation shortly or right after the successful decoding and reconstruction of segment 101a.

In some embodiments, the fragments are small enough to be contained in one packet. In one embodiment, each fragment is about 1400 bytes, and can fit into one UDP or RTP packet transmitted over Ethernet. The stateless nature of UDP and RTP allows the servers to send one packet with one fragment very quickly, without the need for any acknowledgement or hand shaking. In some embodiments, the fragment pull protocol requests use one stateless packet, like UDP or RTP. In one embodiment, the assembling device requests about 100 fragments approximately in parallel, using 100 separate requests or one or few aggregated requests. About 100 servers respond by sending about 100 fragments, each encapsulated in one stateless packet, after a short delay, and the assembling device receives the fragments within a fraction of a second. Assuming an Internet round trip delay of 100 ms, and server processing latency of 100 ms, then after 200 ms the assembling device starts receiving all 100 fragments. With a modem of 5 Mbps, and assuming 1400 bytes per fragment, all 100 fragments are received 1400×100×8/5 Mbps=224 ms after the initial delay, meaning that content can be presented 200+224=424 ms after request (decoding and other process time has been ignored in this example).

Figure 13:
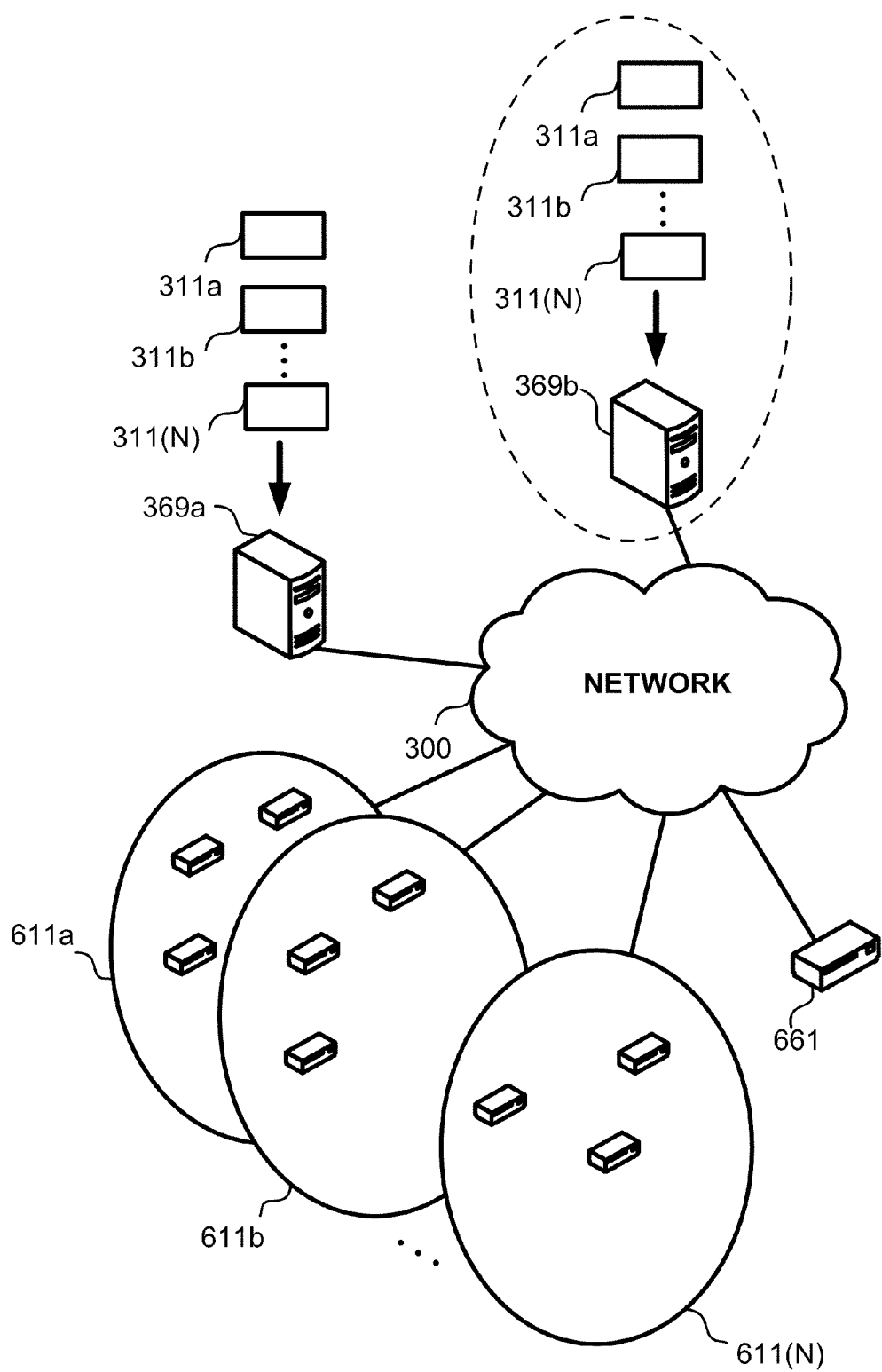
FIG. 13 illustrates a stand-alone content delivery server.

FIG. 13 illustrates in one embodiment wherein server 369a operates as a stand-alone content distributor. Server 369a stores all the erasure-coded fragments 311a to 311(N) of the content. Assembling device 661 assembles the content from server 369a, by requesting the relevant erasure-coded fragments. The request may be per specific erasure-coded fragment, or per a cluster of erasure-coded fragments. Upon each request, server 369a sends the one or more requested erasure-coded fragments. The erasure-coded fragments 311a to 311(N) may be encoded using erasure codes, or, alternatively, not encoded at all and simply constituting a fragmented sequence of the content. The optional groups of bandwidth amplification devices 611a, and 611b to 611N store fragments 311a, and 311b to 611(N) correspondingly (and other fragments). In one embodiment, assembling device 661 can request fragments from a group of bandwidth amplification devices instead of the server 369a. In one embodiment, the bandwidth amplification devices are fractional-storage assembling devices that receive their fragments from a single server 369a containing all the fragments, or from a group of servers or a control entity that contain some or all of the fragments. Upon adding another server 369b, which stores the same erasure-coded fragments as server 369a, assembling device 661 may retrieve the fragments from server 369a, and/or from server 369b, and/or from the optional bandwidth amplification devices 611a to 611N. For assembling device 661, switching between servers is seamless when using a fragment pull protocol because it simply means requesting the next fragments from a different source.

The following embodiments describe processes for on-the-fly erasure-coded fragment retrieval from fractional-storage servers.

In one embodiment, a method for obtaining erasure-coded fragments from fractional-storage servers to reconstruct a segment includes the following steps: (i) identifying the next segment to be obtained; optionally, the segments are approximately sequential segments of streaming content obtained according to their sequential order; (ii) optionally, determining the minimum number of fragments needed to reconstruct the segment; (iii) are enough identified relevant servers (i.e. servers storing the required fragments) available from the process of obtaining prior segment/s? (iv) if no, identifying enough relevant servers; (v) if yes, requesting enough fragments from the identified relevant servers; if less than enough fragments are obtained from the identified relevant servers, go back to step iv and identify additional relevant server/s; (vi) reconstruct the segment from the obtained fragments; and (vii) optionally, go back to step i to obtain the next segment.

In one embodiment, a method for obtaining erasure-coded fragments from fractional-storage servers to reconstruct multiple segments includes the following steps: (i) identifying multiple segments to be obtained, optionally according to their sequential order; (ii) optionally, determining the minimum number of fragments needed to reconstruct the segment; (iii) optionally, determining the number of fragments to be obtained approximately in parallel; (iv) are enough identified relevant servers available from the process of obtaining prior segment/s? (v) if no, identifying enough relevant servers; (vi) if yes, requesting enough fragments from the identified relevant servers, optionally in parallel and according to the sequential order of the segments; (vii) if less than enough fragments are obtained from the identified relevant servers, go back to step iv and identify additional relevant server/s; (viii) reconstructing the segment/s from the obtained fragments; and (ix) optionally, go back to step i to obtain the next segments.

In one embodiment, a method for obtaining erasure-coded fragments from fractional-storage servers to reconstruct a segment in a burst mode includes the following steps: (i) identifying the next segment to be obtained; (ii) optionally, determining the minimum number of fragments needed to reconstruct the segment; (iii) are more than the minimum number of relevant servers available from the process of obtaining prior segment/s? (iv) if no, identifying more than the minimum relevant servers; (v) if yes, requesting more than the minimum number of fragments needed to reconstruct the segment; if less than enough fragments are obtained, go back to step iv and identify additional relevant server/s; (vi) reconstructing the segment from the obtained fragments; and (vii) optionally, go back to step i to obtain the next segment.

The various methods for obtaining erasure-coded fragments from the fractional-storage servers for reconstructing one or more segments may be combined as needed. In one example, the initial segment/s are obtained using a burst mode and the following segments are retrieved without requesting extra fragments. In another example, the initial segment/s are obtained approximately in parallel and optionally using a burst mode, and the following segments are obtained one by one and optionally without requesting extra fragments. The fragments may be obtained using a pull protocol and/or a push protocol. Moreover, the servers from which to retrieve the fragments may be selected according to one or more of the various discussed methods for selecting the servers and/or load balancing the servers.

In some embodiments, a broadcast-like effect is achieved by distributing to and retrieving from fractional-storage servers a broadcast channel/live content in real time, using a combination of real time distribution and real time retrieval techniques. In a broadcast-like effect, a given channel or content for broadcasting is distributed to at least one assembling device, optionally by means of pushing relevant fragments to the assembling device, or by pulling the relevant fragments by the assembling device, and potentially to many assembling devices at approximately the same time, which creates a similar effect to traditional broadcasting.

Figure 14:
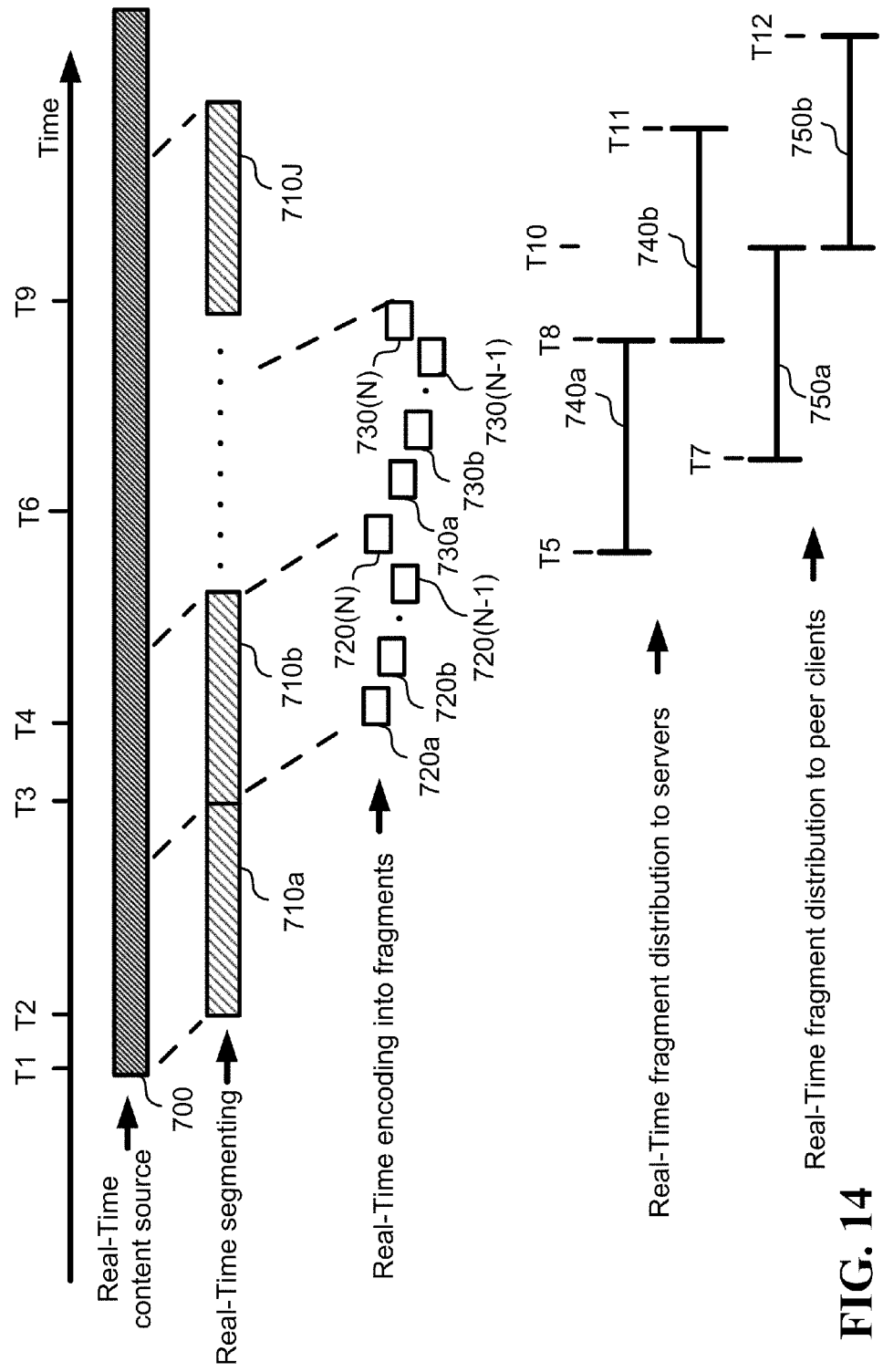
FIG. 14 illustrates real-time content segmentation, encoding, and distribution.

FIG. 14 illustrates one embodiment of processing a content source 700 for real time presentation. Content examples include, but are not limited to, a live video broadcast event, a pre-recorded show, or any real time conditioned source. The content 700 is available at time T1=0. The content 700 is segmented in real time into multiple segments, such that the first segment 710a is available at T3. T3 is determined by the size of the segment and the selected compression scheme. For example, if an H.264 compression is used to generate an average stream of 1 Mbps, and the size of the segment is 96 Kbytes, then T3 minus T2 equals 96 KByte×8 (Bits/Byte)/1 Mbps=0.77 seconds on average, where T2 is the process delay. If T2 is about 0.2 second, then the first segment 710a can be ready for the next step after about 1 second from the time that content 700 is first made available. Subsequent segments 710b to 710J are made available sequentially in time.

Next, at T4, erasure-coded fragments 720a to 720(N) are being encoded from segment 710a. At T6, the encoding process is performed for segment 710a, and all the erasure-coded fragments 720a to 720(N) are made available. In one example, the time between T4 and T6 is equal to or less than the average segment creation time, in order to allow the process to maintain real time performance, such that at any point in time during the on-going availability of segments, the encoding process generates all erasure-coded fragments without picking up any delay above T6 minus T3 (which is the latency between segment availability and erasure-coded fragment availability). T6 minus T1 may be typically 2-3 seconds if T3 minus T2 is 0.77 seconds. T4 minus T3 may be typically a fraction of a second. Similarly, erasure-coded fragments 730a to 730(N) are being encoded from segment 710b, and are made available at time T9. The process of fragment encoding is repeated in real time up to the last segment 710J of content 700.

Next, at T5 (which can potentially occur before T6, but also after T6) the erasure-coded fragments 720a to 720(N) are distributed 740a to a server array. The distribution process 740a ends at T8. In one example, T8 minus T5 is equal to or less than the average segment creation time, in order not to have delays. The process of distributing the erasure-coded fragment is repeated 740b for erasure-coded fragments 730a to 730(N), and for all subsequent erasure-coded fragments associated with the next segments.

Optionally, at T7, the erasure-coded fragments 720a to 720(N) are distributed 750a from the servers to groups of bandwidth amplification devices. In one example, the distribution ends at T10, such that T10 minus T7 is equal to or less than the average segment creation time, in order not to have delays. Subsequent erasure-coded fragments associated with the next segment are distributed 750b, and the process continues until the erasure-coded fragments associated with the last segment 710J are distributed.

Figure 15:
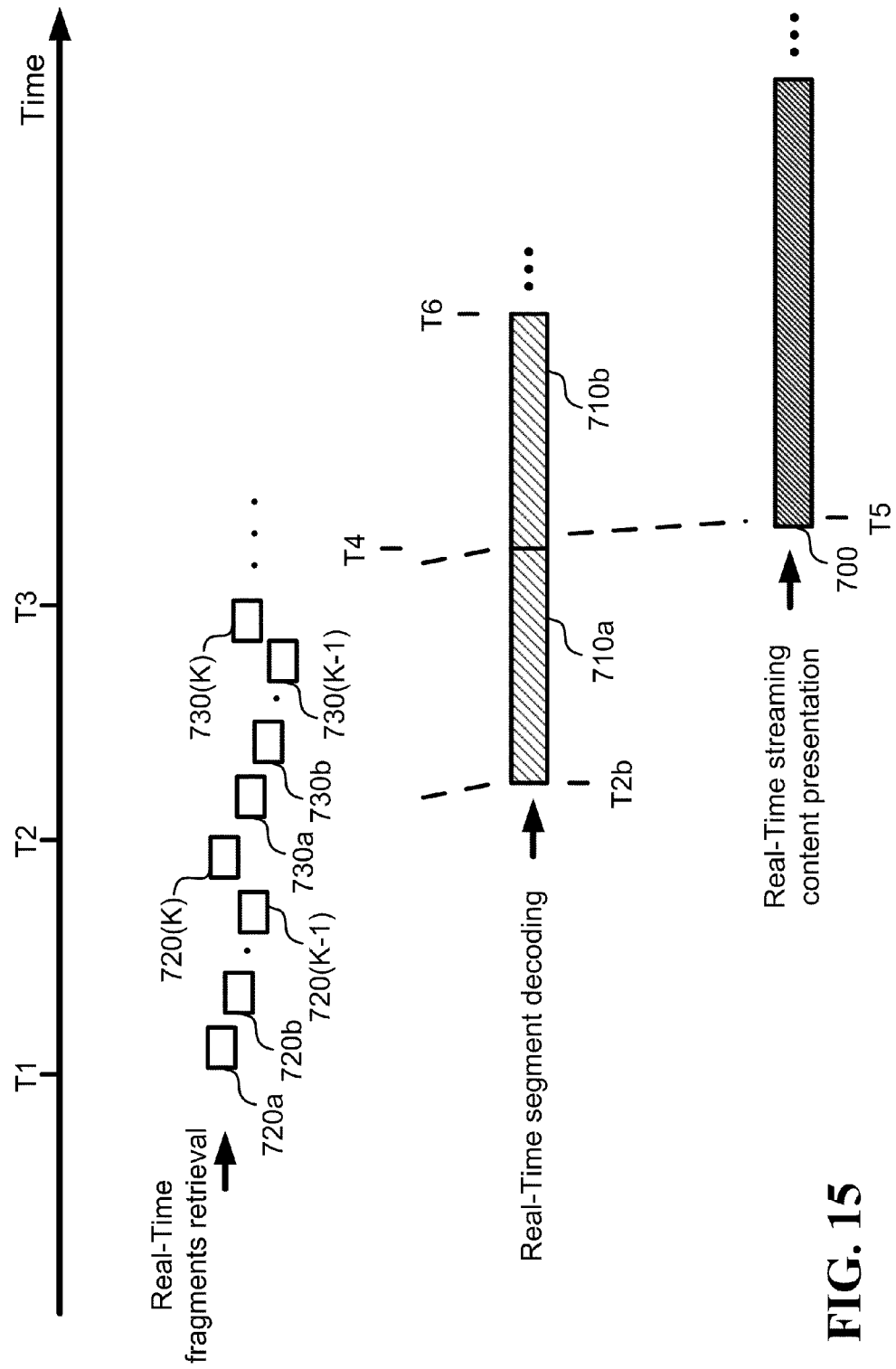
FIG. 15 illustrates real time fragment retrieval, segment reconstruction, and content presentation.

FIG. 15 illustrates one embodiment of real time streaming content retrieval from fractional-storage servers. An assembling device begins a process of obtaining streaming content 700 for presentation. Starting at T1, the assembling device requests erasure-coded fragments 720a to 720(K). By T2, all K erasure-coded fragments are obtained, and at time T2b until T4, erasure-coded fragments 720a to 720(K) are decoded into segment 710a. The retrieval time of the erasure-coded fragments and the segment decoding time should be equal to or faster than the corresponding presentation time, in order to enable a continuous presentation, once presentation begins at T5. T2b minus T2 is a short delay, and can be fractions of a second. Subsequent erasure-coded fragments 730a to 730(K)

are retrieved between T2 and T3, and are decoded into subsequent segment 710b between T4 and T6.

In one example, the streaming content 700 is encoded at 1 Mbps, and the segment size is 96 Kbytes. The presentation of each segment takes about 0.77 seconds. Retrieving fragments 720a to 720(K) takes no more than 0.77 seconds, meaning that the assembling device's connection bandwidth must be 1 Mbps or higher. Decoding segment 710a takes no more than 0.77 seconds. If a small delay of 0.2 seconds is assumed for both T2b minus T2 and T5 minus T4, then T5 can start at 0.77+0.2+0.77+0.2=1.94 seconds after T1, meaning that presentation can begin about 2 seconds following request of the first erasure-coded fragment.

In another example, the retrieval process and the decoding process are performed faster than the real time presentation bounds, therefore enabling a shorter time to play and a download rate that exceeds the presentation rate.

In one embodiment, the erasure-coded fragments 720a to 720(K) are retrieved in approximately random order, or any other order, as long as at least the K erasure-coded fragments needed for decoding the segment 710a are available until time T2.

Figure 16:
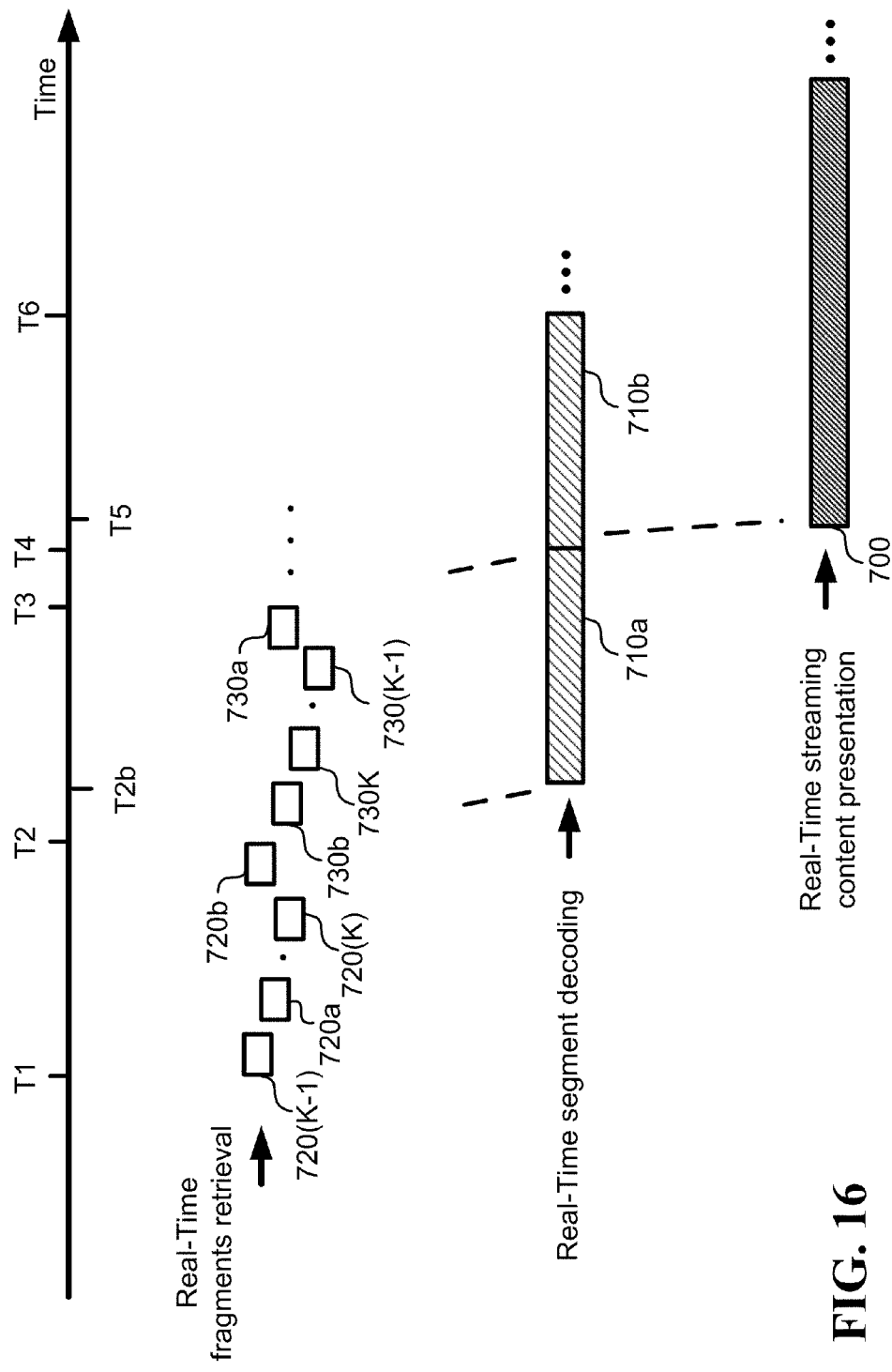
FIG. 16 illustrates real time fragment retrieval in random order.

FIG. 16 illustrates one embodiment where the erasure-coded fragments 720a to 720(K) are retrieved in approximately random order 720(K−1), 720a, 720(K), 720b, or any other order, as long as at least the K erasure-coded fragments needed for decoding the segment 710a are available until time T2. Similar retrieval in random order is applied to erasure-coded fragments 730a to 730(K) and all other subsequent fragments.

In one embodiment, the fragments associated with sequential segments of streaming content are delivered to an assembling device as a plurality of sub-transmissions. In this case, each fractional-storage server participating in the delivery of the fragments to the assembling device sends a transmission to the assembling device comprising a sequence of erasure-coded fragments. This transmission is referred to as a sub-transmission. In one example, each sub-transmission contains at least one fragment per each sequential segment of the streaming content. In one example, the sub-transmission starts at a segment indicated by the assembling device, and continues from that point onwards, approximately according to the sequential order of segments, until the assembling device instructs the server to stop, or until reaching the last segment of the content. Each sub-transmission carries only a fraction of the fragments (per segment) needed to reconstruct the segments of the streaming content, such that the combination of at least two sub-transmissions received by the assembling device from the servers allows the assembling device to obtain enough fragments needed to reconstruct each segment.

In one embodiment, each sub-transmission is delivered to the assembling device via a streaming session, such as an RTP session, wherein the RTP packets transport the fragment sequence approximately according to the order of the sequential segments. In one embodiment, each sub-transmission is delivered to the assembling device via an HTTP connection, or other closed-loop data transfer mechanisms over TCP/IP. In one embodiment, the assembling device may change one or more transmitting servers on the fly, by instructing the server(s) to stop sending an already active sub-transmission—as may be needed in a case of an RTP session, and initiating new sub-transmissions from other servers instead. Replacement of transmitting servers on the fly may be needed in a case of a server failure, network failure, or high load or latency conditions.

In some embodiments, a push protocol is used to obtain fragments. A push protocol may be implemented using one transmission carrying fragments from a source server to a destination receiver, or may be implemented using a plurality of sub-transmissions. When using sub-transmissions, each sub-transmission transports a fraction of the fragments needed for segment reconstruction. Segments may be reconstructed from fragments received via sub-transmissions after obtaining decodable sets of erasure-coded fragments; optionally one set per segment. A sub-transmission may be transported using an IP stream such as RTP, an HTTPS session, or any other protocol suitable for transporting a sequence of fragments between a source server and a destination assembling device.

FIG. 12 illustrates one embodiment, in which content is segmented and erasure-coded. Fragments 390a to 390(N), belonging to a first segment, are distributed to servers 399a to 399(N) respectively. Other fragments belonging to subsequent segments are similarly distributed to servers 399a to 399(N). The servers may use a push protocol to transport the fragments to an assembling device. A push protocol sub-transmission may comprise a sequence of fragments associated with multiple segments. In one example, the fragments are ordered according to the sequential order of the segments in a streaming content. Server 399a sends a first sub-transmission to a destination assembling-device. Optionally, the first sub-transmission comprises a sequence of fragments starting with fragment 390a, associated with the first segment, and continuing with fragments belonging to subsequent segments. Server 399c sends a second sub-transmission to the destination assembling-device, optionally starting with fragment 390c, associated with the first segment, and continuing with fragments belonging to subsequent segments. In a similar fashion, servers 399(N−1) and 399(N) send additional sub-transmissions to the destination assembling-device, each comprising a unique fragment sequence.

When using a push transmission, the assembling device does not explicitly ask for each fragment, but instead instructs each of the different servers to start sending it a fragment sequence using a sub-transmission. The destination assembling-device receives the sub-transmissions sent by servers 399a, 399c, 399(N−1) and 399(N). It gathers 573 the first fragment from each sub-transmission to reconstruct the first segment 101a. In a similar fashion, additional fragments belonging to subsequent segments are obtained from the sub-transmissions, and used to reconstruct the segments. It is noted that any combination of sub-transmissions may be used, as long as a decodable set of fragments is obtained per each segment. It is also noted that FIG. 12 illustrates a non-limiting embodiment and a sub-transmission may include two or more unique erasure-coded fragments per segment.

In one embodiment, the push sub-transmissions is synchronous (all servers sending the fragments of each segment at approximately the same time). In another embodiment, the push sub-transmission is asynchronous and the arrival of different fragments associated with a specific segment at the assembling device side may be spread over a long period. This may occur, as an example, when some push servers are faster than others. In one embodiment using asynchronous sub-transmissions, the assembling device aggregates whatever fragments it can before presentation time of each segment, and then optionally supplements fragments using a pull retrieval process. A server that does not send fragments fast enough, and therefore usually causes supplemental requests, may be ordered to stop the sub-transmission. Another server may be requested, optionally by the assembling device, to replace the slow server by initiating a new sub-transmission.

In one embodiment, the push-transmissions carry more erasure-coded fragments than needed for segment reconstruction. In one embodiment, the push transmissions carry fewer erasure-coded fragments than needed for segment reconstruction, and the remaining fragments are pulled by the assembling device.

In one embodiment, the assembling device categorizes the servers into two categories: (i) fastest responding servers, and (ii) slower responding servers, and approximately avoids initial fragment requests from the fastest responding servers, such that if additional fragments are needed, they are quickly retrieved from the fastest responding servers. Avoiding retrieval from the fastest responding servers when initially requesting the fragments of a segment increases the chances of retrieving a substitute fragment, needed to compensate for the lost fragments, from the fastest responding servers, and enables fast compensation that is needed for fast presentation of the streaming content. Categorizing the servers may be performed by registering measured latencies of servers responding to fragment requests by the assembling device.

In one embodiment, a plurality of fractional-storage servers, which may be located almost anywhere around the globe, configured to store erasure-coded fragments associated with segments of streaming content. An assembling device, which may be located almost anywhere around the globe, configured to request, using a fragment pull protocol over the Internet, a set of fragments. The assembling device is further configured to compensate for lost fragments by requesting additional erasure-coded fragments that are needed to reconstruct the segments. wherein the bandwidth of the streaming content is bounded approximately only by the incoming bandwidth of the assembling device.

In one embodiment, fractional-storage CDN servers configured to store erasure-coded fragments associated with approximately sequential segments of streaming content. An assembling device located at a point featuring an average one-way network-related latency of more than 50 milliseconds between the assembling device and the servers obtains a first set of fragments, approximately according to the sequential order of the segments, and compensates for lost fragments by obtaining a second set of erasure-coded fragments that are needed to reconstruct the segments. Wherein the bandwidth of the streaming content is bounded approximately only by the incoming bandwidth of the assembling device. Optionally, the assembling device is configured to utilize a fragment pull protocol to obtain the fragments. Optionally, the assembling device utilizes a push protocol to obtain the fragments.

In one embodiment, the selection of which fractional-storage servers deliver erasure-coded fragments to which assembling devices approximately determines the network paths through which the fragments are transported. When the system has a redundancy factor greater than 1, there is a degree of freedom in selecting the servers that can deliver a decodable set of fragments to an assembling device. If the servers are spread over different networks, then each server, or groups of servers, may have different networks path through which fragments flow when transmitted to an assembling device. Selecting the servers therefore means selecting network paths through which fragments are delivered to an assembling device. As the redundancy factor, the storage gain, and the diversity at which servers are spread over different networks increase, so does the number of potential network paths resulting from server selections. The selection of paths, via selection of servers, can be used to avoid congested networks, to prefer certain paths that are more cost effective, or to optimize any other criterion related to fragment flow paths.

Figure 17:
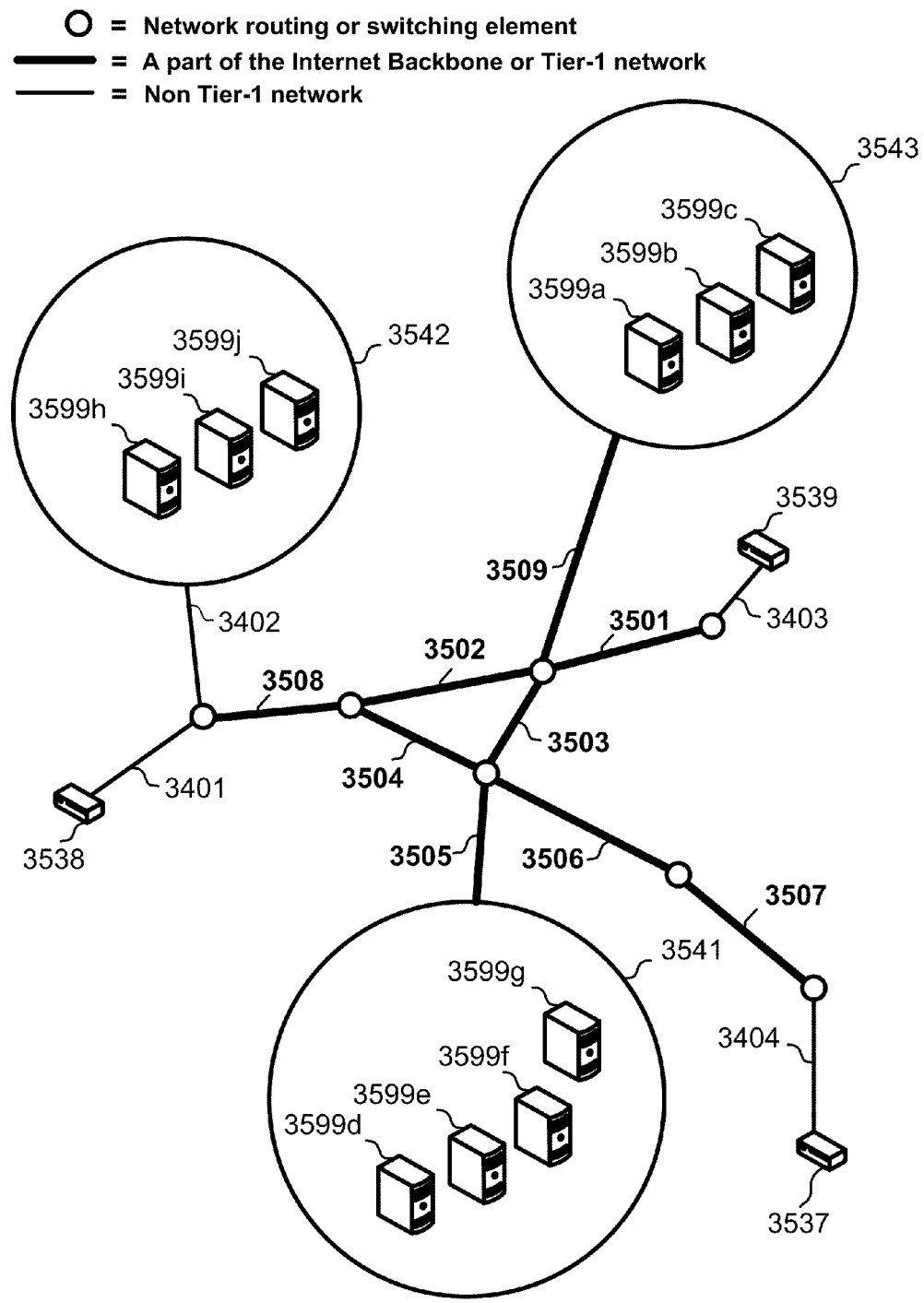
FIG. 17 to FIG. 19 illustrate the influence of selecting source servers on backbone traffic.
Figure 18:
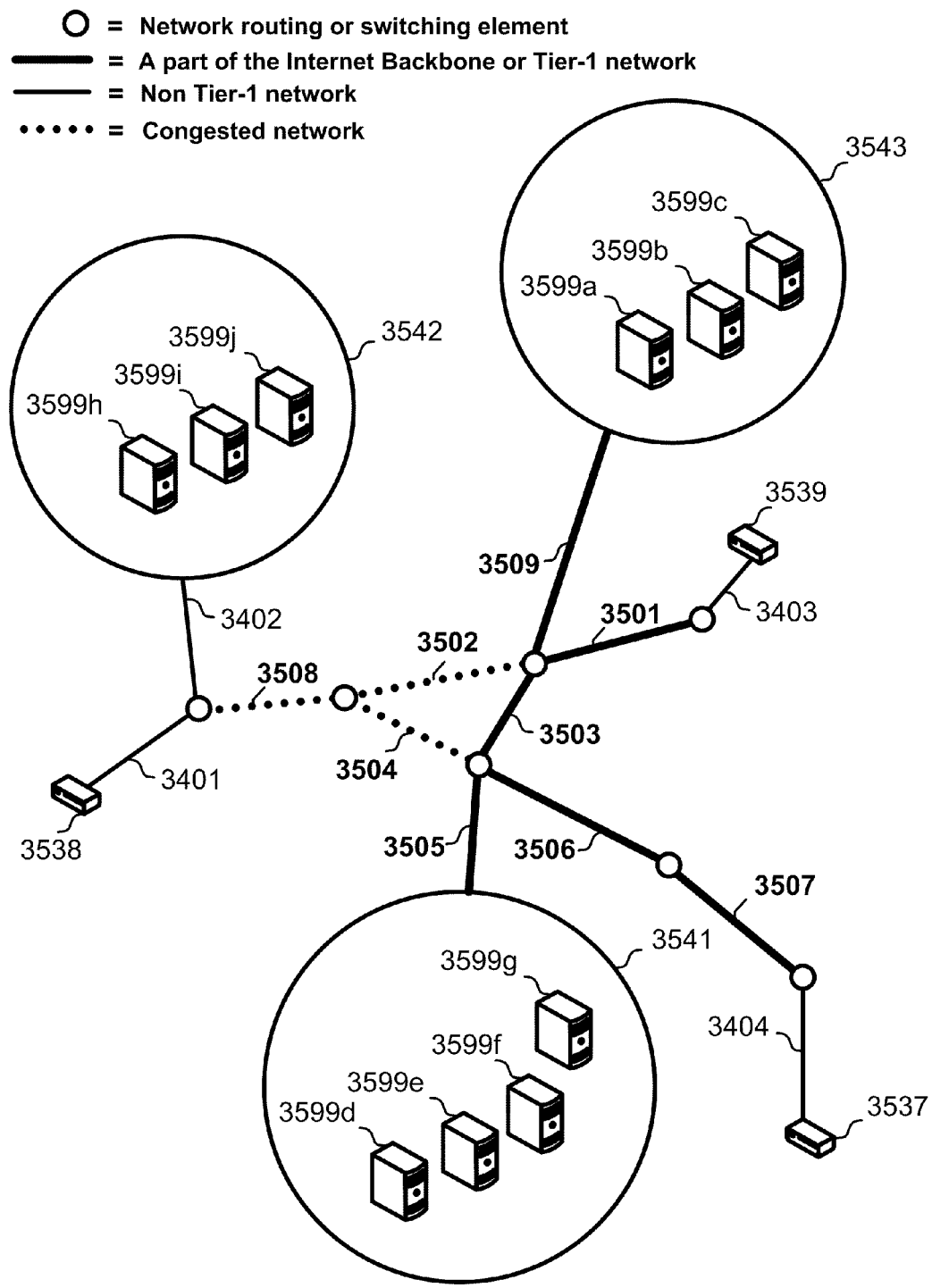
Figure 19:
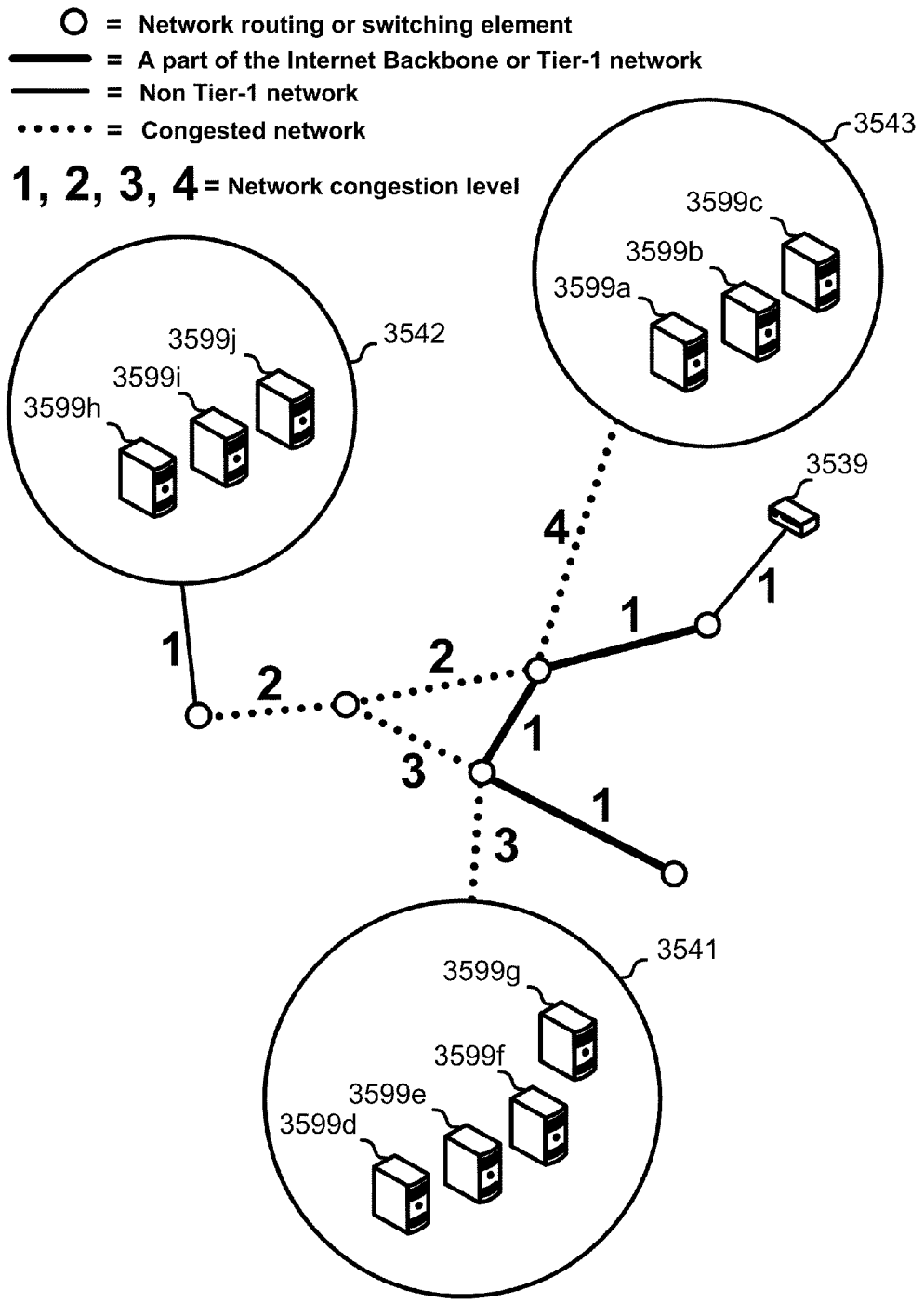

FIG. 17 to FIG. 19 illustrate the influence of selecting source servers on backbone traffic. FIG. 17 illustrates one example wherein fractional-storage servers 3599a to 3599j are grouped in three locations 3541, 3542, and 3543, connected to the Internet via networks 3505, 3402, and 3509 respectively. Assembling devices 3537, 3538, and 3539 are connected to the Internet and obtain fragments from the servers. Assuming any three servers can be used to deliver decodable sets of fragments to the assembling devices, servers 3599a, 3599d, and 3599h are selected to deliver fragments to assembling device 3539. In this case, the resulting three network paths through which fragments flow to the assembling device are (i) from server 3599a: first path 3509, 3501, 3403 (ii) from server 3599d: second path 3505, 3503, 3501, 3403, and (iii) from server 3599h: third path 3402, 3508, 3502, 3501, 3403.

FIG. 18 illustrates one example wherein networks 3502, 3504, and 3508 get congested with Internet traffic, not necessarily as a result of fragment traffic generated by servers 3599a to 3599j, and possibly as a result of general Internet traffic. The third path includes two of the congested networks: 3508 and 3502, and should therefore be avoided. This means that another server, instead of 3599h, has to be selected, such that it does not result in a fragment delivery path comprising networks 3508 and 3502. Server 3599b is therefore selected, resulting in a fragment delivery path of 3509, 3501, 3403, which is similar to the first path already delivering fragments from server 3599a. Assembling device 3538 will use the servers 3599h to 3599j, as they are the only servers that avoid the congested networks. The path in this case comprises networks 3402 and 3401. Assembling device 3537 can use any three of the servers belonging to groups 3541 and 3543.

In one embodiment, the different networks are associated with different costs. The cost may be related to any of the following parameters, or other parameters relevant to transporting fragments over a network: (i) network's congestion level, (ii) network's remaining capacity, (iii) network's packet loss, (iv) network's latency, (v) network's latency variance, and/or (vi) the fee for transporting bits over the network. In one example, selecting which servers deliver fragments to which assembling devices is performed such that the resulting fragment delivery paths comprise networks having the least aggregated cost, or a competitive aggregated cost compared to alternative paths. FIG. 19 illustrates one example of assigning costs to network paths. Each of the networks is associated with a cost of 1 to 4. The higher the cost, the more congested the network. Assembling device 3539 can obtain fragments from either server group 3541, 3542, or 3543. The resulting three paths have the following aggregated costs: (i) first path, from group 3543: 4+1+1=6, (ii) second path, from group 3541: 3+1+1+1=6, (iii) and third path, from group 3542: 1+2+2+1+1=7. The servers are selected from the first and second groups, as the resulting path cost is 6. Servers from the third group are usually not selected, as the resulting path cost is 7.

Figure 20:
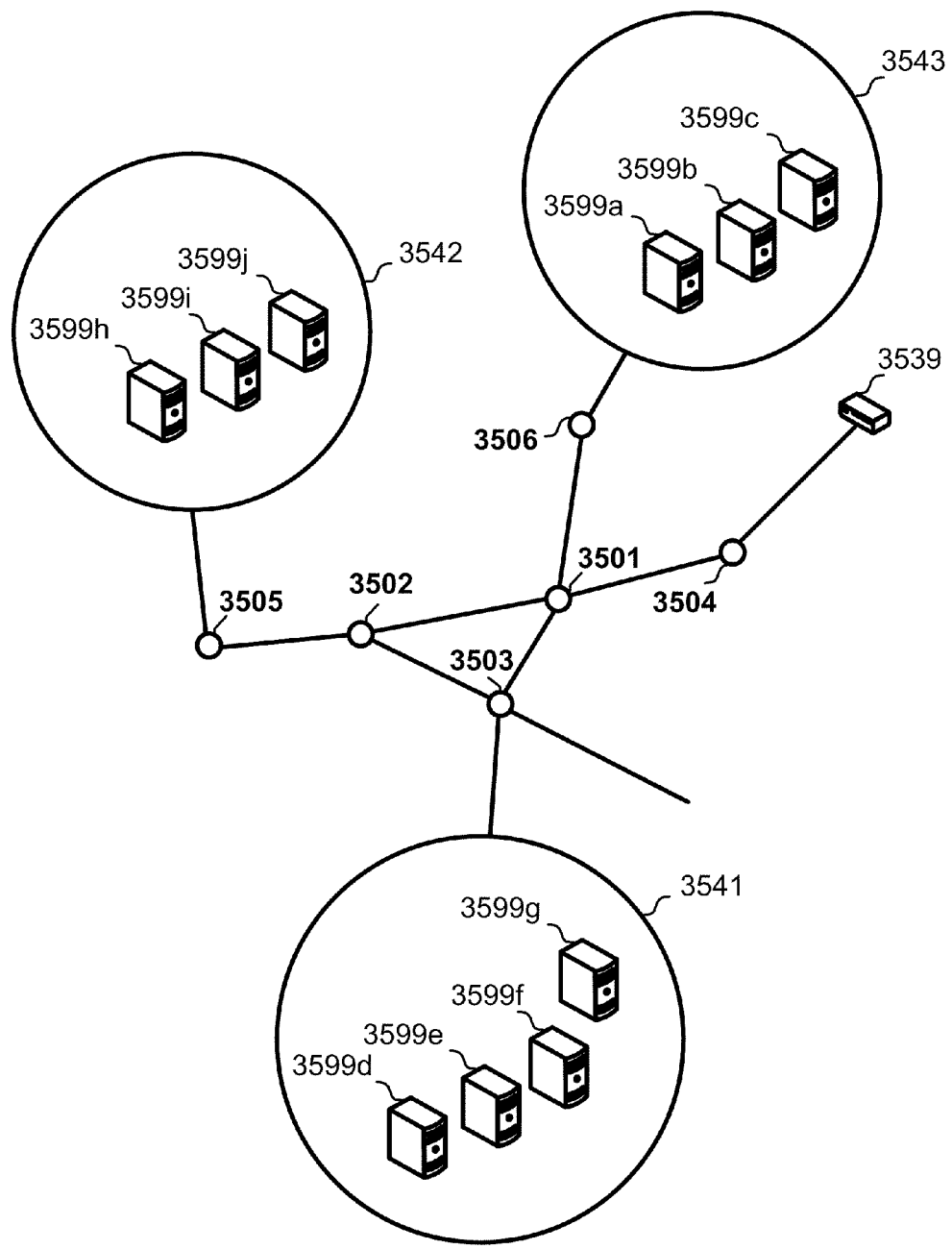
FIG. 20 illustrates server selection for network path determination.

FIG. 20 illustrates one embodiment wherein the selection of which servers deliver fragments to which assembling devices is used to determine network paths for fragment delivery. The servers are selected such that the resulting paths: (i) avoid certain loaded routers, and/or (ii) comprise routers having an aggregated cost lower than other possible paths. Fragment traffic going from groups of servers 3541, 3542, 3543 to an assembling device 3539 may pass through any of the routers 3501 to 3506, depending on which three servers are selected for fragment transmission. In one example, router 3506 is congested. Therefore, only serves 3599*d* to 3599*g* and 3599*h* to 3599*j* are considered for fragment delivery, in order to avoid transporting the fragments via the congested router 3506.

Network paths, networks, and/or routers, which should be avoided, may be identified using one or more of the following embodiments. In one embodiment, the operator/owner of the networks/routers indicates that certain networks/routers are to be avoided. In one embodiment, the networks/routers are associated with a cost that is used for selecting the paths. In one embodiment, the different paths are empirically checked by transporting traffic from servers to assembling devices, and measuring parameters such as latency, latency variance, fragment or packet loss, and/or traffic outages. In one embodiment, certain networks/routers are to be avoided during a certain period of the day, and can be used during another period of the day. For example, an Internet bandwidth provider has a high traffic load on one of its network links during the afternoon, but this same link is almost free of traffic during the early morning. In this case, the provider can indicate that fragments can be delivered via the link only during early mornings. In another example, an Internet backbone provider has a high traffic load on one of its Tier-1 networks during the evenings, and a moderate load during the noon period. In this case, the process of selecting the fragment delivering servers will consider this, and select delivery paths comprising the Tier-1 network only during the noon period.

In one embodiment, after obtaining some data regarding some of the loads, availabilities, losses, costs, preferences, and/or any other data that may influence the selection of the servers, algorithms and/or theorems such as Minmax (also known as Minmax) may be used for optimizing the selections.

In some embodiments, the path though which a fragment will flow from a server to an assembling device may be estimated using one or more of the following: (i) TraceRoute functions to map routers between the various servers and the assembling device, or (ii) obtaining a topological map of the Internet, and estimating the paths accordingly. The estimated path may then be used to shape the actual fragment flow paths by selecting fragment-delivering servers. In one embodiment, the path through which fragment flow is unknown, and the determination of which servers deliver fragments to which assembling devices is performed approximately randomly, until an indication is received that a certain network, or router, or groups of such, are avoided.

In one embodiment, a user's cost on a globally distributed fractional-storage system is determined according to the correlation between the user's consumption profile and the system's load. The smaller the correlation, the lower the user's cost. In one embodiment, the cost of streaming content to a new user is calculated using the following steps: receiving the locations of the user, the other users, and the CDN servers; estimating the time periods in which the new user will consume its maximum BW; calculating the correlation between the user's consumption and the current load; and pricing users who balance the load significantly lower than users who consume content when the system is loaded.

Figure 21:
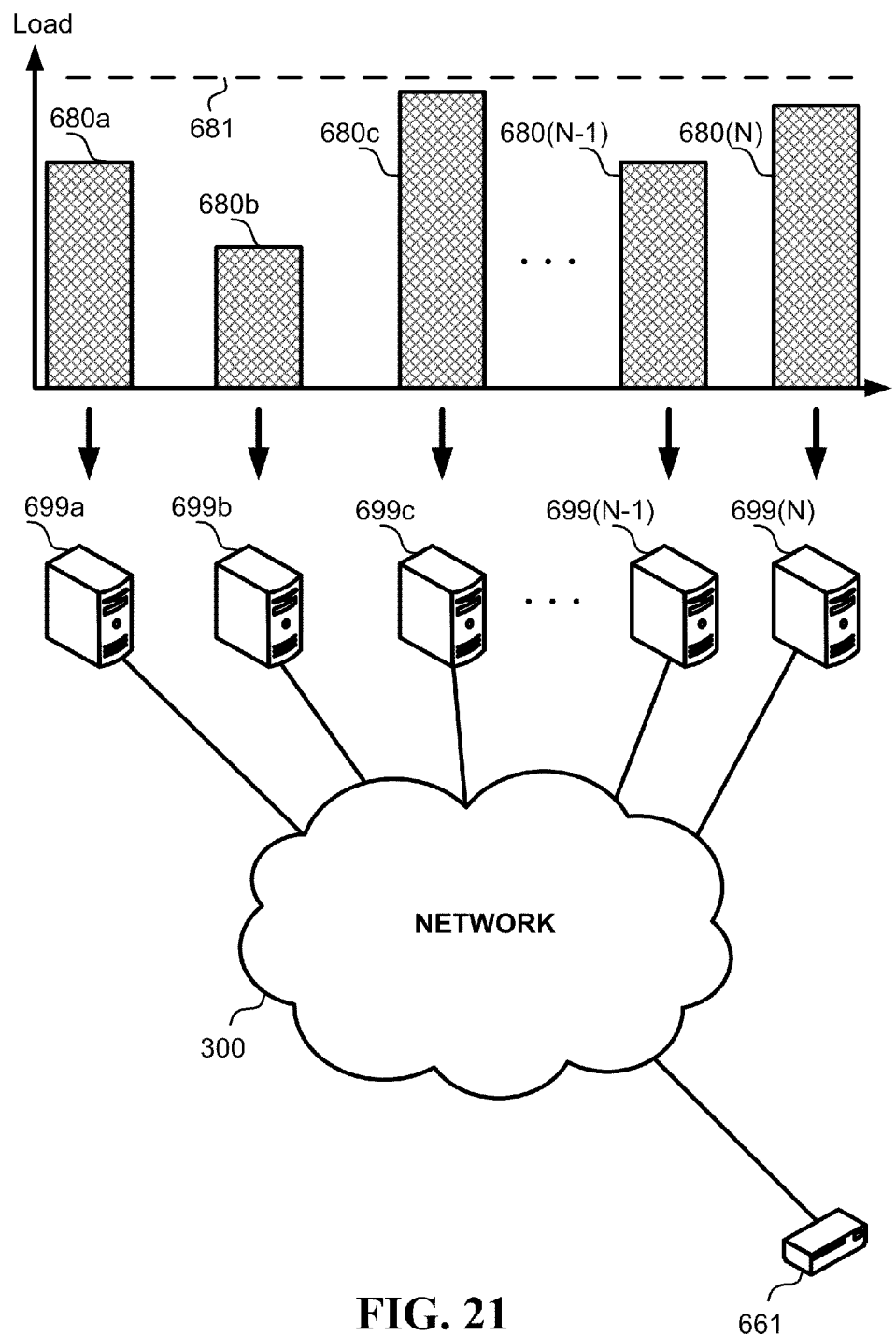
FIG. 21 illustrates fractional-storage servers having the same bandwidth capability.

FIG. 21 illustrates one example of a fractional-storage system comprising servers 699*a* to 699(N) having a bandwidth capability 681. In other words, no server can send data at a rate higher than 681. Assembling device 661 can select from which servers to obtain erasure-coded fragments for reconstruction of a segment. In one example, each server stores one relevant, unique, erasure-coded fragment. Therefore, from the N servers storing N possible unique fragments, the assembling device needs only K erasure-coded fragments for complete reconstruction of the segment (K<N). Since it is not important which K fragments from the N are retrieved, the assembling device may retrieve from the least loaded servers, so as to keep the load between the different servers balanced. When many assembling devices assemble contents in parallel, and since all assembling devices can select the least loaded servers, the end effect is that the load on the servers is balanced, with the potential for most servers to approach their maximal bandwidth capabilities. Optionally, that load balancing is achieved without significant coordination between the servers.

In the example of FIG. 21, assuming that K=3, the assembling device 661 may select servers 699*b*, 699(N−1), and 699*a* for fragment retrieval, as they have the lowest load of all N servers. Servers 699*c* and 699(N), as an example, will not be chosen, as they have relatively higher loads.

The assembling device may select the least loaded servers using any appropriate method, such as, but not limited to (i) accessing a central control server having data about the load conditions on the various servers, or (ii) periodically querying the various servers on their load conditions.

In one embodiment, instead of, or in addition to, selecting the least loaded servers, the assembling device 661 tries a random set of K servers from the N, and retrieves erasure-coded fragments from all servers reporting a load below a threshold, while higher loaded servers will be replaced by least loaded servers from the possible N servers. The end result is that the server array is balanced because the K erasure-coded fragments are retrieved from servers loaded below the threshold.

In one embodiment, the assembling device does not know which of the servers store erasure-coded fragments related to the content to be retrieved, but the assembling device knows over how many servers (from the total number) the erasure-coded fragments are distributed. Therefore, the assembling device compensates for the infertile requests by enlarging the number of requests for erasure-coded fragments. Optionally, the requested servers are selected based on approximately random algorithm.

Figure 22:
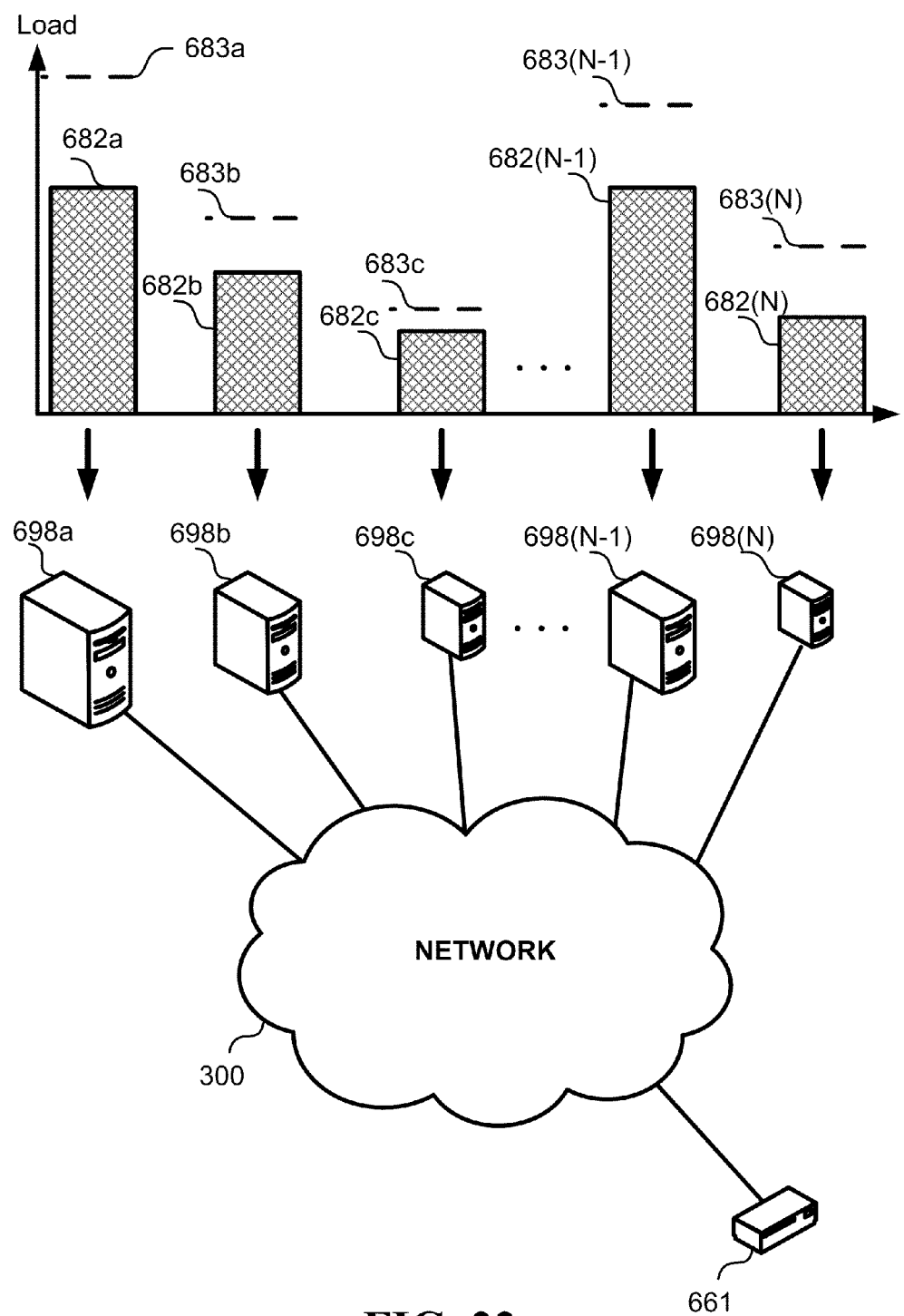
FIG. 22 illustrates fractional-storage servers having different bandwidth capabilities.

FIG. 22 illustrates one embodiment of different servers 698*a* to 698(N) having different bandwidth capabilities of 683*a* to 683(N) correspondingly. Assembling device 661 selects from which K servers, out of the possible N, to retrieve the fragments for segment reconstruction, wherein each server may have different unutilized bandwidth and different bandwidth capability. When many assembling devices assemble contents in parallel, while rejecting servers with a high load, the end effect is that the server array is approximately balanced and most servers can approach their maximal bandwidth capabilities. In one embodiment, the server array is balanced by enabling many assembling devices to select the least loaded servers.

In the example, and assuming that K=3, servers 698*a*, 698(N−1) and 698(N) will be selected, as they have the highest unutilized bandwidth. In another example, the servers having the highest percentage of unutilized bandwidth will be selected.

In one embodiment, servers 698*a* to 698(N) represent completely different types of server hardware, operating systems and capabilities, all put together in an array, and achieving load balance without the need for significant inter-server coordination. In one example, the fragments are distributed to at least two different classes of servers; the first class comprises high bandwidth CDN servers directly connected to the Internet backbone, and the second class comprises lower bandwidth CDN servers not directly connected to the Internet backbone.

In one embodiment, the servers are selected for fragment retrieval according to their unutilized fragment delivery bandwidth. For example, the servers report their unutilized bandwidth, and the assembling devices, or a control server, obtain the report and decide which servers to use for fragment delivery based on the unutilized bandwidth of each server.

In one embodiment, the servers are selected for fragment retrieval according to their ability to support additional fragment delivery load. For example, the servers report their ability to support additional fragment delivery loads. And the assembling devices, or a control server, obtain the report, and select the servers that report an ability to support additional fragment delivery loads.

In one embodiment, the assembling device, or a control server, looks for a pool of servers that may be used as replacements for servers that are loaded to a degree that does not allow continuation of fragment delivery. For example, the assembling device looks for potential unloaded servers, while retrieving fragments from other servers. The assembling device may sample relevant servers approximately randomly, and/or according to indications from a control server. The sampling process may comprise querying the potential server for load information, or measuring the latency or latency variance to the servers in order to estimate the current load on the server.

In one embodiment, it is desired to replace one or more servers by other servers for the delivery of erasure-coded fragments, wherein the replacement servers are selected using a second criterion from a pool of servers identified using a first criterion. For example, the first criterion for identifying the pool of replacement servers comprises looking for servers capable of increasing their fragment delivery throughputs, and the second criterion for selecting the replacement servers from the pool comprises selecting the best latency response server from the pool. In one example, the first criterion is a latency criterion, and the second criterion is a load criterion. In another example, the first criterion is a latency criterion, and the second criterion is a latency variance criterion. In another example, the second criterion is an approximately random selection. In one embodiment, a server selected using the second criterion is compared to the server to be replaced based on the second criterion. For example, the second criterion is latency, and the replacing server, selected from the pool, has a smaller latency than the server it replaces.

In one embodiment, the server to be replaced is identified by comparing the actual performance level of the server with a threshold performance level. For example, when the compared performance is latency, a server having response latency above a certain threshold is replaced. In another example, the compared performance is the load on the server, which may be measured in terms of the amount of the unutilized fragment delivery bandwidth, or in terms of the percent of the server's unutilized fragment delivery bandwidth, or measured by any other appropriate technique.

In some embodiments, the assembling devices use a fragment pull protocol to retrieve the fragments and approach the servicing servers. In some embodiments, the assembling devices use a push protocol to obtain the fragments and approach the servicing servers, possibly by obtaining multiple sub-transmissions comprising fragment sequences.

Figure 23:
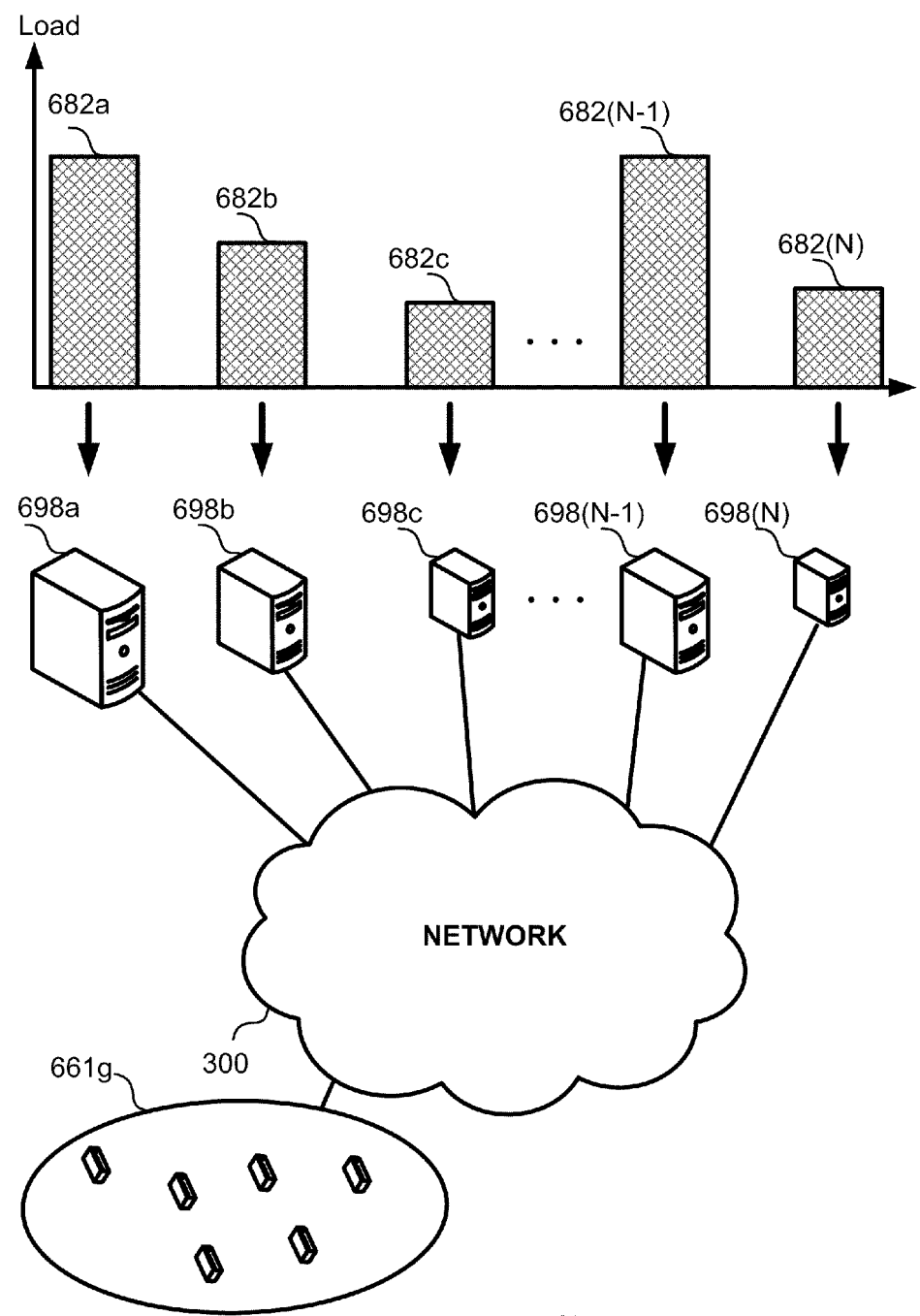
FIG. 23 and FIG. 24 illustrate a case where a fractional-storage server has failed.
Figure 24:
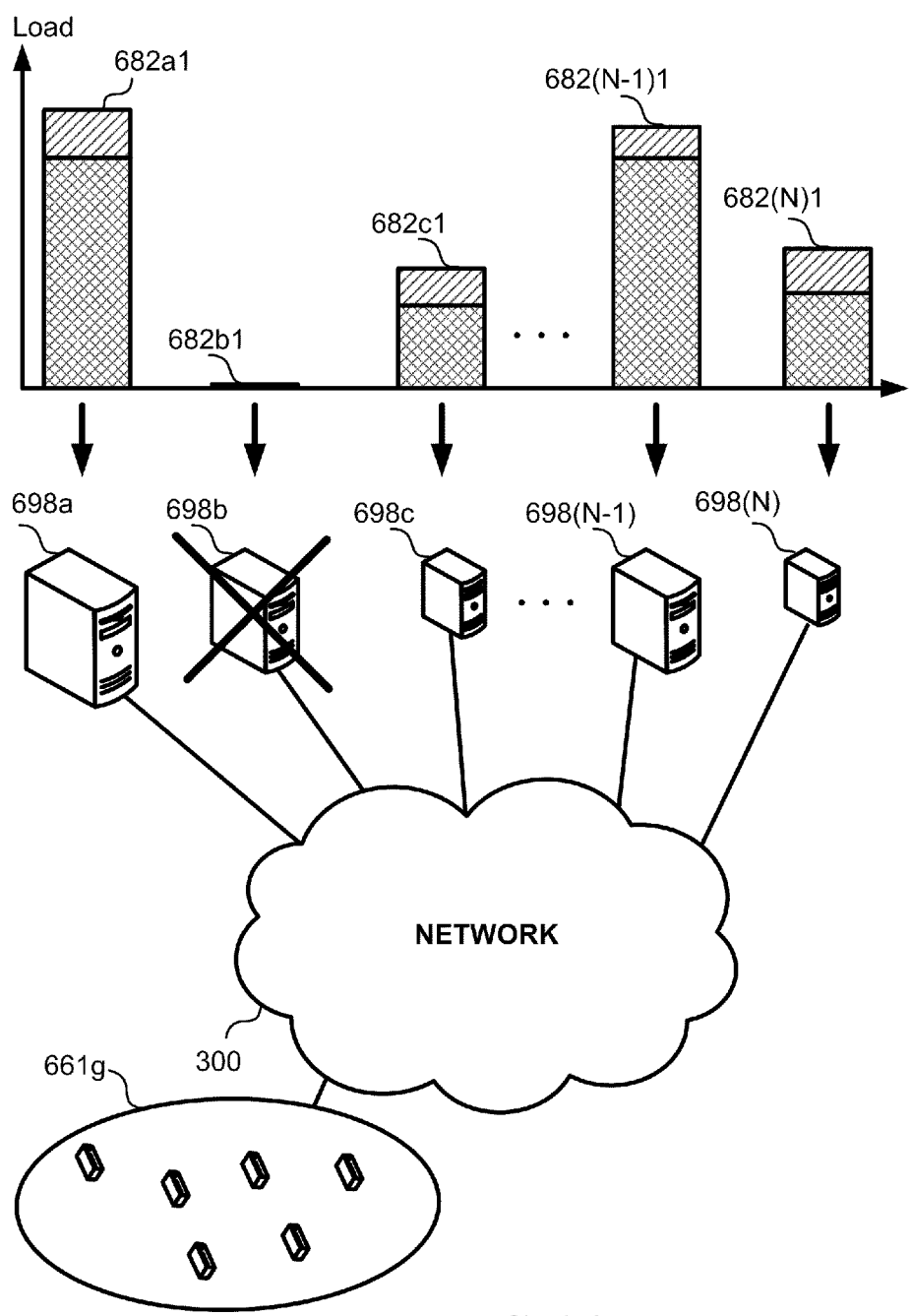

FIG. 23 illustrates one embodiment of a fractional-storage system. Assembling device group 661g obtain erasure-coded fragments from the servers, such that the resulting outgoing bandwidth utilizations of each server in the array is 682a to 682(N) correspondingly. FIG. 24 illustrates a case where server 698b has failed, its bandwidth capability 682b1 is zero, and is therefore unable to provide erasure-coded fragments. The assembling devices from group 661g, which previously obtained fragments from server 698b, may attempt to access it again for additional fragments, but are now unable to get a response. These assembling devices therefore obtain fragments from alternative servers. The end effect is that bandwidth 682b is now loaded on the still available servers, such that the total bandwidth 682a1 to 682(N)1 approximately increases by a total amount equal to 682b, optionally with no inter-server coordination, and simply by the fact that each assembling device selects alternative available servers for obtaining fragment on-the-fly. In one example, instead of obtaining from server 682b1, the assembling devices obtain from the least loaded available servers. In one embodiment, a control server selects the alternative server/s for the assembling devices. In one embodiment, the assembling devices use a fragment pull protocol to obtain the fragments, and approach the alternative servers. In one embodiment, the assembling devices use a push protocol to obtain the fragments, and approach alternative servers, possibly by obtaining multiple sub-transmissions comprising fragment sequences. In this case, the sub-transmissions of the faulty server are discontinued and compensated for by other sub-transmissions from the alternative servers.

Figure 25:
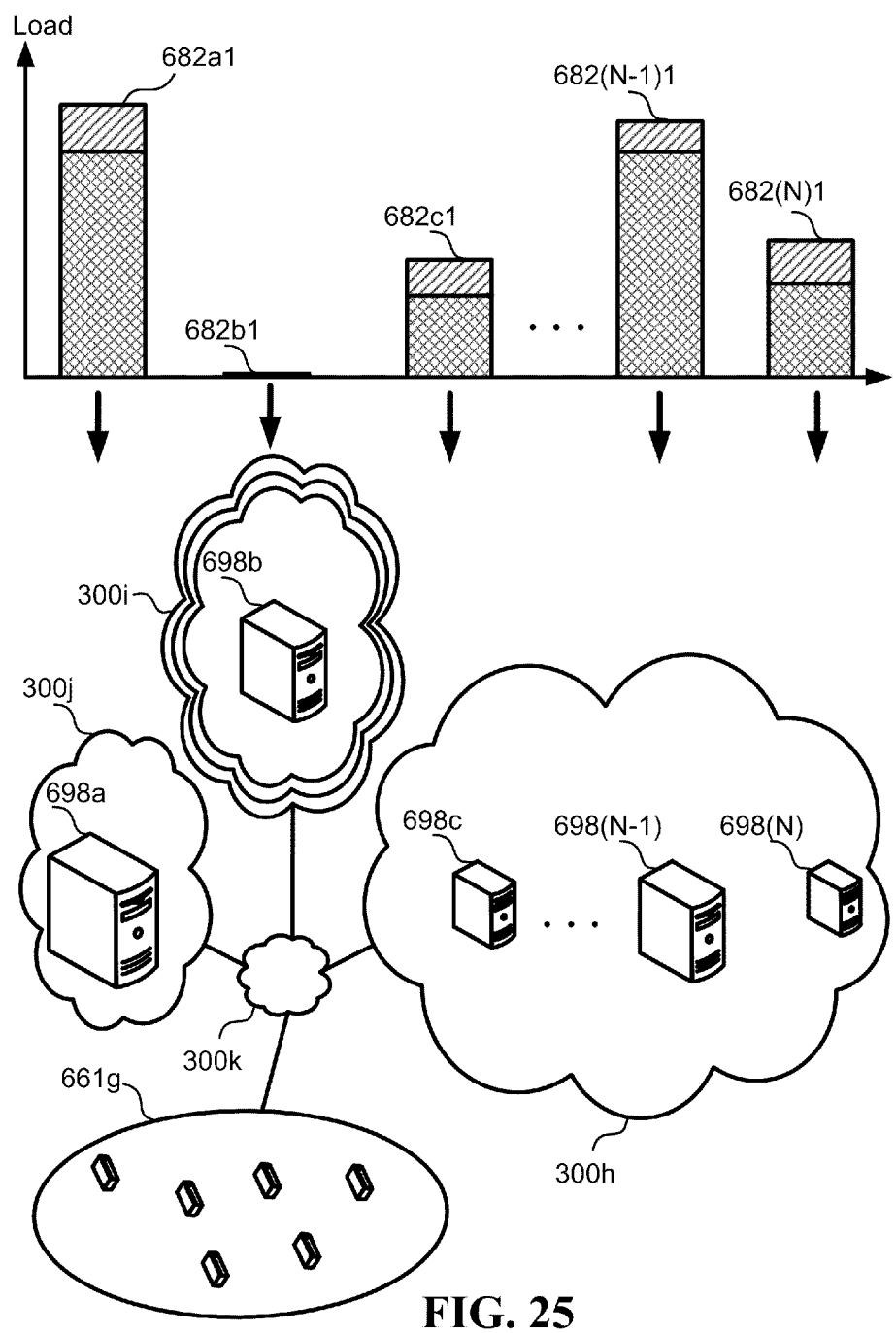
FIG. 25 illustrates a server failure due to network congestion.

FIG. 25 illustrates an example similar to FIG. 24 with the difference that servers 698a, 698b, and 698c to 698(N) reside within, or get serviced via, first, second, and third Internet backbone providers 300j, 300i, and 300h correspondingly. The group of assembling devices 661g is connected to the Internet via network 300k, which has access to all three backbones, such that communication between the assembling devices and servers 698a to 698(N) pass via at least one of the backbones, or more. If server 698b is made unavailable to the assembling devices, optionally not due to a server failure, but rather due to congestion or a failure of the second Internet backbone provider 300i, assembling devices 661g compensate for the lost bandwidth by switching to the available servers on-the-fly. In one embodiment, networks 300h, 300i, and 300j, are different physical sub-nets of one network connected to the Internet. In one embodiment, the assembling devices are connected to networks 300h, 300i, and 300j, via network 300k, and then via one or more Internet Exchange Points ("IX/IXP").

Referring again to FIG. 24, in one embodiment server 698b fails and a replacement is needed. The replacing server (not illustrated) may store either the same erasure-coded fragments stored on server 698b, or store other unique erasure-coded fragments associated with the segments stored on 698b. One method for regenerating the erasure-coded fragments stored on server 698b, or generating equivalent unique erasure-coded fragments, includes the following steps: (i) identifying a failed/non-responsive server. (ii) determining the segments corresponding to the erasure-coded fragments that were stored on the non-responsive server. This may be achieved either by a query to a control server, or by a query to servers in the distributed storage that service the same contents. (iii) reconstructing each segment whose erasure-coded fragments are to be regenerated. This may be achieved by retrieving and decoding enough erasure-coded fragments. (iv) re-encoding at least the required erasure-coded fragments from the reconstructed segments. The re-encoded fragments may be the same as the erasure-coded fragments previously stored on non-responsive server 698b, or may be new, unique erasure-coded fragments. And (v) distributing the required erasure-coded fragments to a new replacement server for 698b.

Figure 26:
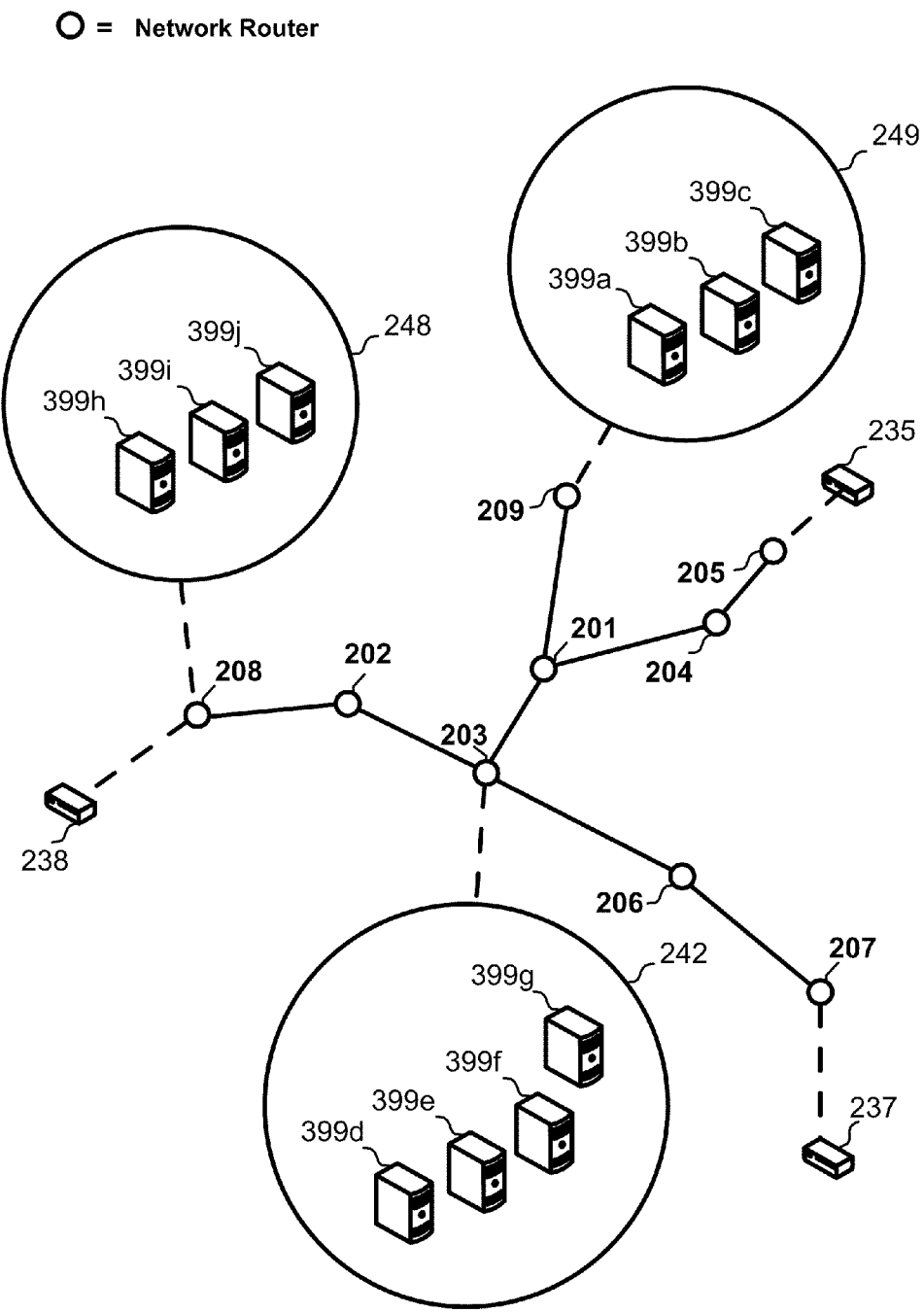
FIG. 26 illustrates retrieving fragments according to locality.

FIG. 26 illustrates a few examples of retrieving fragments according to locality. In one example, the fractional-storage servers are connected to a data network or networks comprising the routers 201 to 209. Assembling devices 235, 237, and 238 are connected to the same data network or networks, and K=3, meaning that any assembling device needs to obtain 3 erasure-coded fragments per segment from optionally 3 different servers out of the 10 in order to successfully reconstruct the segment.

Each assembling device tries to obtain erasure-coded fragments from fractional-storage servers that are closest to it topologically. In one embodiment, the topological distance is a function of the number of separating routers. Assembling device 238 can select three servers from groups 242, 248 or 249. According to the minimal path criterion, it retrieves the erasure-coded fragments from servers 399h to 399i of group 248, since they are only one router 208 away. Groups 242 and 249 are three (208, 202, 203) and five (208, 202, 203, 201, 209) routers away, and are therefore not selected for retrieval. Similarly, device 237 selects three servers out of group 242, and device 235 can select any three servers from groups 242 and 249, since both are located four routers away.

In one embodiment, if topologically close servers do not respond to the assembling device, or report a bandwidth limitation, the assembling device will attempt to obtain an erasure-coded fragment from the next topologically closest server.

In one embodiment, an assembling device attempts to obtain erasure-coded fragments from servers featuring the lowest latency. Upon no response, for whatever reason, the assembling device will attempt to retrieve from the next lowest latency server. In one embodiment, the assembling device obtains information regarding the unutilized fragment delivery bandwidths of servers, and then attempts to retrieve from the lowest latency servers out of the servers having enough unutilized bandwidth. In one embodiment, the assembling device obtains information regarding the unutilized fragment delivery bandwidths of the servers, and then attempts to retrieve from the topologically closest servers out of the servers having enough unutilized bandwidth.

Still referring to FIG. 26, in one embodiment the assembling devices select servers according to a latency criterion, such as selecting servers with the shortest time between fragment request and fragment delivery, or selecting servers having latency below a dynamic or static threshold. Assembling device 237 assembles content from servers 399c, 399f, 399g, and assembling device 235 assembles content from servers 399b, 399c, 399g (both use a mixture of servers from groups 242 and 249). At a certain point in time, router 209 becomes congested or blocked, and prevents the erasure-coded fragments from servers 399b and 399c from arriving at assembling devices 235 and 237, or causes the fragments to arrive with an increased delay. Therefore, assembling device 235 switches to three servers of group 242, and assembling device 237 switches from server 399c to server 399e.

In one embodiment, the assembling device selects fractional-storage servers according to the following criterion: first, servers with adequate unutilized fragment delivery bandwidth are considered, then out of these, those with latency below a threshold are considered, and out of these, the servers with minimal topological routing path are selected.

In some embodiments, the assembling devices use a fragment pull protocol to retrieve the fragments, and approach servers having low latency or low hop count as compared to other servers. In some embodiments, the assembling devices use a push protocol to retrieve the fragments, and approach servers having low latency or low hop count as compared to other servers, optionally by obtaining multiple sub-transmissions comprising fragment sequences.

In one embodiment, a plurality of unsynchronized retrieving assembling devices, which optionally use fragment pull protocol, choose the least loaded servers from which to retrieve the erasure-coded fragments. Optionally, the servers have almost no inter-communication between them and the load balancing calculation is performed by the retrieving assembling devices. Because the assembling devices can select the least loaded servers, the assembling devices manage the load balancing. When the erasure-coded fragments stored by the servers are unique erasure-coded fragments, the retrieving assembling device may retrieve erasure-coded fragments from any relevant server. Therefore, it may be enough for the retrieving assembling device to have indication of the load on its targeted servers, and retrieve enough erasure-coded fragments from the least loaded servers.

In one embodiment, a server signals the retrieving assembling device that it is close to its bandwidth limit and the assembling device searches for an alternative server. Optionally, the assembling device selects the server according to one or more of the following parameters: locality, cost, latency, or reliability. In one embodiment, the servers register their loads on a central server, and the assembling device selects the server to retrieve from, from the registered servers. In one embodiment, a central server, holding the loads of the various servers, determines for the assembling devices from which server to retrieve the erasure-coded fragments.

In one embodiment, assembling devices measure the latency of the different servers in responding to fragment requests, and then use the latency information to estimate the loads on the servers. In one example, a high latency may indicate a high load on the server.

In one embodiment, the topological router hop count between an assembling device and fragment delivering servers is used to estimate the latency of the servers in responding to fragment requests.

In one embodiment, the latency of fragment delivering servers in responding to fragment requests by an assembling device is used to estimate the topological router hop count between an assembling device and the servers.

In one embodiment, the assembling devices perform several latency measurements for the different servers in responding to fragment requests, and then use the latency variance information to estimate the loads on the servers. In one example, a high latency variance may suggest a high load on server.

In one embodiment, fractional-storage servers, from which the fragments are obtained for reconstructing a segment, are selected based on an approximately random selection algorithm from all of the servers storing the relevant fragments. In one example, an approximately random selection algorithm weighted according to the unutilized bandwidth of the servers is used for the approximately random selection of servers. The weighted random selection algorithm assigns servers with selection probabilities proportional to the amount of unutilized bandwidth for fragment delivery in each of the servers, such that the probability to select a server having a larger amount of unutilized bandwidth is higher than the probability to select a server having a lower amount of unutilized bandwidth.

The following embodiments describe processes for on-the-fly selection and re-selection of fractional-storage servers from which to obtain erasure-coded fragments.

In one embodiment, a method for selecting enough new servers from which to obtain fragments, based on the unutilized bandwidth of the servers, includes the following steps:

(i) accessing data regarding servers storing relevant fragments (referred to as the relevant servers); (ii) accessing data regarding the unutilized bandwidth of the relevant servers. Optionally, the data is received by the assembling device from the relevant servers; and (iii) obtaining fragments from enough of the relevant servers having approximately the highest unutilized bandwidth; or obtaining fragments from enough of the relevant servers selected randomly and having unutilized bandwidth above a certain threshold.

In one embodiment, a method for selecting enough new servers from which to obtain fragments, based on latency, includes the following steps: (i) accessing data regarding the relevant servers; (ii) accessing data regarding the latencies from the relevant servers to the assembling device; and (iii) obtaining fragments from enough of the relevant servers having the lowest latencies; or obtaining fragments from enough of the relevant servers selected randomly and having latencies below a certain threshold.

In one embodiment, a method for selecting enough new servers from which to obtain fragments, based on bandwidth and latency, includes the following steps: (i) accessing data regarding the relevant servers; (ii) accessing data regarding the unutilized bandwidth of the relevant servers; (iii) identifying more than enough relevant servers having the most unutilized bandwidth; or randomly identifying more than enough relevant servers having unutilized bandwidth above a certain threshold; (iv) accessing data regarding the latencies from the identified servers to the assembling device; and (v) obtaining fragments from enough of the identified servers having the lowest latencies; or obtaining fragments from enough of the relevant servers selected randomly and having latencies below a certain threshold.

In one embodiment, a method for selecting enough new servers from which to obtain fragments, based on latency and bandwidth, includes the following steps: (i) accessing data regarding the relevant servers; (ii) identifying more than enough relevant servers having latencies to the assembling device below a certain threshold; or randomly identifying more than enough relevant servers having latencies to the assembling device below a certain threshold; (iii) accessing data regarding the unutilized bandwidth of the identified servers; and (iv) obtaining fragments from enough of the identified servers having the highest unutilized bandwidth; or obtaining fragments from enough of the relevant servers selected randomly and having the highest unutilized bandwidth.

In one embodiment, a method for selecting enough new servers from which to obtain fragments, based on locality, includes the following steps: (i) accessing data regarding the relevant servers; (ii) accessing data regarding the network topology distance (locality) from the relevant servers to the assembling device; and (iii) obtaining fragments from enough of the topologically closest relevant servers; or obtaining fragments from enough of the relevant servers that are located in the same sub-network as the assembling device, or located in the closest sub-networks.

In one embodiment, a method for selecting enough new servers from which to obtain fragments, based on bandwidth and locality, includes the following steps: (i) accessing data regarding the relevant servers; (ii) accessing data regarding the unutilized bandwidth of the relevant servers; (iii) identifying more than enough relevant servers having the most unutilized bandwidth; or randomly identifying more than enough relevant servers having unutilized bandwidth above a certain threshold; (iv) accessing data regarding the network topology distance from the relevant servers to the assembling device; and (v) obtaining fragments from enough of the topologically closest relevant servers; or obtaining fragments from enough of the relevant servers that are located in the same sub-network as the assembling device, or located in the closest sub-networks.

In one embodiment, a method for selecting enough new servers from which to obtain fragments, based on latency and locality, includes the following steps: (i) accessing data regarding the relevant servers; (ii) identifying more than enough relevant servers having latencies to the assembling device below a certain threshold; or randomly identifying more than enough relevant servers having latencies to the assembling device below a certain threshold; (iii) accessing data regarding the network topology distance from the relevant servers to the assembling device; and (iv) obtaining fragments from enough of the topologically closest relevant servers; or obtaining fragments from enough of the relevant servers that are located in the same sub-network as the assembling device, or located in the closest sub-networks.

In one embodiment, a method for selecting enough new servers from which to obtain fragments is based on bandwidth, latency, locality, and, optionally, one or more additional relevant parameters. The method may weigh the different parameters in various ways, all of them are intended to be covered by the embodiments. For example, the method may include the following steps: (i) accessing data regarding the relevant servers; (ii) receiving data regarding the unutilized bandwidth latencies to the assembling device, and topology distances to the assembling device; (iii) weighting the received data and identifying a quantity of the most proper relevant servers, which can provide enough fragments to reconstruct content; and (iv) obtaining the fragments from the identified servers. In another example, the method may include the following steps: (i) accessing data regarding the relevant servers; (ii) identifying a set of more than enough relevant servers having the most unutilized bandwidth; or randomly identifying a set of more than enough relevant servers having unutilized bandwidth above a certain threshold; (iii) from the set, identifying a sub-set of more than enough relevant servers having latencies to the assembling device below a certain threshold; or randomly identifying more than enough relevant servers having latencies to the assembling device below a certain threshold; and (iv) obtaining fragments from enough of the topologically closest relevant servers out of the sub-set; or obtaining fragments from enough of the relevant servers out of the sub-sets, which are located in the same sub-network as the assembling device, or located in the closest sub-networks.

In one embodiment, a server may be loaded to a point that it is approximately unable to transmit additional fragments as a response to new fragment requests or new sub-transmission requests. The server may also be too loaded to continue transmitting fragments to its currently served assembling devices. In one example, these cases result from one or more of the following conditions: (i) server hardware limitation, such as CPU power or memory bus constraints, which prevents it from delivering fragments beyond a certain throughput, (ii) outgoing communication link limitation, such as a fixed-bandwidth line, which prevents the server from transmitting fragments beyond a rate that can be supported by the line, (iii) sharing of an outgoing communication line with other servers, and the other servers utilizing the shared line to a point that lowers the bandwidth available for fragment transmission, and (iv) sharing the fragment storage and transmission software together with other applications on one physical server, and the other applications consuming CPU, memory, or communication resources to a point that affects the ability of the fragment storage and transmission software to respond to fragment or sub-transmission requests.

In some embodiments, approximately random selection of fractional-storage servers is utilized for dealing with changes in network conditions, such as packets loss and/or server failure, without affecting the user experience, and optionally without prior knowledge of the type of the change in network condition. Optionally, new erasure-coded fragments are requested from the randomly selected servers instead of failed requests. Optionally, failed servers are replaced with other servers. Optionally, the combination and/or the number of fractional-storage servers from which the fragments are obtained changes over time. Optionally, the number of redundant fragment requests changes over time.

In one example, a constant packet loss condition causes a constant fragment loss condition, which means that a certain percentage of fragments fail to be obtained by the assembling device. In this case, an approximately random selection of new servers may solve the problem, not necessarily because of the randomness of the selection (a general fragment loss condition may affect all servers), but simply because it generates more fragment requests to compensate for the loss, resulting in an increased fragment-delivery throughput that approximately levels at an average steady state value of: (Nominal_Throughput/(1−Fragment_Loss_Ratio)), wherein the Nominal_Throughput is the fragment-delivery throughput resulting when no packets are lost, and the Fragment_Loss_Ratio is the (fragment_lost/fragments_sent) ratio, which is a parameter that increases monotonically with the packet-loss.

In another example, the failure is specific to one or more servers, and the approximately random selection of new servers finds new servers having lower failure ratios. In this case, the random selection solves the problem, since trying to retrieve again from problematic servers may have no positive effect. The above two examples demonstrate how a single selection strategy successfully copes with different types of failures, while resulting in a different behavior according to the type of failure (different resulting fragment delivery rates for example), and all that without prior knowledge of the exact nature of the failure. In another example, the servers are deployed over multiple networks and the communication fault comprises a failure of one of the networks causing related servers to be inaccessible. As a solution, the assembling device approximately randomly reselects the servers until it communicates with enough accessible servers to reconstruct a segment. Other examples are possible, in which an unknown failure is correctly handled by approximately random on-the-fly server selection.

In one embodiment, different servers receive different weights proportional to their bandwidth. For example, the higher the bandwidth capability of the server, the higher the server coefficient; the higher the server coefficient, the higher the probability of selecting the server by an assembling device. In one embodiment, selecting the servers approximately randomly enables the fractional-storage system to operate well when the assembling devices do not know the load on at least some of the servers.

In one embodiment, the approximately random selection of servers produces a set of source servers from which erasure-coded fragments are retrieved using a fragment pull protocol. In another embodiment, the approximately random selection of servers produces a set of source servers from which erasure-coded fragments are retrieved using a push-protocol. In this case, multiple sub-transmissions may be used to transport the fragments from multiple servers to an assembling device. When new server sources are randomly selected instead of others, the assembling device may end the sub-transmissions associated with the replaced servers, and initiate new sub-transmissions from the replacing servers, optionally from the point that the terminated sub-transmissions were interrupted.

In one embodiment, the approximately random server selections are made from the servers not currently servicing the assembling device. In one embodiment, the approximately random server selections are made from all servers storing relevant fragments, including the server(s) that serviced the assembling device before being identified as problematic.

In one embodiment, approximately random reselections of servers are performed occasionally, even if all currently servicing servers are functioning correctly. In this case, the assembling device may select a few servers from the current set, to be randomly replaced. In one embodiment, functioning servers are kept throughout several segment retrieval cycles, and potentially for the entire delivery cycle of a segmented content.

In one embodiment, a method for reselecting one or more fractional-storage CDN servers on-the-fly, comprising: pulling erasure-coded fragments from the servers; estimating the servers' load, latency, network congestion, and packet loss; and operating a fuzzy algorithm on the estimations in order to replace at least one of the servers with at least one other fractional-storage server. Optionally, the method further comprising operating the fuzzy algorithm based on measurements of many assembling devices and recommendations received from a central server. Optionally, the method further comprising replacing the servers quickly after missing a fragment. And optionally, the fuzzy algorithm weighs many possible solutions and converges to a sufficient one.

Figure 27:
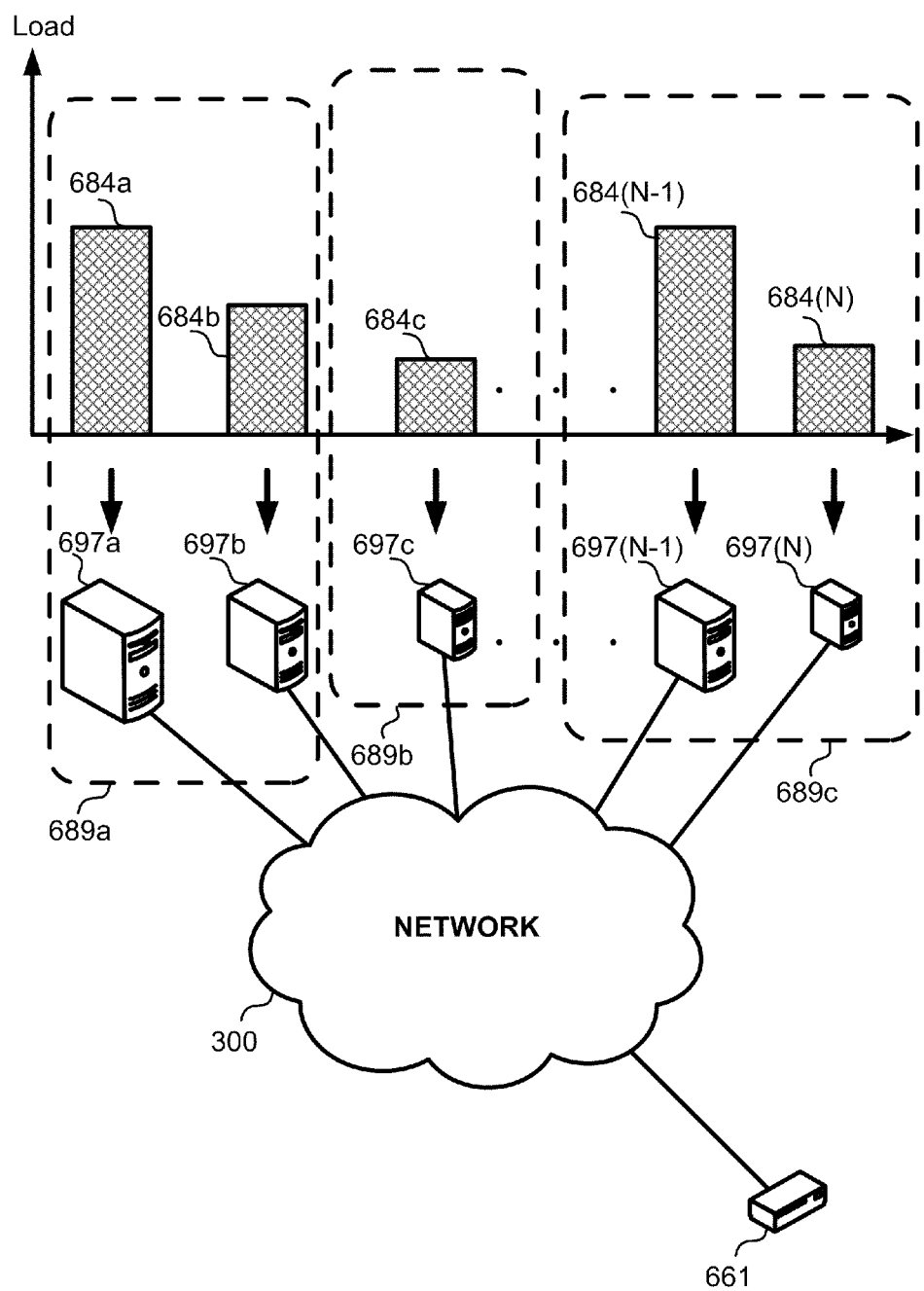
FIG. 27 illustrates fractional-storage servers placed at different locations.

FIG. 27 illustrates one embodiment of fractional-storage servers 697a to 697(N), wherein each server, or a group of servers, may be owned and/or connected to the Internet in any combination and by different entities. The following 3 examples illustrate how the assembling devices balance the load on the fractional-storage servers.

In a first example, servers 697a and 697b, server 697c, and servers 697(N−1) and 697(N) are connected to the Internet 300 via first, second, and third Internet backbone operators (689a, 689b, and 689c) correspondingly. Assembling device 661, assembling a content stored in the array, can select the servers from which to retrieve regardless of its Internet backbone operator connection, and in a manner that combines erasure-coded fragments coming from different Internet backbone operators.

In a second example, assembling device 661 can select the servers regardless of the hosting ISP, and in a manner that combines fragments from several ISPs.

In a third example, servers 697a and 697b are owned by a private corporate 689a, server 697c is hosted by an ISP 689b and servers 697(N−1) and 697(N) are connected to the Internet 300 via an Internet backbone operator. Assembling device 661 can select the servers regardless of the hosting entity, and in a manner that combines fragments from servers hosted in private corporate, ISP and backbone operators.

Still referring to FIG. 27, in one example servers 697a and 697b, server 697c, and servers 697(N−1) and 697(N) are connected to the Internet 300 via first, second, and third hosting providers (689a, 689b, and 689c) correspondingly. Assembling device 661 can select the servers regardless of the hosting provider, and in a manner that combines erasure-coded fragments from several hosting providers. At any point in time, the operator of the distributed storage system can perform a cost effectiveness analysis of the hosting and data transport services provided by each hosting provider, and look for new hosting providers as candidates for replacement of one or more of the current hosting providers. If such a replacement is found, such as when a better hosting deal can be obtained, the distributed storage operator can terminate the services of such hosting provider(s), and replace it with a better deal.

In one example, if the second hosting provider 689b is found to be too expensive, it can be replaced with a fourth provider (not illustrated), while the first and third providers are still maintained, and provide service to the distributed storage system via remaining servers 697a, 697b, 697(N−1) and 697N. Server 697c will be terminated, and optionally replaced by other servers belonging to the fourth hosting provider. Optionally, the entire process is performed without affecting the streaming to the assembling device 661, or any other client groups, and no inter-server cooperation may be necessary throughout the process of replacing the hosting provider.

Figure 28:
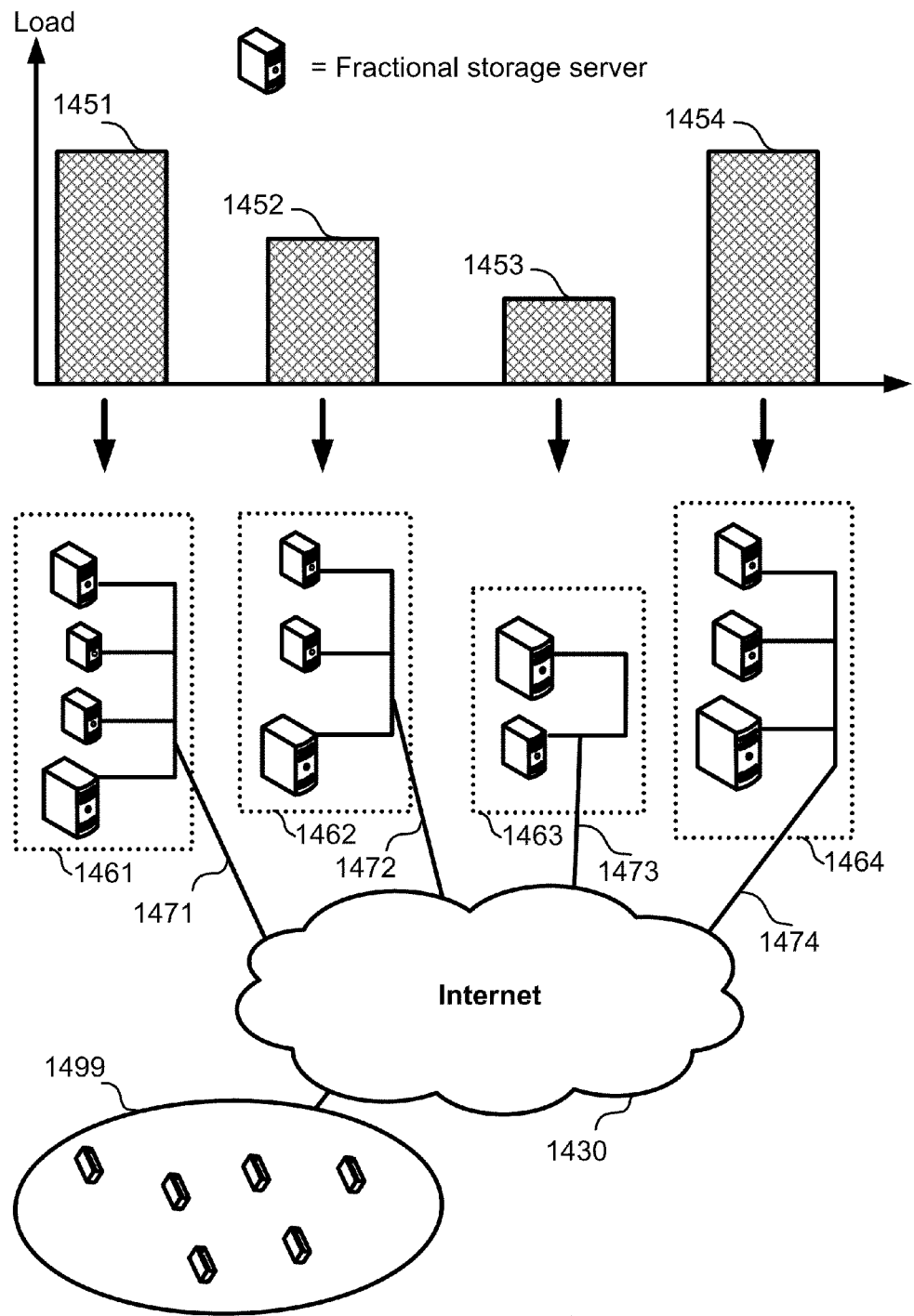
FIG. 28 to FIG. 30 illustrate one embodiment where a data center hosting fractional-storage servers has failed and is replaced by a different data center.

FIG. 28 illustrates one embodiment in which different data centers 1461 to 1464 host fractional-storage servers. The servers store erasure-coded fragments encoded with a redundancy factor R greater than one. A plurality of assembling devices 1499 obtain fragments needed for streaming contents. No group of servers within any one of the data centers store more than (1−1/R) of the fragments associated with a single segment to be reconstructed; meaning that if any one of the data centers stop delivering fragments, the other data centers still comprise enough erasure-coded fragments needed to decode the fragments. Upon termination of a fragment delivery service from any one of the data centers, the servers of the data center whose fragment delivery service was terminated are deselected for fragment delivery, and other servers in other data centers are selected for fragment delivery instead, while the streaming of the contents to affected assembling devices continues during this short deselection-reselection process, and without disrupting any ongoing streaming operation. Usually, each data center hosts more than one server, but a data center may also host a single server. In one embodiment, more than 200 servers are hosted in more than 20 data centers. In one embodiment, more than 10,000 servers are hosted in more than 100 data centers, and deliver fragments at an aggregated throughput of more than 10 Terabit per second.

In one embodiment, different data centers feature significantly different characteristics. Examples of different characteristics include (i) available storage space, (ii) available fragment delivery throughput, (iii) latency in response to fragment requests, (iv) a difference in the tier or size of the network to which the data center is directly connected, (v) ownership of the data center, (vi) operation cost, (vii) data center outage periods and frequency, (viii) data center reliability, and/or (ix) the nature or capacity of the line connecting the data center to the Internet.

In one embodiment, some of the data centers may belong to one or more of the following entities: a hosting provider, a backbone or Tier-1 network operator, and/or a corporation.

In one embodiment, the data center is any structure connected to the Internet, and providing an Internet connection to at least one housed fractional-storage server. In one embodiment, the data center is connected with a fixed bandwidth link to the Internet. In one embodiment, the data center is connected to a router that is a part of an Internet backbone or Tier-1 network.

In one embodiment, the assembling devices 1499 use a fragment pull protocol to retrieve fragments from the servers and to approach new servers, optionally on-the-fly while streaming contents, instead of servers whose data center's fragment-delivery service was terminated.

In one embodiment, the assembling devices 1499 use a push protocol to obtain fragments from the servers by utilizing multiple sub-transmissions. Servers whose data center's fragment-delivery service was terminated are replaced, optionally on-the-fly while streaming contents, by other servers which operate as the sub-transmission sources.

In one example, the deselection-reselection process takes a few seconds or less. In one example, the deselection-reselection process is done faster than it takes to play the content stored in one relatively short segment. In one example, the deselection-reselection process is done by assembling devices. In one embodiment, the reselection of servers is done by a control server.

In one embodiment, termination of fragment delivery service from any one of the data centers may be a result of the data center underperforming in comparison to other data centers. The termination in this case is usually triggered by the fragment-delivery service operator.

Examples of underperformance include (i) the cost of delivering data being higher than delivering data from other centers, (ii) the transmitted fragments being subject to higher fragment loss rate as compared to other centers, (iii) the transmitted fragments being subject to higher latency or latency variance as compared to other centers, and/or (iv) the outage periods being longer or more frequent than those of other centers.

In one embodiment, termination of fragment delivery service from any one of the data centers may be a result of the data center operator or hosting provider not wanting to continue hosting the fractional-storage servers. Such termination may be abrupt and without a warning.

In one embodiment, just before service termination, the aggregated unutilized fragment-delivery bandwidth available to the alternative servers is larger than the fragment delivery throughput via the data center whose service is terminated. In other words, there is enough bandwidth among the remaining servers to support the streaming throughput of the system prior to the termination event.

In one embodiment, just before service termination, the terminated service is still capable of delivering a substantial fragment throughput but is underperforming in comparison to the other data centers. In other words, the center is still able to perform prior to service termination.

In one embodiment, servers housed in data centers whose fragment delivery service is about to be terminated, are excluded from the pool of servers considered by assembling devices or control servers as valid sources of fragments. The service is then terminated after approximately all assembling devices have stopped using these servers as fragment sources.

In one embodiment, a new data center housing servers storing unique fragments is added to the service before the step of terminating the fragment delivery service of a certain center. In this case, the aggregated unutilized fragment delivery bandwidth of the new data center and the remaining data centers is larger than the fragment delivery throughput supplied by the service to be terminated.

In one embodiment, from time to time and on a regular basis, the system adds and excludes data centers from the streaming operations, while maintaining continuous streaming.

In one embodiment, data centers that underperform compared to the other data centers are candidates for exclusion. In one embodiment, most of the excluded data centers provided fragments to approximately the smallest number of assembling devices over a predefined period before their exclusion.

In one embodiment, the erasure-coding used is a rateless-coding, enabling practically an infinite number of unique fragments. Therefore, it is possible to assign unique fragments to servers of newly added data centers, regardless of how many data centers are added and removed, and at what frequency. New and unique fragments can always be calculated and used. In one embodiment, the fragments stored on servers of the excluded data center are usually not stored again on servers of the remaining or to be added data centers, especially when using rateless coding.

In one embodiment, over a long period, there are more additions of data centers than exclusions, and therefore the streaming and storage capacity of the streaming system increases.

Figure 29:
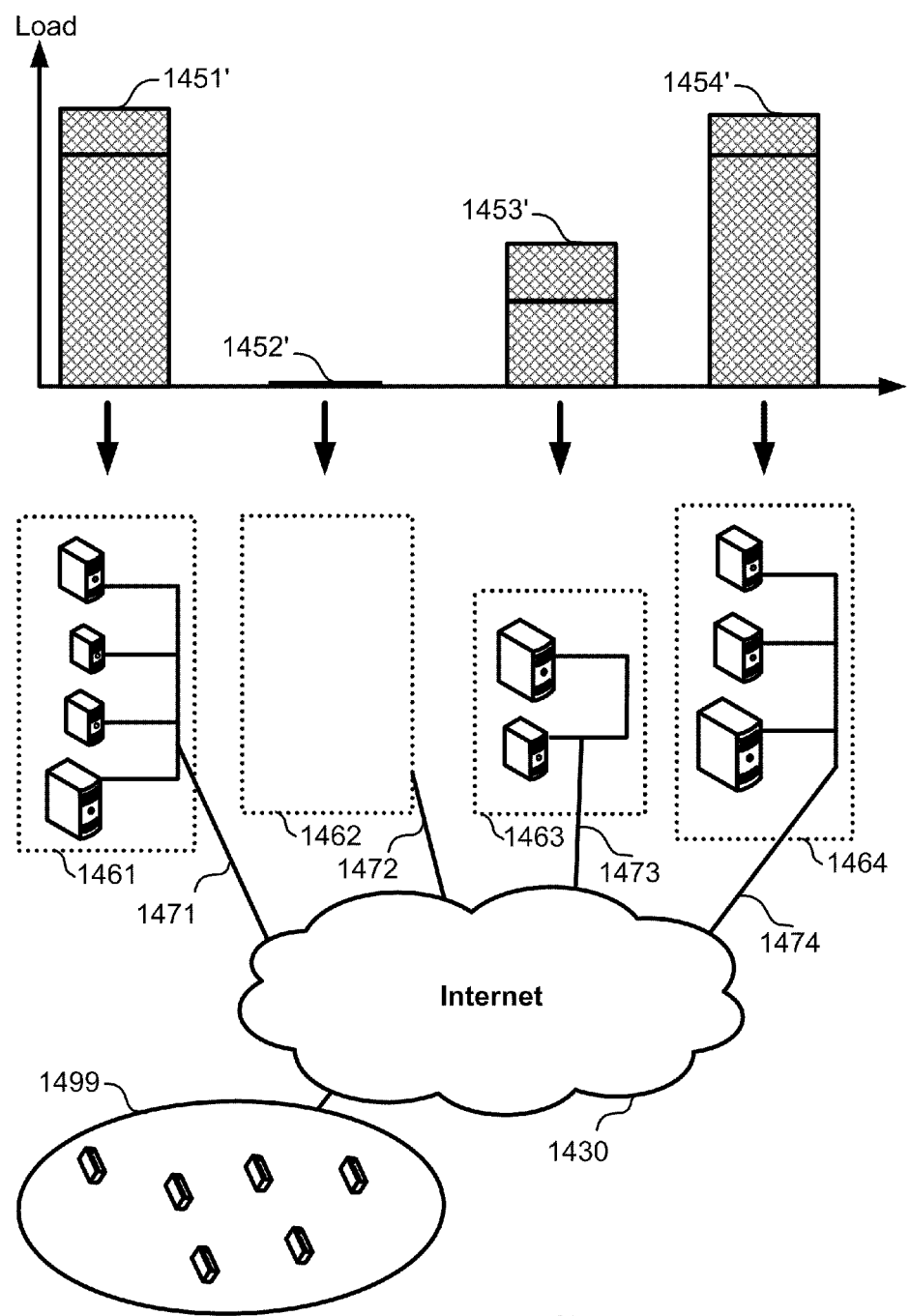
Figure 30:
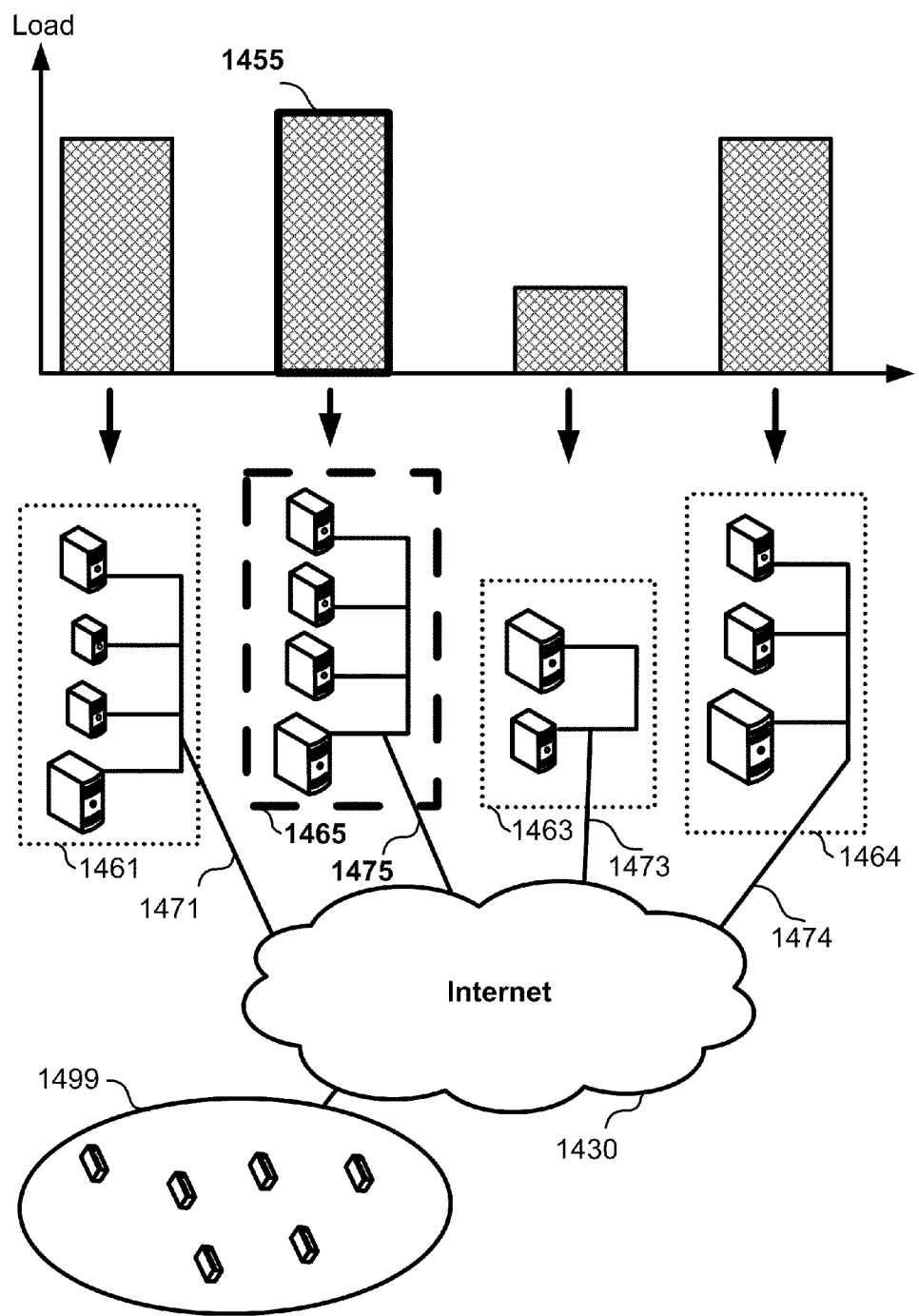

Still referring to FIG. 28, the following example illustrates some of the above principles: data centers 1461 to 1464 transmit fragments via communication links 1471 to 1474 at throughputs of 1451 to 1454 respectively to assembling devices 1499 over the Internet 1430. The redundancy factor of the fragments is, as an example, 2; meaning that approximately ½ of any of the stored fragments can be used to decode the fragments. In this example, the servers in each of the centers store ¼ of the fragments. After evaluating the performance of the different centers, a conclusion is made that center 1462 is underperforming relative to the other centers. A decision is then made to terminate fragment delivery service from center 1462, and the service is terminated. Termination can be done by removing the fragment delivering servers from the center, by removing the fragment delivery application from servers belonging to the data center, or by any other applicable manner. Referring now to FIG. 28 and FIG. 29, at the point of termination, fragment throughput 1452 from center 1462 is reduced to 1452', which is zero. The lost throughput must be gained in order to avoid disruption of fragment delivery to some of the assembling devices. The lost throughput is gained by diverting fragment traffic from center 1462 to the other centers. The diversion can be made using a fragment pull protocol or using sub-transmissions in accordance with some embodiments. After the diversion, fragment throughputs 1451, 1453, and 1454 increase to 1451', 1453', and 1454' respectively, such that the throughput difference: (1451'+1453'+1454')−(1451+1452+1453+1454) equal to or greater than zero. It is noted that since center 1462 stored only ¼ of the fragments, the remaining ¾ of fragments are still enough to support fragment decoding, since the redundancy prior to the termination event was 2, and has now dropped to (¾)/(½)=1.5. In other words, the termination satisfies the requirement that the terminated center stores no more than (1−1/R) of the fragments. And indeed, ¼<(1−1/R), wherein (1−1/R)=(1−½)=½ in this example. The example continues in FIG. 30, wherein a new data center 1465 joins the system by hosting fragment delivering servers. The new center delivers a throughput of 1455, which is added to the other throughputs of the other remaining centers. Optionally, the fragments stored in the servers housed in data center 1465 are different from the fragments previously stored on servers housed in data center 1462. Optionally, the different fragments are derived using a rateless code, which assured that there would practically never be a shortage of new unique fragments.

In the claims, a sentence such as "erasure-coded fragments encoded with a redundancy factor R>1 and associated with segments of streaming contents" is to be interpreted as erasure-coded fragments encoded with one redundancy factor or with a plurality of redundancy factors greater than one. For example, some fragments associated with a first set of segments of content may have a redundancy factor of two, and some fragments associated with a second set of segments of the same content may have a redundancy factor of three.

Figure 31:
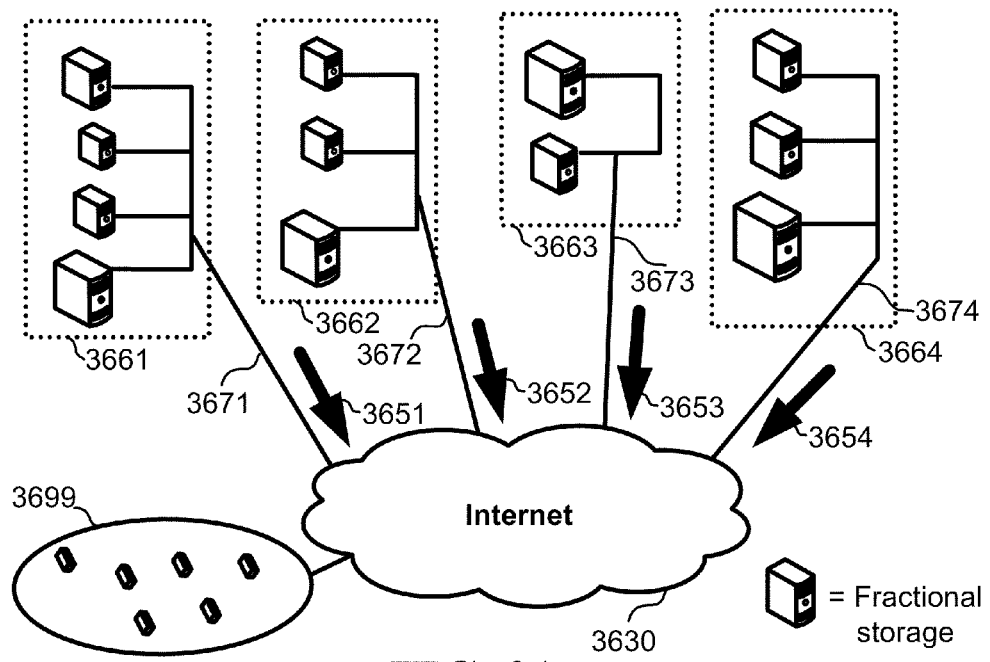
FIG. 31 and FIG. 32 illustrate operation of multi data-center CDN.

FIG. 31 illustrates one embodiment in which fractional-storage servers within data centers 3661 to 3664 store erasure-coded fragments encoded with a redundancy factor greater than one. A plurality of assembling devices 3699 obtain decodable sets of fragments from subsets of the servers and measure fragment delivery parameters that are indicative of delivery performances, such as latency in responding to requests, or fragment loss ratios. Each assembling device can readily make the measurements on fragments sent to it. Decisions are constantly made by the assembling devices, a control server, or any other decision component, regarding selection and reselection of servers participating in the subsets. The decisions are based on the measured parameters, and are made in order to improve the measured parameters. After many such decisions are made for or by many assembling devices, it is possible to estimate the performances of the different data centers. A data center that is underperforming relative to other data centers is likely to feature one or more of the following: (i) delivers fewer fragments to assembling devices as compared to other data centers, (ii) incurs higher cost per fragment delivery, and thus is less cost effective compared to other data centers, (iii) utilizes a lower percentage of the fragment delivery bandwidth available to it, as compared to other centers, and/or (iv) exhibits any other measurable degradation in performance level, that is a result of server participation in subsets, and that can be used to differentiate it over well performing data centers. The preference of the assembling devices, or other decision component, for some servers over other servers creates a "natural selection" process that can be utilized to distinguish well performing data centers over underperforming data centers. After the data centers are distinguished, decisions can be made regarding a future utilization of each center.

In one embodiment, one or more of the following is used as the measured fragment delivery parameters: latency in responding to data requests, variance in latency in responding to fragment requests, fragment loss, service outage, and/or reported load level encountered by the servers when delivering fragments. In one embodiment, the assembling devices are configured to obtain the fragments using a fragment pull protocol that is used for estimating at least one of the parameters.

An underperforming data center is likely to include servers that are less frequently selected for participation in subsets than servers belonging to other well performing data centers. This, in turn, reduces the fragment delivery throughput from the underperforming center, as compared to other centers. In one embodiment, centers having lower delivery throughputs over time are excluded from the system.

In one embodiment, an underperforming data center has a higher cost of delivering a fragment than other centers. A center that includes servers that are less frequently selected for participation in subsets, compared to servers belonging to other well performing data centers, will have lower fragment delivery throughput as compared to other centers. Assuming that the fragment delivery operator is paying a fixed price for that center's delivery services, the result is a decrease in fragment delivery cost efficiency. In this case, one option is to exclude the underperforming center from the system, and to stop delivering fragments from it. Another option is to reduce the amount of bandwidth acquired from that center, to a level that is more appropriate to actual throughputs, or to down-scale the service agreement and reduce the fixed price. This may increase the cost efficiency of the center back to an acceptable level. If further reduction in throughputs are observed, and cost efficiency falls again, then the process of reducing the acquired bandwidth or downscaling the service agreement can be repeated, until possibly eliminating the center as a fragment source.

In one embodiment, an underperforming data center has a percentage of utilized fragment delivery bandwidth out of available fragment delivery capacity that is lower than other better performing centers. In this case, one option is to exclude the underperforming center from the system, and stop delivering fragments from there. Another option is to reduce the amount of available fragment delivery capacity from that center, to a level that is more appropriate to actual throughputs. This may decrease the percentage of utilized fragment delivery bandwidth out of available fragment delivery capacity of the center back to an acceptable level. If further reduction in throughputs is observed, then the process of reduction in available fragment delivery capacity can be repeated, until possibly eliminating the center as a fragment source.

In one embodiment, after identifying an underperforming data center, one or more of the following actions may be taken: (i) excluding the data center from the system, with fragments no longer being delivered from there; (ii) reducing the amount of bandwidth acquired from the data center. If the center is still underperforming, then the process of acquired bandwidth reduction can be repeated, until possibly eliminating the center as a fragment source and/or (iii) downscaling the service level agreement. If the center is still underperforming, then the process of downscaling can be repeated, until possibly eliminating the center as a fragment source.

In one embodiment, a decision component determines which servers are to transmit fragments to which assembling device, and occasionally changes at least some of the servers of the subsets. Optionally, the decision component is implemented at each assembling device. Alternatively, the decision component is implemented at a control server, which may receive the measured fragment delivery parameters from the assembling devices.

In some embodiments, one or more of the following embodiments may be used for enhancing the capacity of one or more data centers. In one embodiment, a data center exhibiting high fragment delivery throughput, which approaches the available fragment delivery capacity of the center, is a candidate for capacity enhancement. In this case, additional fragment delivery bandwidth can be acquired from the center, or alternatively, the service level agreement can be upgraded, such that the percentage of utilized fragment delivery bandwidth out of available fragment delivery capacity decreases. If, over time, the data center again exhibits a level of fragment delivery throughput approaching the available fragment delivery capacity, the process of capacity enhancement may be repeated. In one embodiment, a data center exhibiting high fragment delivery cost efficiency is a candidate for capacity enhancement. In this case, additional fragment delivery bandwidth may be acquired from the center, or alternatively, the service level agreement can be upgraded. If, over time, the data center still exhibits high fragment delivery cost efficiency, the process of capacity enhancement can be repeated, until a reduction in cost efficiency is identified. The cost efficiency may be measured in absolute terms, or may be measured relative to other data centers. In one embodiment, at least one of the data centers is connected to the Internet via a high bandwidth fixed line having a certain fragment delivery capacity, and when the fragment delivery throughput from that center approaches the capacity of the fixed line, the capacity is upgraded. In one embodiment, at least one of the data centers provides Internet bandwidth services to multiple applications via a shared communication line, the fragment delivery throughput in that center is limited to a capacity smaller than the bandwidth capacity of the shared line, and when the fragment delivery throughput from the center approaches the limited capacity, the limited capacity is enhanced. The capacity may optionally be enhanced by upgrading the service agreement with the data center. In one embodiment, at least one of the data centers is connected to the Internet via a high bandwidth fixed line having a certain fragment delivery capacity, and when the fragment delivery throughput from that center approaches the capacity of the fixed line, the capacity may be upgraded. In one embodiment, the quality of the fragment delivery from at least one of the data centers is monitored, and when the fragment delivery throughput approaches a level that lowers the quality, the bandwidth capacity of the center is enhanced in order to improve the quality. In one embodiment, when the fragment delivery throughput of a data center approaches its fragment delivery capacity, at least one other data center located nearby is added to the system.

In one embodiment, the system comprises multiple data centers. The fragment delivery performances of the centers are monitored, optionally over a long period, in order to enable the exclusion of most underperforming data centers even if still capable of providing a substantial fragment delivery throughput.

Figure 32:
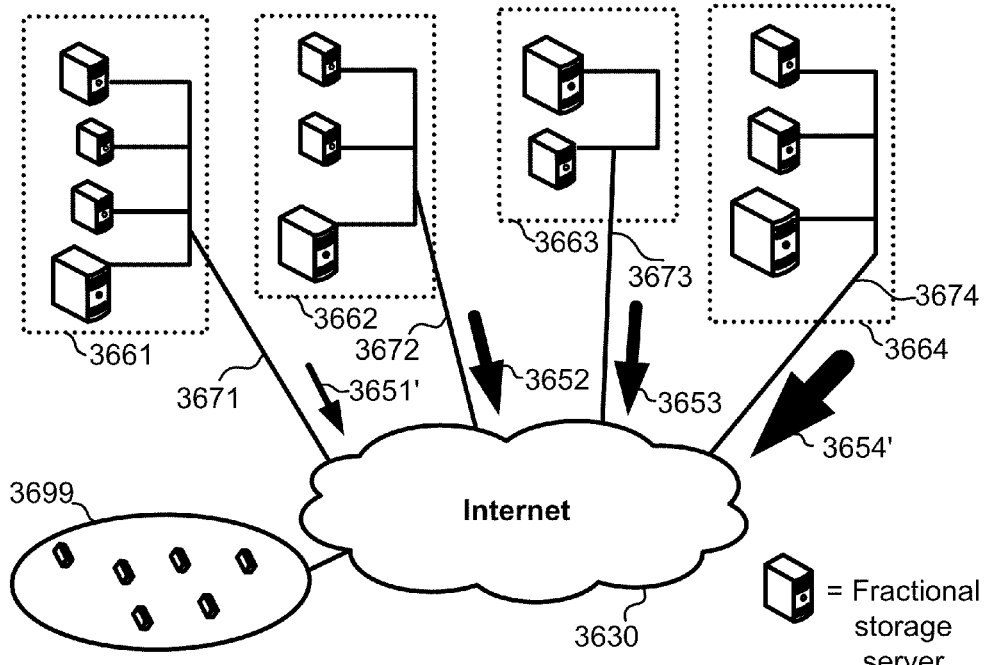

FIG. 31 and FIG. 32 illustrate some of the above principles and embodiments, in accordance with one example. Data centers 3661 to 3664 include fractional-storage servers. Multiple assembling devices 3699 obtain erasure-coded fragments from the servers. At first, the fragment delivery throughputs 3651 to 3654 delivered by data centers 3661 to 3664 over communications lines 3671 to 3674 respectively, are approximately equal to each other. Over time, the assembling devices measure fragment-delivery parameters associated with servers of the different centers, and select subsets of servers from which to obtain decodable sets of fragments accordingly. The measured parameters associated with center's 3661 servers are not as good as the parameters measured from other servers. Center's 3661 servers are therefore less frequently selected by assembling devices 3699, and the result is a reduction in fragment delivery throughput from that center from 3651 to 3651'. At the same time, the measured parameters associated with center's 3664 servers are better than parameters measured by assembling devices from other servers. Center's 3664 servers are therefore more frequently selected by assembling devices, and the result is an increase in fragment delivery throughput from that center from 3654 to 3654'. The performance of the different data centers can now be compared, and decisions can be made regarding the future utilization of the center's resources. The following two examples illustrate performance comparisons and corresponding decisions.

In the first example, data center 3661 is underperforming in a sense that it has a lower percentage of utilized fragment delivery bandwidth out of available fragment delivery capacity as compared to the other better performing centers. In the second example, data center 3661 is underperforming in a sense that it has a lower fragment delivery cost-efficiency as compared to the other better performing centers. In both cases, fragment delivery service from center 3661 may be terminated, or reduced by acquiring less bandwidth from center 3661 or by downgrading the service level agreement with the center. On the other hand, data center 3664 is performing well, in a sense that it has a higher percentage of utilized fragment delivery bandwidth out of available fragment delivery capacity as compared to the other better performing centers, or alternatively a good fragment delivery cost-efficiency. Therefore, the fragment delivery service level agreement with data center 3664 may be upgraded, or additional fragment delivery bandwidth may be acquired.

Figure 33:
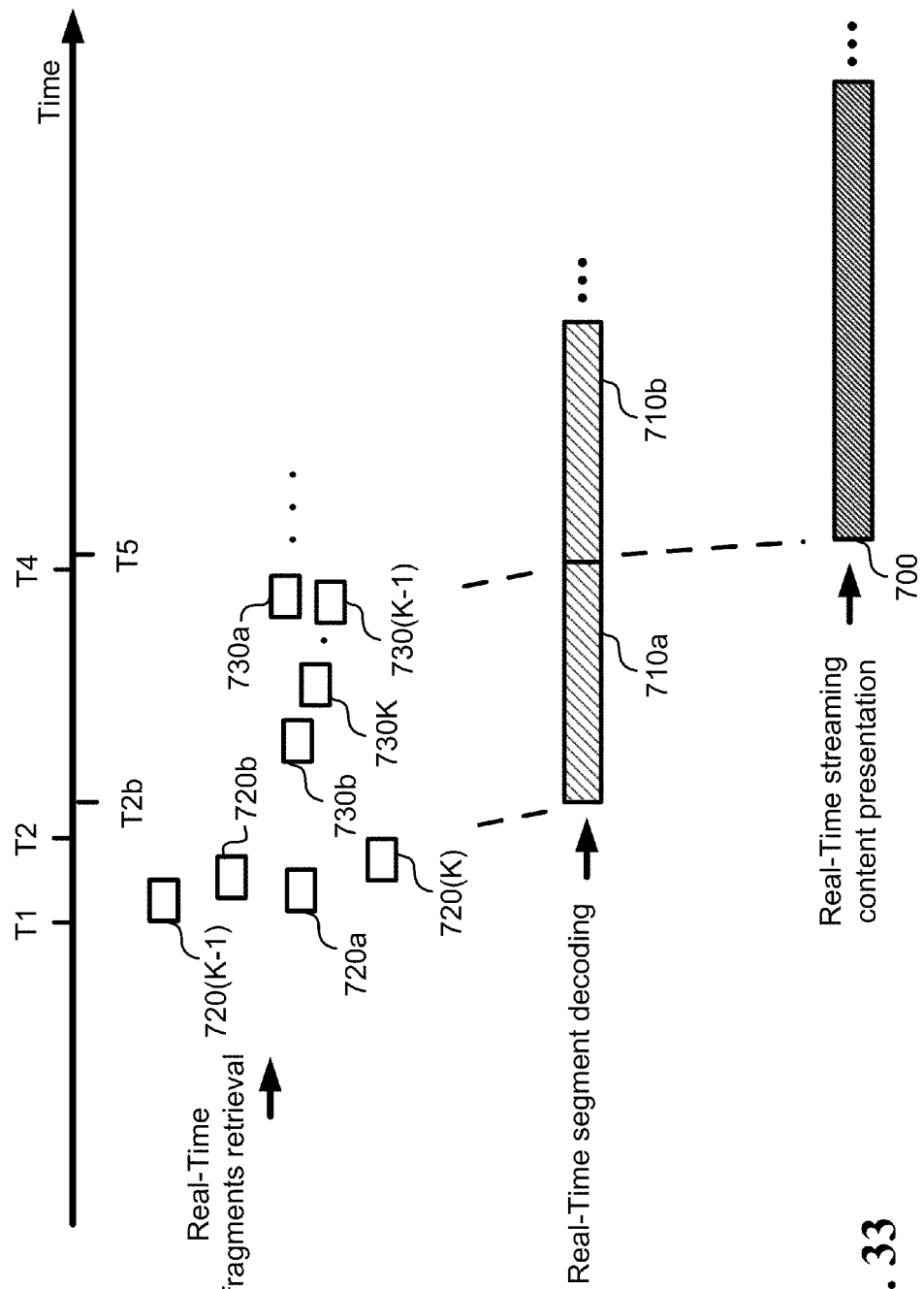
FIG. 33 illustrates fast real time fragment retrieval.

FIG. 33 illustrates one embodiment of real time streaming content retrieval from fractional-storage servers, wherein erasure-coded fragments 720*a* to 720(K) are retrieved in a fast cycle, meaning that several erasure-coded fragments are obtained approximately in parallel. As a result, the interval T2 minus T1 is more or less limited only by the download bandwidth of the assembling device's modem. Referring to the example of FIG. 15, T2 minus T1 can be reduced from 0.77 seconds to 0.15 seconds, if the modem operates at 5 Mbps (instead of 1 Mbps).

In one embodiment, T1 to T2 represents a fragment fetch cycle that corresponds to the beginning of streaming content to be presented (in that case, segment 710*a* is the first segment of the content, and presentation 700 corresponds to the beginning of the streaming content), or corresponds to a certain point within the streaming content to be presented starting this point onwards (in that case, segment 710*a* is a segment within the content, and presentation 700 corresponds to playing the content starting not from the beginning, but rather from segment 710*a*, located somewhere within the content). This is also known as trick play. In one embodiment, erasure-coded fragments 720(*a*) to 720(K) are obtained such as to result in approximately a maximum utilization of the download capabilities of the assembling device, and such that the rate of requesting erasure-coded fragments results in a data arrival rate that on average utilizes the assembling device's maximum download bandwidth.

In one embodiment, the fragment pull protocol request includes a priority indication. A high priority indication means that the servers should give a preference to responding with a fragment transmission. High priority requests are served before other requests. Optionally, high priority requests are served even if the server's bandwidth quota is exceeded. In one embodiment, the high priority requests are used by the assembling devices for receiving priority in the reception of the first segment, or several first segments, in order to facilitate fast starting of content presentation after content request by the user (either when starting to play a content, or in trick play mode, when starting to play a content from a certain point).

Figure 34:
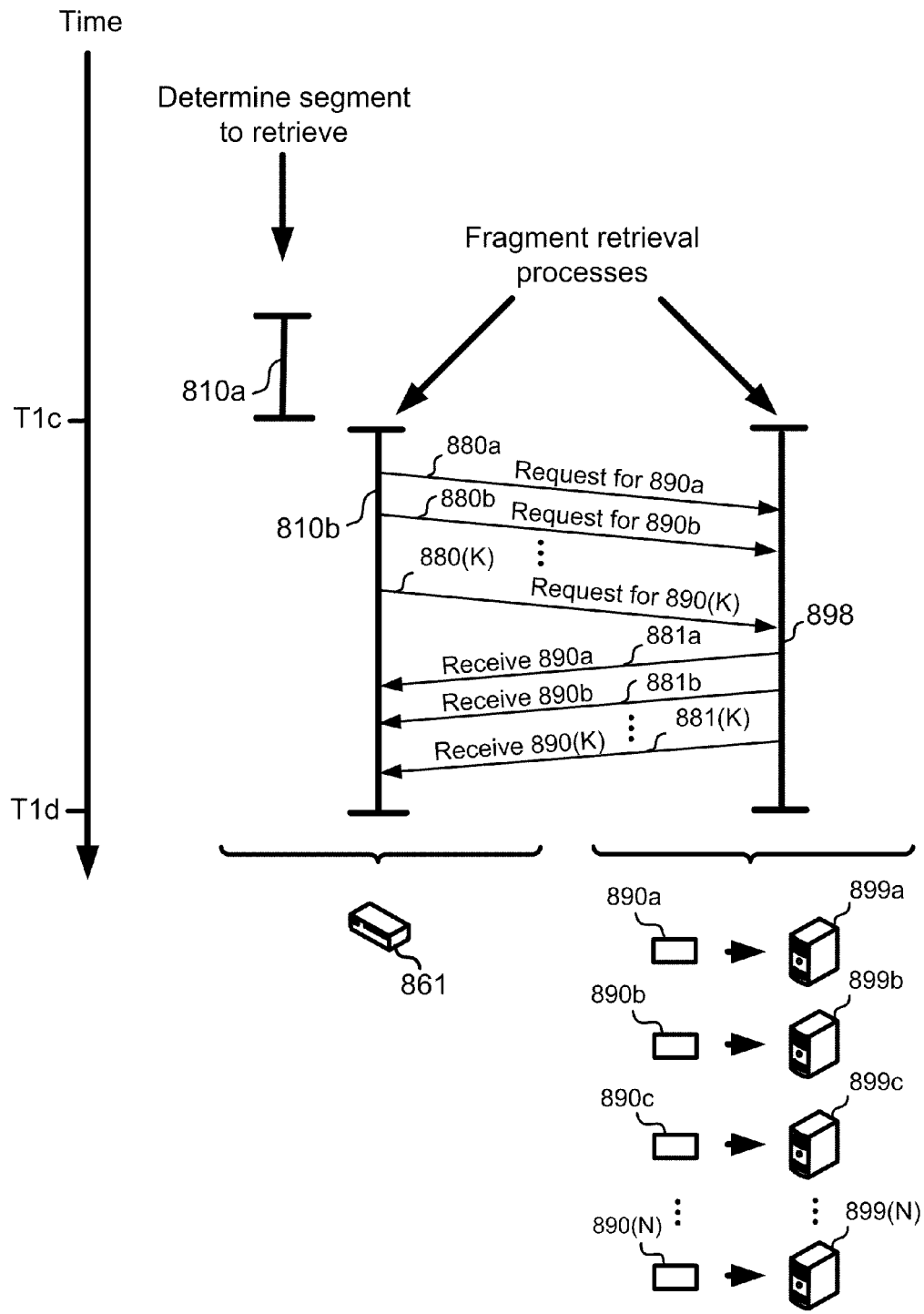
FIG. 34 illustrates one embodiment of a fragment pull protocol.

FIG. 34 illustrates one embodiment of a fragment pull protocol. Assembling device 861 (also represented by protocol diagram element 810*b*) obtains erasure-coded fragments from fractional-storage servers 899*a* to 899(N) (also represented by protocol diagram element 898), utilizing the following steps: (i) deciding 810*a* which segment to retrieve; (ii) device 861 sending requests to some of the fractional-storage servers for erasure-coded fragments associated with the desired segment. For example, requests 880*a* to 880(K) for erasure-coded fragments 890*a* to 890(K), from servers 899(*a*) to 899(K), correspondingly; and (iii) the servers respond by sending the requested erasure-coded fragments. For example, servers 899*a* to 899(K) send 881*a* to 881(K) erasure-coded fragments 890*a* to 890(K) to device 861. The fragment request and receipt process begins at T1*c* and ends at T1*d*. At time T1*d*, device 861 has enough erasure-coded fragments (K) to reconstruct the segment selected at 810*a*. In one embodiment, the process from T1*c* to T1*d* occurs in real time, in support of streaming content presentation.

The term "fragment pull protocol for high latency" as used herein denotes a protocol enabling an assembling device to request one or more fragments from one or more providing sources, wherein the time to transmit the one or more fragments in response to the assembling device request, through the slowest communication link connecting the responding source and the assembling device, is smaller than the round trip communication delay between the assembling device and the responding source, excluding the processing time of the providing source. For example, if the round trip communication delay between Israel and the USA is about 200 ms, the assembling device requests one fragment sized about 1500 bytes, and the slowest communication link is an ADSL line connecting the assembling device at 1.5 Mbps, then the time it takes to transmit the requested fragment through the slowest communication link is about 1500*8/1500000=8 ms, which is much smaller than the round trip delay. Many of the disclosed embodiments using fragment pull protocol may use fragment pull protocol for high latency for retrieving the fragments.

In one embodiment, more fragments than needed to reconstruct a segment are requested, such that the additional requested fragments approximately compensate for fragment failure conditions. If, statistically, F fragment requests are expected not to result in the reception of a fragment (i.e. fragment loss), out of a total number of K+F fragment requests (wherein K is the minimal number of fragments needed to reconstruct a segment), then it is possible to request K+F fragments instead of just K. In one embodiment, more than K+F fragments are requested, since the quantity of the received fragments is a statistical variable. In this case, K+F+S fragments are requested, wherein S is a safeguard amount of additional requests to assure that at least K fragments are received. In one embodiment, the fragment loss F changes over time, and the assembling device handles the change by increasing or decreasing the number of fragments requested per segment. In one embodiment, the assembling device may determine F based on previous fragment failure rates.

In one embodiment, requesting K+F+S fragments for a segment will almost always result in the reception of at least K fragments, and therefore the assembling device may request K+F+S without being concerned about which fragment has not arrived, and without trying to actively compensate for fragment failures by issuing additional fragment requests. In this case, the assembling device requests the fragments in an "open loop" fashion, meaning that it requests the K+F+S fragments, and moves on to another segment. In one embodiment, even when requesting K+F, or K+F+S fragments per segment, it is still possible not to receive the needed K fragments. Therefore, the assembling device may compensate for undelivered fragments by issuing additional fragment requests (a "closed loop" operation).

In one embodiment, the K+F, or K+F+S fragment requests are issued approximately in parallel, in order to achieve the fastest response possible for reconstructing a segment. In this case, the fragments start to arrive at the assembling device a short while after being requested, such that as soon as at least K out of the requested fragments arrive, the assembling device may immediately proceed with reconstructing the segment.

In one embodiment, an assembling device may aggregate several fragment requests into one message. The aggregated message is then sent to a fractional-storage server, possibly in a payload of a single packet, and optionally in order to conserve outgoing bandwidth and/or to reduce the number of packets needed to convey the requests. The fractional-storage server may then read the aggregated message and act accordingly by sending a plurality of fragment responses to the assembling device. The fragment responses may include one fragment at each payload, as is the case of responding to a single fragment request, or it may include an aggregated response including multiple fragments at each payload.

In one embodiment, multiple segments of content, which, in one example, is streaming content, are reconstructed by an assembling device retrieving multiple erasure-coded fragments associated with the multiple segments. Since a fragment request does not always result in a reception of the fragment, some requested fragments may fail to arrive at the assembling device. Therefore, the assembling device checks (from each of the segments for which fragments have already been requested) which requested fragments have failed to result in a correct reception of a fragment. For each such failure, the assembling device issues an additional request for a fragment. The additional requests are associated with segments for which fragments have already been requested before, and therefore, in one example, the resulting fragment retrieval process includes the following two sub-processes: a first sub-process of requesting fragments associated with new segments to be reconstructed, and a second sub-process of requesting additional fragments needed to complement already requested fragments, in order to reconstruct the segments. The first and second sub-processes work together, such that the second sub-process may complement fragments associated with a first segment, while the first sub-process runs ahead in an attempt to obtain fragments needed to reconstruct a second segment; wherein the second segment is located ahead of the first segment. The first and the second sub-processes can also be described as two different quantities of fragments being requested: a first quantity associated with the first sub-process requests, and a second quantity associated with the second sub-process requests.

In one embodiment, an assembling device may control the erasure-coded fragment reception throughput by controlling the rate of fragment request. For example, each of n fragments has a known size S1 to Sn. Therefore, issuing n requests over a period of T will result in an average fragment reception throughput of (S1+S2 . . . +Sn)/T. In one example, if each fragment is 1500 Bytes, and 64 fragment requests are issued over a period of 0.5 seconds, then the average expected fragment arrival throughput is (64×1500×8)/0.5=1.53 Mbps. The fragment requests do not need to be uniformly spread over the period of 0.5 seconds, although such a spread may result in a more stable throughput, which means that less communication buffering will be needed. Using the above-described rate-control technique may result in one or more of the following: retrieving the content at a target fragment reception throughput; preventing communication buffer spill at the last mile network resulting from uncontrolled fragment requests; and/or reducing fragment loss due to averaging the fragment traffic.

In one embodiment, an assembling device transmits aggregated messages to a relay server, including the number of fragments needed per certain segment, but without identifying the storage servers from which fragments are to be requested. The relay server selects the appropriate storage servers to which the fragment requests are to be transmitted, and transmits discrete or aggregated fragment requests, corresponding to the number of fragments requested by the assembling device, to the selected storage servers. The storage servers receive the fragment requests from the relay server, and transmit the requested fragment to the assembling device. The relay server may select the storage servers according to one or more criteria, as long as the selected storage servers store relevant fragments. Optionally, the relay server forwards the address of the assembling device to the selected storage servers, and/or adds the address of the assembling device to the fragment requests transmitted to the selected servers, in order to enable the storage servers to transmit the fragment response to the assembling device.

In one embodiment, shifting the process of selecting the storage servers from the assembling device to the relay server enables the design of a relatively thin and simple assembling device, having a relatively simple software, since all the assembling device has to decide in order to issue an aggregated fragment request to the relay server is how many fragments it needs per segment and, optionally, when it needs them.

In one embodiment, an assembling device transmits aggregated messages to a relay server, comprising general information regarding a portion of streaming content for which fragments are needed. Optionally, the portion of the streaming content comprises several consecutive segments. In one embodiment, the portion is defined by a starting point and an ending point within the streaming content, and the relay server uses these points to determine the actual segments comprising the portion. Then the relay generates and transmits the corresponding fragment requests to the relevant storage servers.

In one embodiment, an assembling device operating trick play modes needs to obtain new erasure-coded fragments within a short period, to replace lost erasure-coded fragments. Therefore, the new fragments are retrieved from one or more nearby fractional-storage servers having low latency responses to the assembling device. The nearby fractional-storage servers should have sufficient bandwidth to supply the new fragments needed for the trick play, but because most of the fragments are not obtained from the nearby servers, these nearby servers may have relatively low bandwidth and may store relatively small portions of the information.

In one example, a distant server/s stores approximately all erasure-coded fragments needed to reconstruct segments by an assembling device. The assembling device attempts to obtain enough of the fragments to reconstruct segments. However, due to fragment loss conditions optionally resulting from the distance that the fragments need to traverse from the server/s to the assembling device, only about 97% of transmitted fragments actually reach the assembling device. The assembling device therefore needs to supplement the lost fragments with additional fragments needed to reconstruct the segments. Therefore, the assembling device requests an additional amount of fragments equal to about 3% of the total fragments sent by the distant server/s, from a nearby fractional-storage server. The additional fragments are quickly received from the nearby server, and most likely without any fragment loss, due to the proximity of the nearby server. The nearby server needs to store only a small fraction of the fragments per segments of content, since it is required to supplement only a small portion of lost fragments, which corresponds in percentage to the fragment loss ratio. With 3% fragment loss condition, the nearby server can store only about 3% of the fragments per segments of content, such that if 200 fragments are needed to reconstruct a segment, the nearby server can store only 6 or 7 fragments per segment. Moreover, the nearby server can supplement the small fraction of the fragments with a relatively low bandwidth communication link. For example, for a 1 Mbps fragment throughput sent by the distant server, the nearby server needs only 3%, or 30 Kbps, in order to supplement the missing fragments.

In one embodiment, the nearby fractional-storage server may store more fragments than needed just for fragment loss compensation. In one example, the nearby server stores 30% of the fragments needed for segment reconstruction. This may improve response times, reduce some of the backbone traffic, and provide a better protection against different types of network failures.

In one embodiment, only certain sections of the contents support trick play and a significant portion of the erasure-coded fragments stored on the nearby fractional-storage servers are associated with these particular sections. This embodiment reduces the storage requirements, and, optionally, also the bandwidth requirements, from the nearby fractional-storage servers. In one example, only 10% of the segments support trick play operation, meaning that the assembling device can start a content presentation from only 10% of the content's segments. In this case, and still assuming a 3% fragment loss condition from the distant server/s, the nearby fractional-storage server can store only 10%×3%=0.3% of the content's fragments. It is also estimated that in this case the nearby server's bandwidth requirements will be lowered as well.

Figure 35:
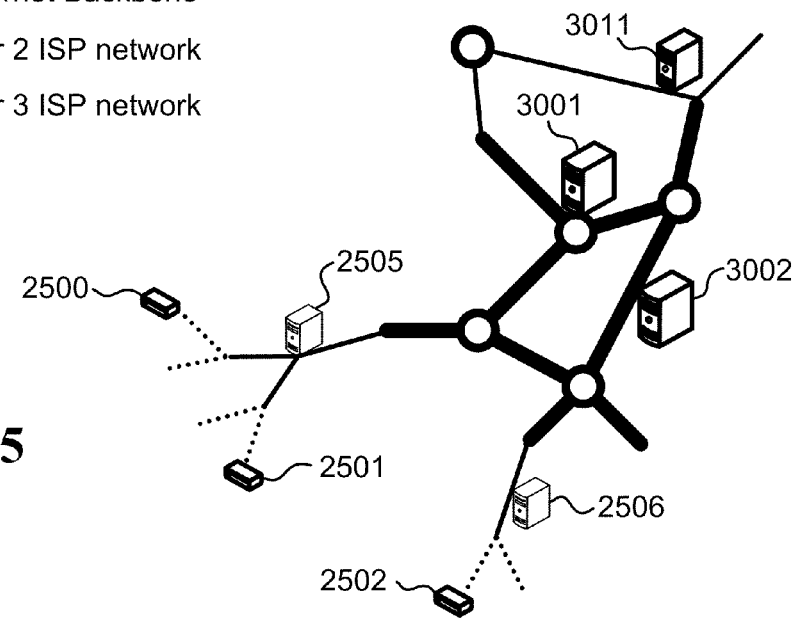
FIG. 35 illustrates CDN servers located on the Internet backbone, supported by fractional-storage CDN servers located on edges of the Internet.

FIG. 35 illustrates one embodiment of CDN servers 3001, 3002, and 3011—which may be fractional-storage or may store full replicas—located close to or on the Internet backbone, supported by fractional-storage CDN servers 2505, 2506 located on edges of the Internet. The assembling devices attempt to obtain the required erasure-coded fragments from CDN servers 3001, 3002, and 3011, which may have high latency relative to the servers on the edge. Upon a fragment loss, the assembling devices pull a substitute erasure-coded fragment from the nearby fractional-storage CDN server, which has low latency. For example, assembling devices 2500 and 2501 pull substitute erasure-coded fragment from fractional-storage CDN server 2505, and assembling device 2502 pulls from server 2506. Because the nearby fractional-storage CDN servers 2505 and 2506 are approached mainly after a fragment loss (or other predefined occasions), servers 2505 and 2506 may have a much smaller storage and bandwidth relative to the total content consumed by the assembling devices 2500, 2501, and 2502.

Figure 36:
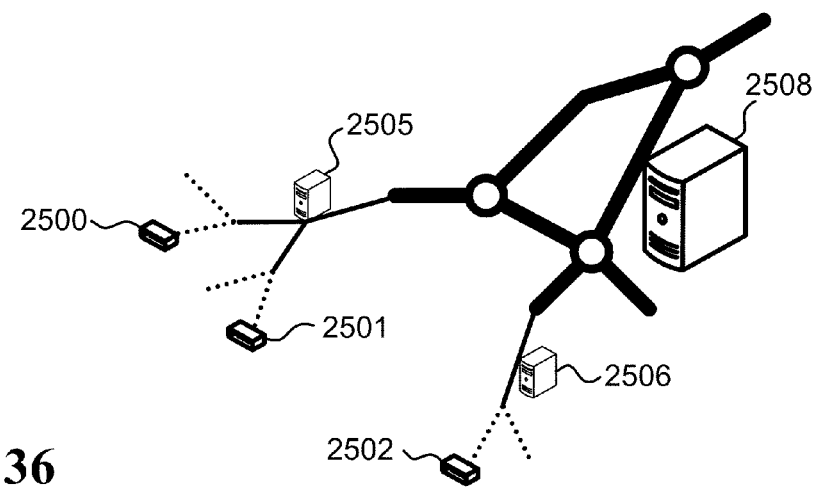
FIG. 36 illustrates a content delivery center located on the Internet backbone, supported by fractional-storage CDN servers located on edges of the Internet.

FIG. 36 illustrates one embodiment of a content delivery center 2508 housing from ten to thousands of servers located close to or on the Internet backbone, supported by fractional-storage CDN servers 2505, 2506 located on edges of the Internet. Using push or pull protocols, the assembling devices attempt to obtain the required erasure-coded fragments from the content delivery center 2508, which may have high latency relative to the servers on the edge. Upon a fragment loss, the assembling devices pull a substitute erasure-coded fragment from the nearby fractional-storage CDN server, which has low latency. In this embodiment, fragment loss may include a fragment that was not received, a fragment received after a predefined duration, or an erred fragment.

In one embodiment, erasure-coded stream is received by an assembling device from one or more distant servers featuring high latency, which may be susceptible to frequent fragment loss. In order to avoid requesting retransmissions and avoid requesting extra fragments to compensate for the fragment loss, especially while using trick play, the assembling device stores a partial buffer of erasure-coded fragments, which, in one example is used to compensate for the fragment loss. Optionally, the erasure-coded fragments of the partial buffer are distributed to the assembling device before it requests the content. Optionally, the erasure-coded fragments of the partial buffer are added to a stream transmitted to the assembling device, in order to reduce the time needed to perform a future trick play request.

Figure 37:
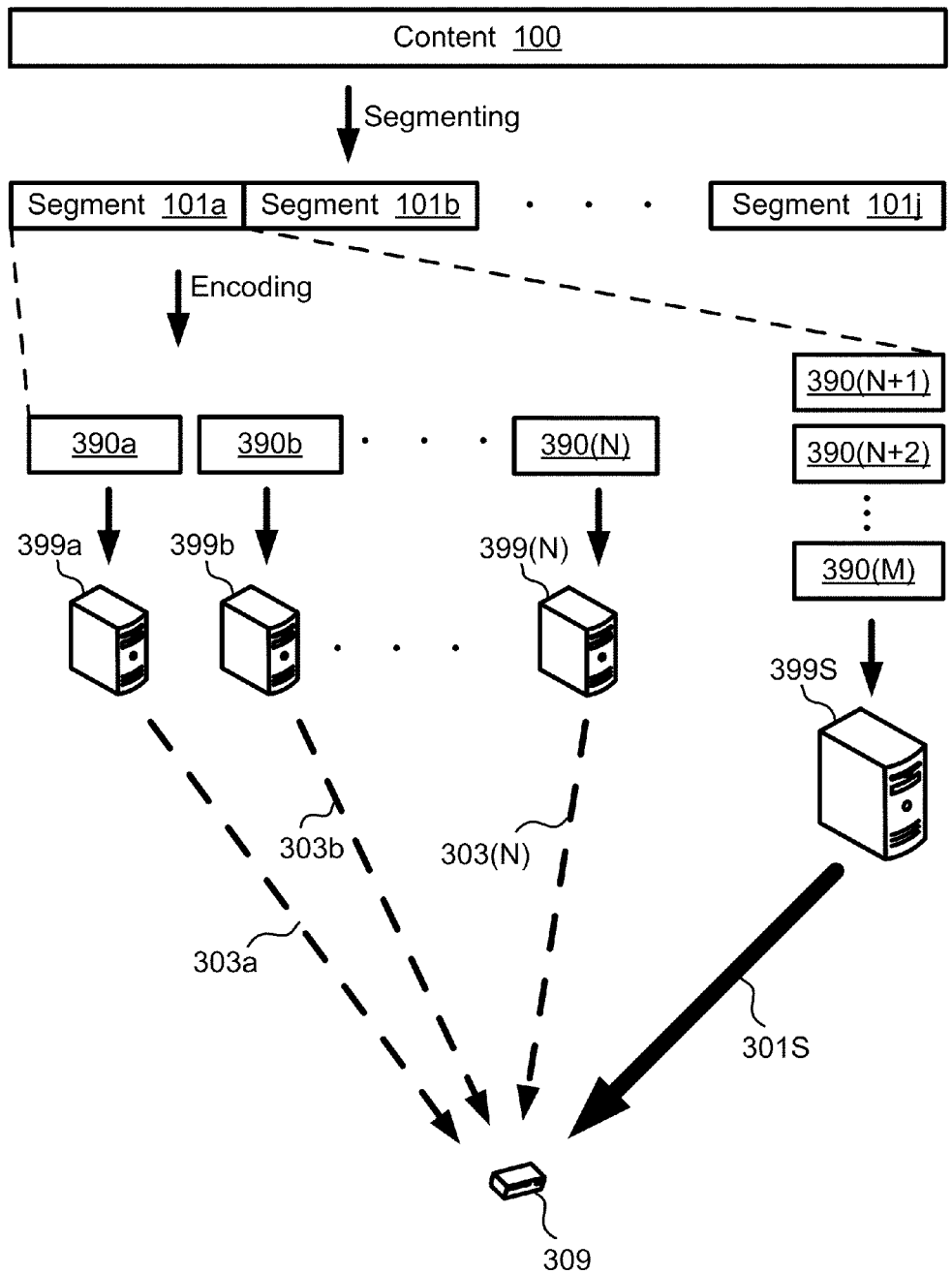
FIG. 37 illustrates operation of hybrid pull and push protocols.

FIG. 37 illustrates one embodiment, wherein segment 101a of content 100 is encoded into erasure-coded fragments 390a to 390(M), such that any sufficient subset of the fragments can be used to reconstruct segment 101a. Fragments 390a to 390(N) are stored in fractional-storage servers 399a to 399(N) respectively, and fragments 390(N+1) to 390(M) are stored in streaming server 399S. In one example, fragments 390(N+1) to 390(M) form a group of fragments which are sufficient to reconstruct segment 101a. Subsequent segments 101b to 101j of content 100 may be similarly encoded into additional fragments stored on the servers (not illustrated). Assembling device 309 uses two different protocols approximately simultaneously to retrieve fragments for segment reconstruction: (i) a push protocol, and (ii) a fragment pull protocol. The push protocol 301S is used to deliver fragments 390(N+1) to 390(M) to assembling device 309. The push protocol may be RTP based or TCP-connection based, or any other type of transmission that does not require assembling device 309 to explicitly ask for each of fragments 390(N+1) to 390(M). In one example, fragments 390(N+1) to 390(M) are delivered to the assembling device using a single RTP stream 301S, such that upon reception of the fragments from the stream, the assembling device can immediately reconstruct segment 101a. The fragment pull protocol is used by the assembling device to retrieve additional fragments that may be needed to reconstruct segment 101a if one or more fragments out of fragments 390(N+1) to 390(M) fail to reach the assembling device. In one example, fragment 390(N+2) fails to reach the assembling device due to Internet packet loss conditions (referred to as fragment loss). The assembling device, after concluding that fragment 390(N+2) is missing, uses a fragment pull protocol to retrieve a substitute fragment out of one of the fractional-storage servers 390a to 390(N), and uses this fragment to complete the reconstruction of the segment 101a (any one of fragments 390a to 390(N) will do). For example, the assembling device chooses fragment 390a as the one additional fragment, by requesting and receiving it 303a from server 399a, using a fragment pull protocol. If more fragments out of fragments 390(N+1) to 390(M) fail to reach the assembling device 309, it may compensate by pulling substitute fragments from some or all of servers 399a to 399(N), illustrated as fragment pull protocol requests and responses 303a to 303(N)).

In one embodiment, the fragment pull protocol requests for additional needed fragments are not made to fractional-storage servers 399a to 399(N), but are rather made to server 399S. In this case, the assembling device asks server 399S to retransmit the fragment which has failed to arrive. In this embodiment, only fragments that fail to reach the assembling device via the push transmission 301S cause an added communication overhead in the form of explicit fragment pull protocol requests, such that if no fragments are actually lost over transmission 301S, there is no need for fragment pull requests 303a to 303(N).

In some embodiments, the push protocol is implemented using one or more sub-transmissions. Optionally, a push protocol transmission is implemented using multiple sub-transmissions, each transporting a fraction of the fragments transmitted by the push protocol transmission. A sub-transmission may be transported using an IP stream such as RTP, an HTTPS session, or any other form of transporting a sequence of fragments between a source server and a destination assembling device.

In one example (not illustrated), the storage gain equals one and if one fragment fails to arrive, the assembling device has to access the specific server storing the specific fragment, and request the specific fragment via a pull protocol. The push transmissions 301d to 301f may be synchronous (such as all servers sending the fragments of each segment approximately at the same time), or may be asynchronous. In the latter case, the arrival of different fragments associated with a specific segment at the assembling device side may be spread over a long period. This may occur, as an example, when some push servers are faster than others are. In this case, the assembling device aggregates whatever fragments it can before presentation time of each segment, and then supplements fragments using pull retrieval processes. A server that does not send fragments fast enough, and therefore approximately always causes supplemental requests, can be asked to stop the push-transmission. Another server may be asked by the assembling device to replace the slow server by initiating a new push-transmission.

In one embodiment, the push-transmissions carry more fragments than needed for segment reconstruction. In one embodiment, the push transmissions carry fewer fragments than needed for segment reconstruction, and the remaining fragments are pulled by the assembling device.

In one embodiment, an assembling device starts retrieving fragments using only fragment pull protocol processes, and then, when concluding that a specific server is responsive enough, instructs it to start sending a push-transmission for the remaining segments. In this case, the assembling device may start with pure pull-protocol based fragment retrieval, and gradually switch to push-protocol transmissions, up to the point that approximately all fragments are delivered using push-transmissions, and using the pull requests only as a means to overcome failure of obtaining specific fragments by the assembling device. In one embodiment, the fragment pull protocol and the push protocol are used interchangeably to obtain enough fragments to reconstruct segments. In one embodiment, the assembling device may start to obtain fragments using a push protocol and then switch to a fragment pull protocol. In one embodiment, the assembling device may use both fragment pull protocol and push protocol to obtain fragments at the same time, wherein the assembling device may change the ratio Fpull/Fpush on-the-fly to any value between zero and infinity, where Fpull denotes the number of fragments associated with a certain segment that are obtained using a fragment pull protocol, and Fpush denotes the number of fragments associated with the certain segment that are obtained using a push protocol.

In one embodiment, the assembling device uses a fragment pull protocol to start obtaining fragments needed to reconstruct at least one segment needed for fast-start playing of content, and then switches to a push protocol if and when possible. In this case, the fragment pull protocol provides a fast response from servers, allow minimization of the time between a user's request and corresponding content playing. In one example, at least one segment needed for the fast-start playing comprises enough data to enable continuous presentation of the streaming content, at least up to when a first fragment is obtained using the push protocol. In one example, the assembling device obtains the fragments associated with the at least one segment approximately as fast as the bandwidth available to the assembling device allows, and then plays the content approximately as soon as enough segments, out of the at least one segment, are reconstructed to allow doing so.

In the claims, sentences such as "wherein the assembling device is configured to use a fragment pull protocol to obtain the fragments" and "wherein the assembling device is configured to use sub-transmissions to obtain the fragments" are to be interpreted as open claim language. Therefore, an assembling device configured to use a fragment pull protocol to obtain fragments may also obtain fragments using sub-transmissions, and vice-versa.

Referring again to FIG. 7 with device 6610 as a non-assembling CPE, such as a STB, PC or gaming console, capable of performing standard request, reception, and decoding of video over IP network. In one embodiment, server 661s—also referred to as proxy server, assembling server, and in some cases assembling device—performs three primary functions: (i) receipt of content requests from non-assembling client device 661o; (ii) assembly of content, as requested by client 661o, from the fractional-storage servers and optionally from the bandwidth amplification devices; (iii) optionally, conversion of the assembled content into a streaming format; and (iv) transmission of the streaming content to the requesting client 661o. Client 6610 can then store the content, or present it. In one embodiment, the assembled content is a general web content, including HTML, FLASH or any other data format that can be found in a web-based site.

In one embodiment, although server 661s is illustrated as being connected to network 300 on one side and to network 300n on the other, server 661s may also be connected to another network element, such as a router, which makes the topological connection between networks 300 and 300n. In that case, server 661s communicates with both networks 300 and 300n via the other network element.

Figure 38:
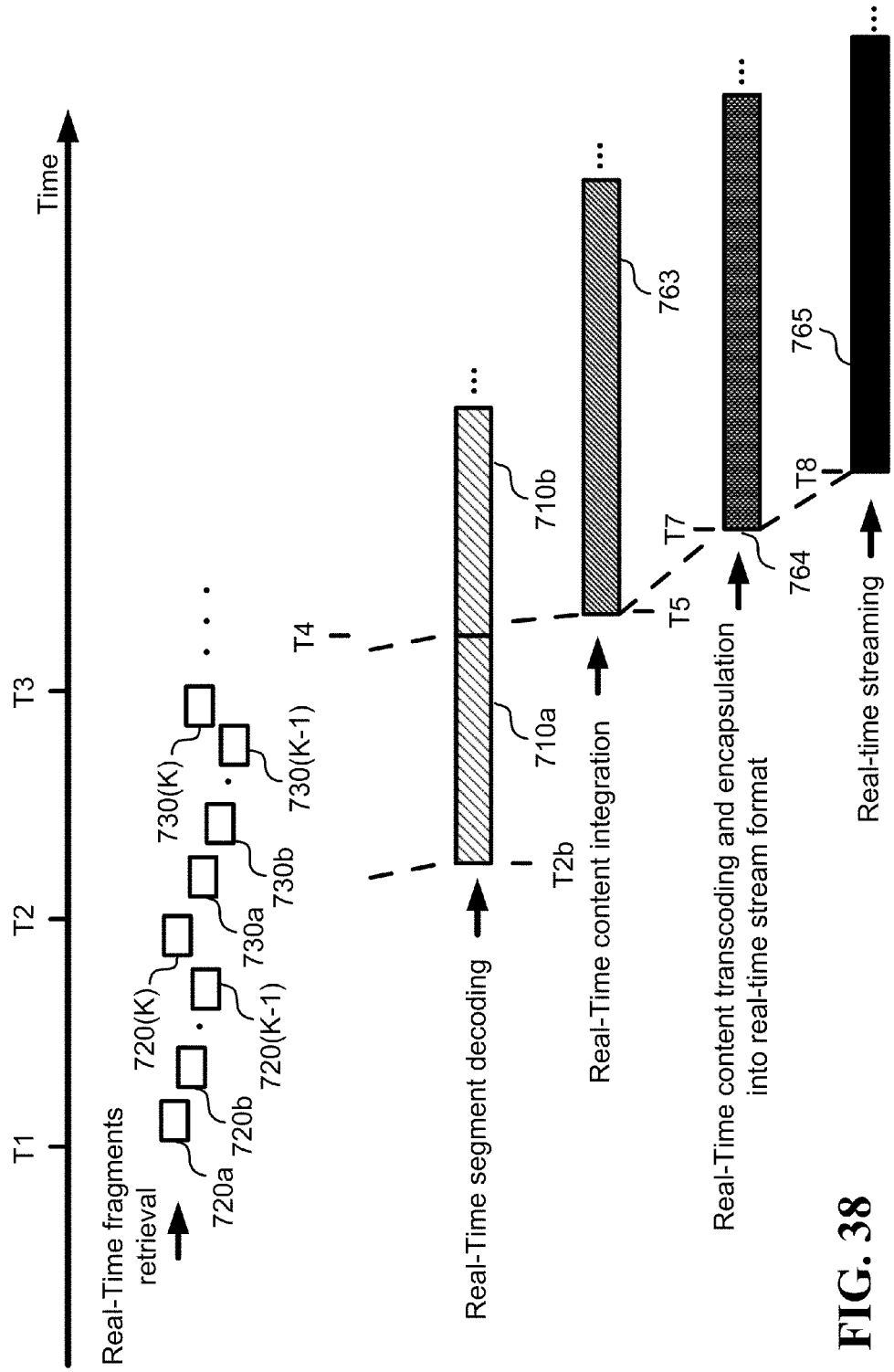
FIG. 38 illustrates assembling content utilizing a proxy server.

FIG. 38 illustrates one embodiment of assembling content utilizing a proxy server. The client 6610 requests a specific content from server 661s (both illustrated in FIG. 7). Server 661s then initiates a real time process of obtaining erasure-coded fragments 720a to 720(K) at time T1 and subsequent erasure-coded fragments 730a to 730(K) at time T2. Server 661s then decodes the erasure-coded fragments into segments 710a, 710b at time T2b and T4. The segments are then integrated into the original requested content 763 at time T5. Optionally, the integrated content 763 is made available to the next processes in real time, such that it aggregates segments at an average rate no lower than the rate of segment presentation, in order to keep the entire process in real time. Meaning that since T5, the content is available for continuous on-the-fly presentation, up to the end of the content being assembled. In one embodiment, fragments 720a to 720(K) and 730a to 730(K) are retrieved using a fragment pull protocol. In another embodiment, fragments 720a to 720(K) and 730a to 730(K) are obtained using a push protocol, wherein multiple sub-transmissions may be used to deliver the fragment sequences to server 661s.

Optionally, at time T7, server 661s starts a process 764 of transcoding content 763, optionally into a suitable format supported by the client 661o, and then encapsulating the result into a streaming format to be delivered to client 661o. This is done in real time, such that since T7, the content is ready to be streamed continuously up to the end of the content. Then, at time T8, content 764 is streamed 765 to client 661o.

In one embodiment, server 661s is co-located with a Broadband Remote Access Server (BRAS). In one embodiment, server 661s is located in a Central Office ("CO") or in an Internet Exchange Point ("IX/IXP"). In one embodiment, server 661s is: one of servers 399a to 399(N), all or some of servers 399a to 399(N) operating in the mode of server 661s, an IP aggregation network, a last mile network, part of network 300, and/or a private network. In one embodiment, network 300n is an ISP network. In one embodiment, network 300 belongs to one Internet backbone provider, and network 300n belongs to a second Internet backbone provider.

In one embodiment, some or all of clients 610aa are connected to network 300n, and not to network 300. In one embodiment, client 6610 requests and controls content interaction with server 661s using standard RTCP. In one embodiment, server 661s streams 765 content 764 to client 6610 using standard RTP/RTSP. In one embodiment, server 661s progressively downloads 765 content 764 to client 6610 using FLASH over TCP/IP.

Figure 39:
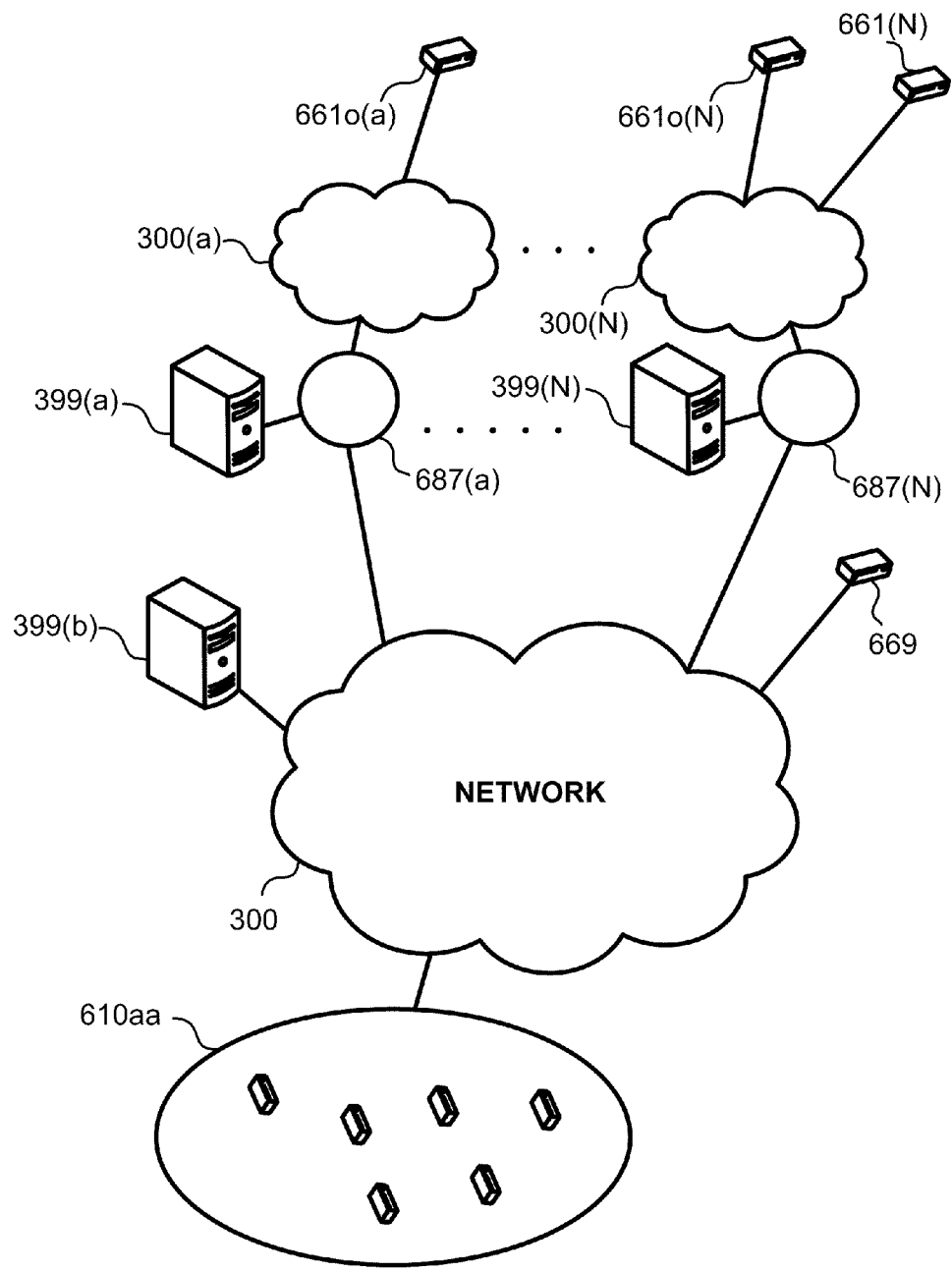
FIG. 39 illustrates assembling content utilizing a proxy server.

FIG. 39 illustrates one embodiment similar to the description of FIG. 7 and FIG. 38, with the following emphasis and differences: (i) the fractional-storage servers 399(a) to 399 (N) are mostly connected to network locations 687(a) to 687(N). These network locations are connected to the Internet 300 on one side, and to operator's last mile networks 300(a) to 300(N) on the other. Examples of such locations include Central Offices, the location of a BRAS, the location of the last router that spans the last-mile aggregation network, the location at which the ISP is paying transit fees for data going/coming from the Internet on one side and is paying last-mile fees for data going/coming from the aggregation networks belonging to local Cable/Telco/PON/Wireless operators on the other side. (ii) Non-assembling clients 661o(a) to 661o (N) receive content services from the fractional-storage servers (each one optionally from the corresponding server connected to the corresponding aggregation network). As an example, non-assembling client 661o(a) receives standard content streams from server 399(a). The content for the non-assembling clients is assembled by the servers, such that each server is both a content assembler and content server (in one embodiment, these two functions can be separated into two different servers. In that case, the assembling part may also stream to the non-assembling clients). (iii) Optionally, some of the fractional-storage servers 399(b) do not necessarily function as assemblers and streamers, and just function as erasure-coded fragment suppliers. These servers are not necessarily connected to locations 687(a) to 687(N). (iv) Assembling devices 661(N) and 669 do not have to use the assembling and streaming services of servers connected to locations 687(a) to 687(N) because they are able to assemble the content, with direct access to the fractional-storage servers 399 (a) to 399(N). The non-assembling client and the assembling devices may all operate at the same time.

Still referring to FIG. 39, in one embodiment, the operator of the fractional-storage servers pays only transit fees for data moving between elements of the fractional-storage system (in use by servers that assemble content for non-assembling clients) and transit fees for data moving between the servers and the assembling devices. No Internet transit fees are paid for streaming data moving from servers to non-assembling clients, since this traffic is contained within networks 661o(a) to 661(N), which belong to local operators, and not to Internet transit providers.

In one embodiment, a CDN is created by the aggregated bandwidth and storage capacity of the participating erasure-coded fractional-storage servers. In one example, a large scale CDN includes several hundreds or thousands of fractional-storage servers connected to the Internet. These servers send erasure-coded fragments to a large number, potentially millions, of assembling devices. In order to keep costs low for sending a large number of fragments from fractional-storage servers to assembling devices, the servers are located on the Internet backbone, or close to it.

The current Internet backbone primarily comprises different Tier one ISP (or other) networks that interconnect at various Internet Exchange Points (IX or IXP), using peering agreements. Tier one ISPs, or other backbone-forming network entities, can reach any portion of the Internet via other Tier one ISPs or other backbone-forming networks, without paying any Internet transit fee, and solely by utilizing mutual peering agreements. In order to gain access to large amounts of inexpensive bandwidth, the fractional-storage servers are typically located on the Internet backbone. This means that the servers are either co-located (and connected) with a core switching router that interconnects the Internet backbone networks at an IXP, or, alternatively, co-located (and connected) with a router which is part of the backbone network, typically located at a data center or co-location center. Fractional-storage servers can also be located close to the Internet backbone, which means that they are co-located (and connected) with a router which is part of a Tier two ISP network, which has a high bandwidth connection with at least one Tier one operator, to which it pays transit fees in order to potentially reach all portions of the Internet. FIG. 40 illustrates one example of a fractional-storage server 3001, which is one of a plurality of servers forming a large-scale CDN, located on the Internet backbone by being connected to the Internet backbone via IXP 3091. In a second example, fractional-storage server 3002 is located on the Internet backbone by being connected to a Tier one backbone network 3080. In a third example, fractional-storage server 3011 is located close to the Internet backbone by being connected to a Tier two ISP network 3070, which is connected to the backbone via Tier one ISP network 3081. In one embodiment, a typical fractional-storage server is located on the backbone or close to the backbone by being attached to a switching router via a high bandwidth port, such as a 1 Gbps, 10 Gbps, or a higher bandwidth port, such as high-speed Ethernet port, usually carried over a fiber, or suitable short-distance copper lines. In one embodiment, in a typical deployment using high bandwidth connections (in 2009 terms), each of about 1,000 fractional-storage servers is located on the backbone or close to the backbone and is connected to the backbone via a dedicated (guaranteed bandwidth) 1 Gbps Ethernet port, resulting in an aggregated throughput of 1,000 Gbps, which can serve about one million subscribers of standard definition streaming video, such as client device 3020, simultaneously. Such aggregated bandwidths would have required a substantially larger number of fractional-storage servers, had they been connected to other locations in the Internet, such as at edges of the Internet (close to last mile networks), Tier 3 ISPs, or at the user premises. Moreover, in some embodiments, the cost of streaming the mentioned 1,000 Gbps when the fractional-storage servers are located on the Internet backbone, or close to the Internet backbone, is expected to be significantly lower than what is expected when the servers are located elsewhere as mentioned before.

FIG. 41 illustrates one example where an assembling server 4020 is located at the juncture 4010 between two networks: the first network is an ISP transit network 4014 that connects the juncture to the Internet and provides Internet transit via a switching router 4015, and the second is a last mile network 4041 that connects end users 4051 to the Internet via a switch 4031 (located, for example, inside a Central Office, a Head-End, or a street-level cabinet). In one embodiment, the juncture 4010 is a network operated by a local ISP that pays transit fees for Internet traffic passing through the transit network 4014, and last mile fees for traffic passing through the last mile network 4041. A unique property of the juncture 4010 is that it is possible for an assembling server 4020 located at the juncture to receive erasure-coded fragments sent by fractional-storage servers, such as 4001 and 4002, to assemble content, and to stream the content to a client 4051 via the last mile network 4041, without incurring any additional costs in comparison to other scenarios, such as where Internet packets flow from the Internet backbone to a Tier two ISP network to the Internet backbone and to the last mile network. In other words, since the assembling server 4020 is located at the juncture, it does not create any extra traffic via networks 4014 and 4041. The assembling server can also be located at or close to an edge of the Internet, which may include the juncture, or a point above server 4015, such as at the transit network 4014 connecting the juncture to the Internet. When located at or close to an edge of the Internet, the assembling server has the potential not to incur additional transit fees as a result of the relaying operation, since approximately the same traffic would have to pass via the same transit network in a normal scenario. Another beneficial location for the assembling server is at the home premises, since, clearly, a relaying operation performed there does not add any significant traffic to higher levels of the network. In contrast to the above-suggested locations, in some cases an assembling server may be located at an arbitrary point on the backbone, or at other high-level points of the Internet, where it incurs additional transit fees, as fragments assembled by the server flow once over an Internet transit network going from a fractional-storage server to the assembling server, and then a second time when streamed by the assembling server to a destination client over an Internet transit network.

In one embodiment, an assembling server communicates with a plurality of fractional-storage servers via the Internet on one hand, and with a client device on the other hand. The fractional-storage servers store erasure-coded fragments associated with several contents, such that each content can be completely reconstructed by assembling enough fragments. The assembling server may quickly reconstruct one of the contents, such that from the time it is knows which content to reconstruct, it takes the assembling server no more than several seconds to retrieve enough fragments and reconstruct the specific content. In one example, the assembling server is connected to the Internet via a guaranteed 10 Gbps line, such that it can completely retrieve a 1 GByte standard-definition movie file in approximately 1 [GByte]×8 [bits per byte]/10 [Gbps]=0.8 seconds, plus at most 0.3 seconds communication latency=1.2 seconds. In this example, the assembling server communicates approximately in parallel with 1,000 fractional-storage servers (out of a possible several thousands), possibly using a pull protocol or using a push protocol (optionally implemented by multiple sub-transmissions), such that each of the selected 1,000 servers sends a unique 1 MBytes erasure-coded fragment to the assembling server. The entire reconstructed content occupies one segment, and the fractional-storage server needs to send only one erasure-coded fragment to the assembling server. Other configurations in which the content is segmented into multiple segments, and/or in which the 1 MBytes erasure-coded fragment includes many fragments are also possible. After quickly reconstructing the content, the assembling server may stream the 1 GByte content to a requesting client having approximately a 1 Mbps download link over a period of two hours. In the described embodiment, the assembling server quickly obtains a large file stored as multiple erasure-coded fragments over multiple fractional-storage servers, and, potentially, slowly transmits the reconstructed file to a client via a much slower connection than the connection used for assembling the content. In one embodiment, the client requests a file from the assembling server, the assembling server quickly obtains the requested file from fractional-storage servers, and briefly following the client's request (optionally a matter of seconds), starts streaming the newly obtained file to the requesting client. It is noted that the assembling server need not store the requested file internally, as it can quickly fetch it (or part/s of it) when needed. In the above example, the 1,000 fractional-storage servers share the bandwidth load of providing the requested file, such that each fractional-server sends a fragment, or several fragments, to the assembling server at a rate of approximately 10 [Gbps]/1,000 [servers]=10 Mbps. The fractional-storage servers, as mentioned in the last example, may serve multiple assembling servers in parallel, each requiring a 10 Mbps bandwidth. In one example, the fractional-storage servers are fractional-storage CDN servers located close to or on the Internet backbone, each servicing dozens of assembling servers in parallel. The placement of the CDN servers close to or on the Internet backbone provides low cost and high bandwidth Internet transit.

In one embodiment, a distributed system is located in a few to dozens of data centers (also known as server farm or datacenter), located close to or on the Internet backbone, together housing at least 100 fractional-storage CDN servers. The servers store erasure-coded fragments associated with approximately sequential segments of streaming contents, with a storage gain of at least 5, and transmit the stored fragments on demand to assembling devices approximately according to the sequential order of the segments. In many cases, the data centers provide a convenient place to place the CDN servers close to or on the Internet backbone. A data center can be also a collocation center, or an Internet Exchange Point. In one example, a single data center can house many fractional-storage CDN servers.

In one example, a streaming system comprising at least several hundreds of fractional-storage CDN servers located close to or on the Internet backbone, storing erasure-coded fragments encoded with a redundancy factor greater than one, and associated with approximately sequential segments of streaming contents. At least 100,000 assembling devices concurrently obtain fragments from the CDN servers, wherein the system achieves efficient load balancing and fault tolerance between the various CDN servers by determining for each of the assembling devices from which servers to obtain the fragments.

In one example, a system comprising at least 1,000 fractional-storage CDN servers is connected to the public Internet. The servers store erasure-coded fragments associated with approximately sequential segments of streaming contents, with a storage gain greater than 5, and transmit the stored fragments on demand to assembling devices approximately according to the sequential order of the segments. Wherein the aggregated bandwidth utilized by the servers for transmitting the fragments to the assembling devices exceeds 1 Giga bit per second times the number of the CDN servers. In one optional example, the system comprises at least 10,000 fractional-storage CDN servers and the aggregated bandwidth utilized by the servers exceeds 10 Giga bit per second times the number of the CDN servers.

In one embodiment, the fractional-storage system is approximately insensitive to the mixture of the consumed contents as long as the aggregated throughput is below the total throughput of the fractional-storage servers.

Figure 42:
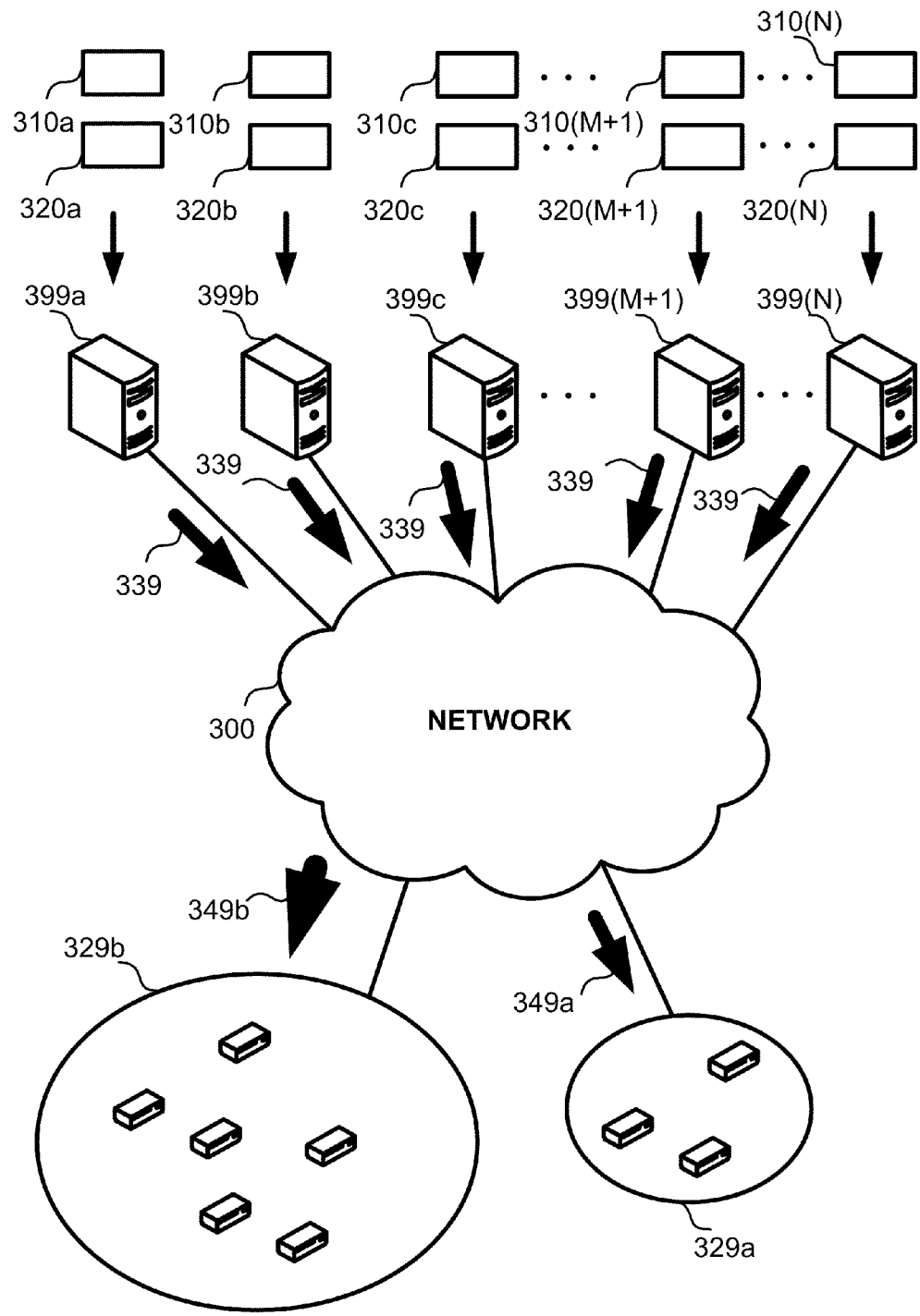
FIG. 42 to FIG. 44 illustrate changes in content consumption.

FIG. 42 illustrates one example of a server array, including N fractional-storage servers (399a to 399(N)), and storing content A, which includes erasure-coded fragments 310a to 310(N), and content B, which includes erasure-coded fragments 320a to 320(N). Each server is connected to the network 300 with a fragment delivery bandwidth capability B 339. Therefore, the N servers have an aggregated bandwidth of B×N. A first group of assembling devices 329a consumes content A at an average bandwidth Ba 349a. A second group of assembling devices 329b consumes content B at an average bandwidth Bb 349b. Since all of the servers participate in the transmission of the two contents, the first and second groups can potentially consume all server bandwidth, up to the limit where Ba+Bb=N×B, with any ratio of demand between the first and second contents, and with no special provisions to be made when storing the erasure-coded fragments related to the two contents in the fractional-storage server array.

Figure 43:
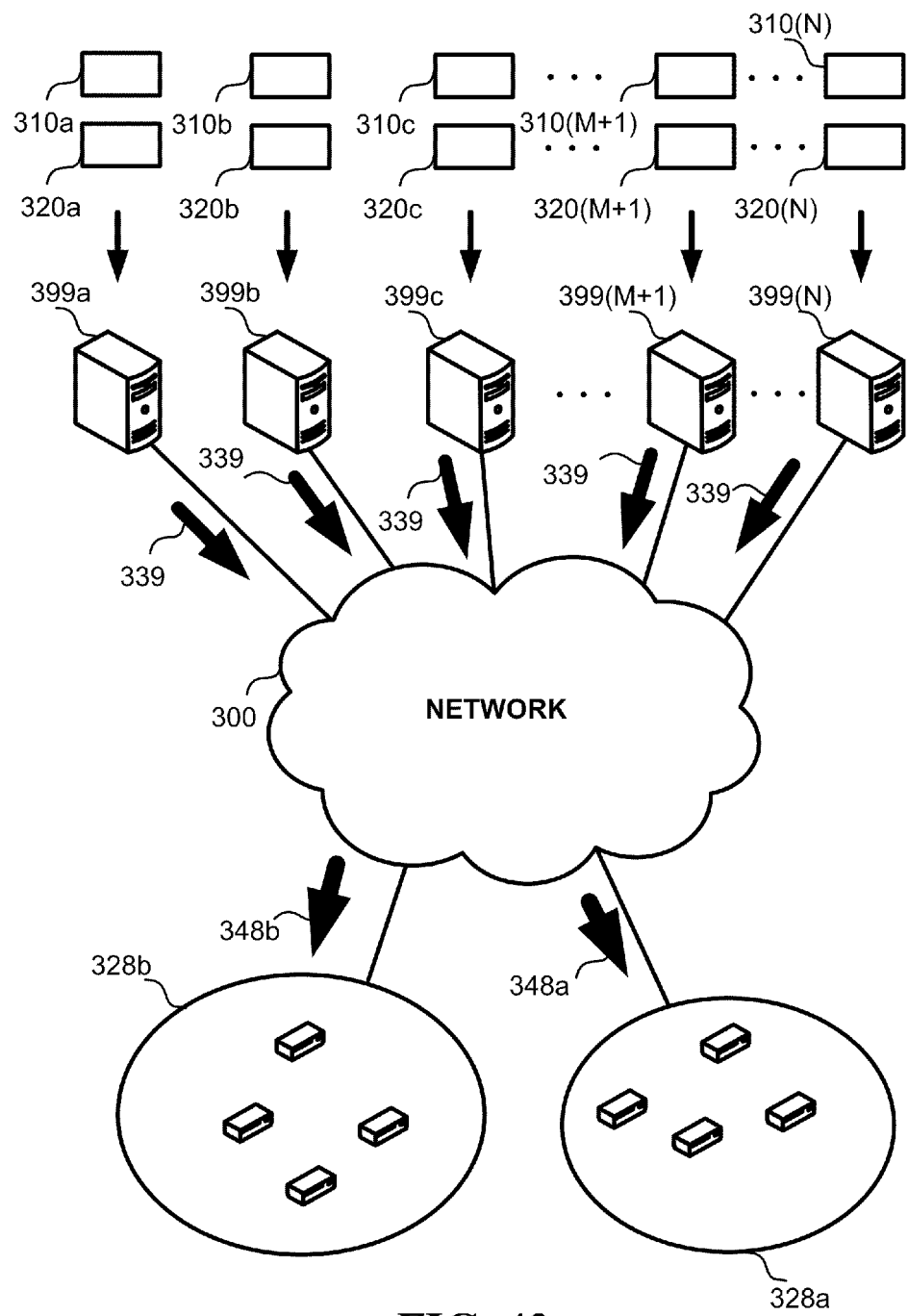
Figure 44:
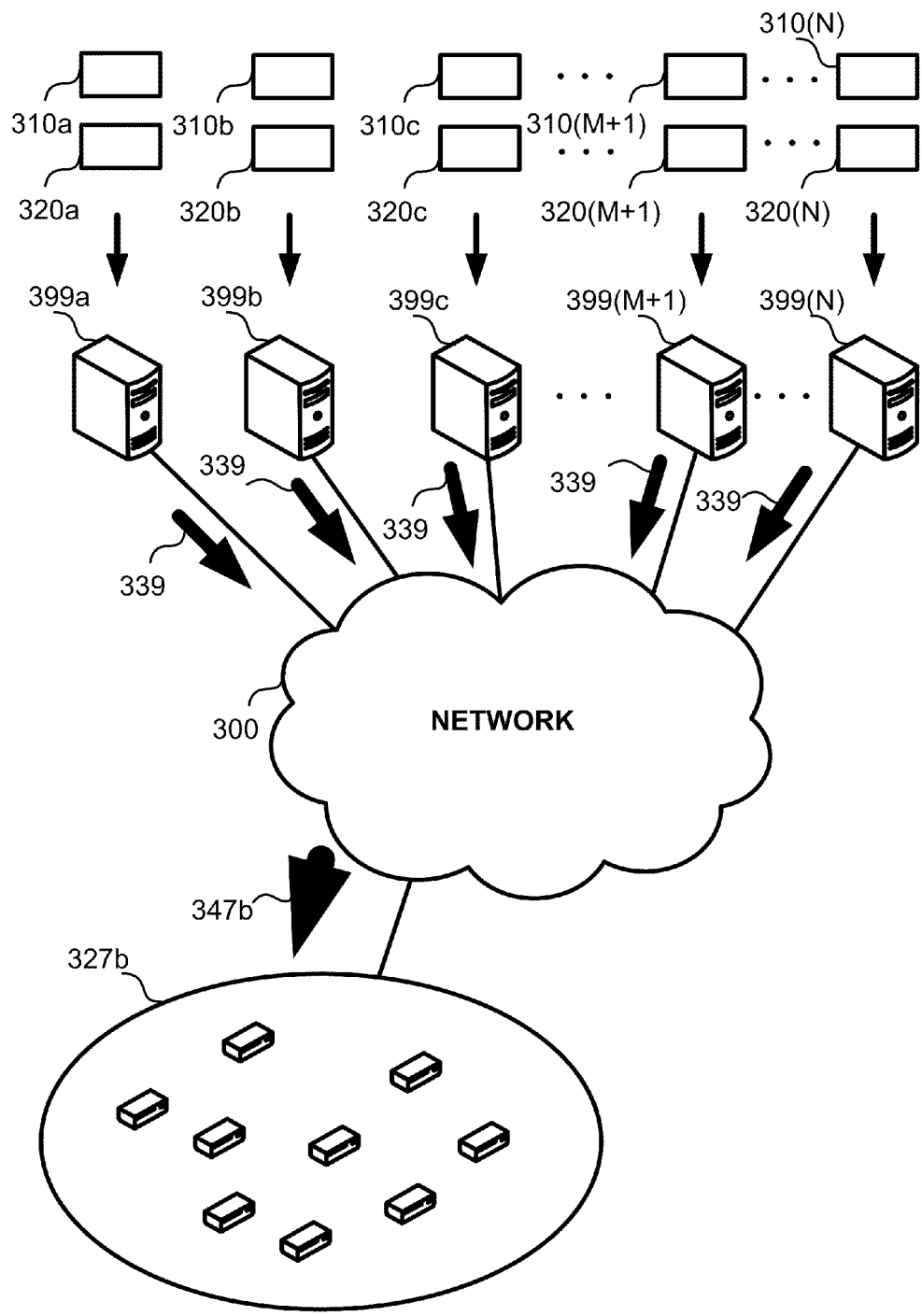

FIG. 43 illustrates the case where the first group 328a, which consumes content A, becomes larger than 329a, with a larger bandwidth Ba 348a. The second group 328b, which consumes content B, becomes smaller than 329b, with a smaller bandwidth Bb 348b, such that Ba is about the same as Bb. In this case, the array can still be exploited up to the aggregated bandwidth, since, as before, Ba+Bb can still be almost as high as N×B. FIG. 44 illustrates the case where the first group has disappeared, allowing the second group 327b, which consumes content B, to extract an aggregated bandwidth of Bb 347b that can potentially reach the limits of the server array, such that Bb=N×B. Again, this is achieved without updating the erasure-coded fragments associated with content A and content B, and without using inter-server interaction.

In some embodiments, the ability to utilize the aggregated bandwidth of approximately all of the participating servers, for the delivery of about any mixture of contents with about any mixture of content bandwidth demand, is made possible by one or more of the following: (i) each assembling device selecting a subgroup of the least loaded fractional-storage servers from which to retrieve the necessary number of erasure-coded fragments to reconstruct a segment or several segments (least-loaded server selection criterion); or (ii) each assembling device approximately randomly selecting a subgroup from which to reconstruct a segment or several segments, such that when many assembling devices select at random, the various fractional-storage servers are selected approximately the same number of times (or in proportion to their available resources, such as unutilized bandwidth), which in turn balances the load between the participating servers (random server selection criterion). It is noted that (i) the selections may be made by either the assembling devices themselves, or may be made for the assembling devices by a control server, which then communicates the selections to each of the assembling devices; (ii) the selections may be made approximately for each segment, or for a group of segments, or only once per content at the beginning of the content; (iii) some assembling devices may use an approximately random server selection criterion, while other assembling devices may use least-loaded server selection criterion; (iv) the least-loaded selected servers may be selected out of a portion of all available fractional-storage servers. For example, the least-loaded servers may be selected from fractional-storage servers with low latency response or with low hop count to the assembling device; (v) the least-loaded servers may include servers having the most unutilized bandwidth. Additionally or alternatively, it may include servers having any unutilized bandwidth left to serve additional assembling devices; (vi) an approximately random or least-loaded selection of servers may be made such that all servers are selected to determine a subgroup, or it can be made such that every time selections are made, only some servers are selected, while the others remain as before. In these cases, the assembling device runs a process in which only a small portion of the servers currently in the serving subgroup are reselected. In the case of approximately random selection, the assembling device may randomly select the number of servers in the serving subgroup for random selection (reselection in this case, since they are replacing other servers already in the serving subgroup of the specific assembling device), such that eventually, over time, all servers within the serving subgroup have the chance to be randomly reselected. In the case of least-loaded server selection, only the most loaded servers within the serving subgroup may be selected and replaced by less-loaded servers.

Figure 45:
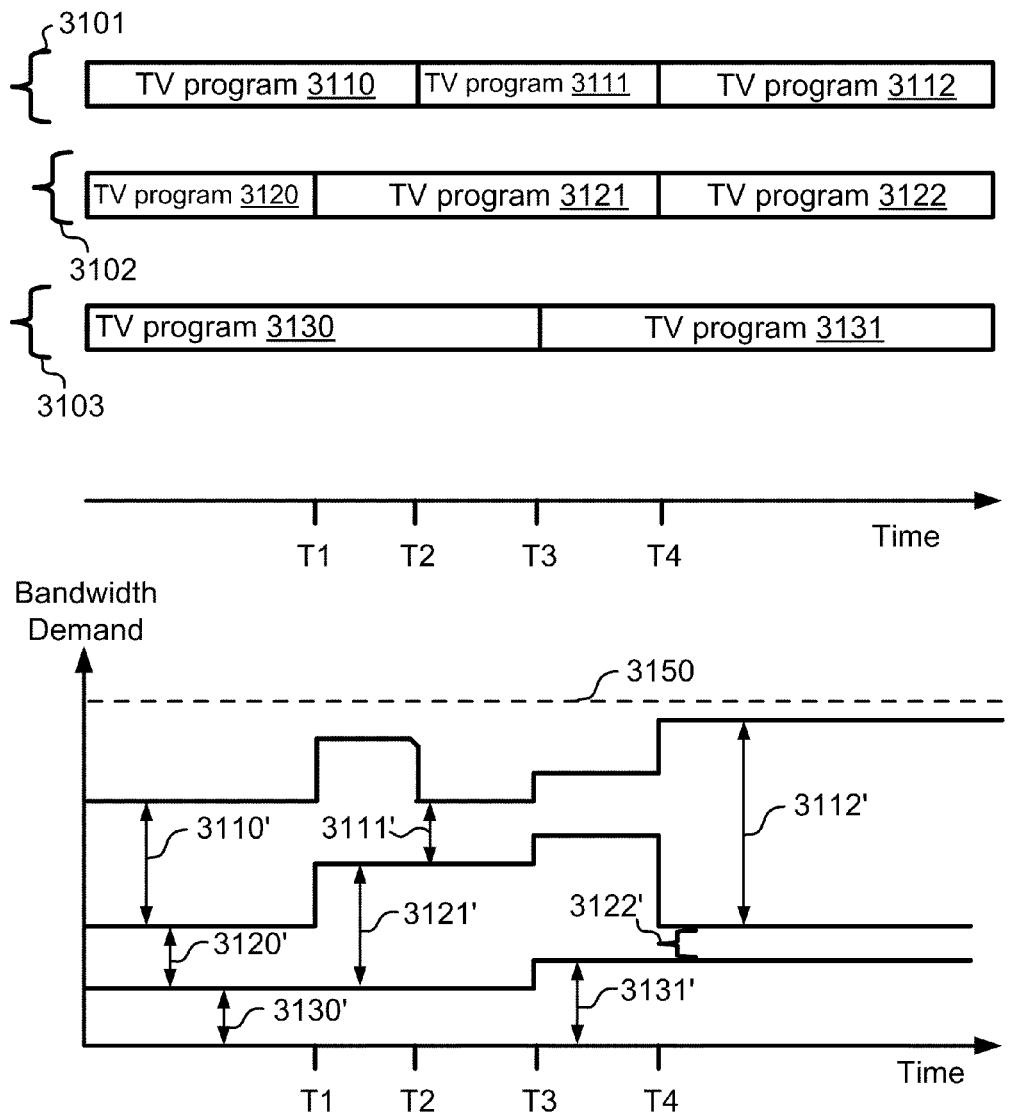
FIG. 45 illustrates utilization of the entire aggregated bandwidth of fractional-storage servers for multiple content delivery.

FIG. 45 illustrates one embodiment of using the entire aggregated bandwidth of the fractional-storage servers for delivering multiple contents. Approximately any number of contents having any mixture of bandwidth demand per content may be delivered, as long as the aggregated bandwidth demand does not exceed the aggregated bandwidth of the fractional-storage servers. In one example, broadcast-like streams 3101, 3102, and 3103 are delivered to multiple assembling devices via multiple fractional-storage servers. Each stream is a live TV channel carrying multiple TV programs. For example, stream 3101 comprises TV programs 3110 to 3112, each spanning a specific time interval. The other streams comprise of multiple TV programs as well. Before time T1, stream 3130 has a bandwidth demand of 3130' (meaning that all assembling devices that are currently retrieving stream 3130' use a total bandwidth of 3130' out of the fractional-storage servers). The other streams 3120 and 3110 have bandwidth demands of 3120' and 3110' respectively. The total bandwidth demand of the three streams 3130'+3120'+3110' does not exceed the aggregated bandwidth of the fractional-storage servers 3150, and therefore all streams are fully delivered to the assembling devices. The load of the three streams is spread approximately equally among the participating fractional-storage servers, optionally because of a mechanism that selects the least-loaded servers to serve each assembling device, and/or a mechanism that approximately randomly selects servers to serve each assembling device. At time T1, TV program 3120 ends, and TV program 3121 starts. Program 3121's demand 3121' is higher than the previous demand 3120', and therefore a higher aggregated bandwidth is drawn from the fractional-storage servers. Still, the aggregated bandwidth demand of all three streams (3130'+3121'+3110') is lower than the maximum possible 3150, and therefore the newly added bandwidth demand is fully supported by the servers. Optionally, the additional demand created by TV program 3121 (3121' minus 3120') is caused by the addition of new assembling devices that join stream 3102 and retrieving additional erasure-coded fragments. Additionally or alternatively, the additional demand created by TV program 3121 is caused by a higher bandwidth demand of TV program 3121, such as 3D data or higher resolution. Newly added assembling devices may choose fractional-storage servers from which to retrieve, according to a least-loaded server selection criterion and/or an approximately random server selection criterion, and therefore the total load is still spread approximately equally among the participating servers. At time T2, TV program 3110 ends, and a new program 3111 begins, which is less popular, and therefore creates a lower bandwidth demand 3111'. The result is a decrease in the total delivered bandwidth. At time T3 TV program 3130 ends, and TV program 3131 starts with a higher bandwidth demand of 3131'. At time T4 both TV programs 3111 and 3121 end, and two new programs 3112 and 3122 start. TV program 3112 is highly popular and therefore generates a large bandwidth demand 3112'. Program 3122 is not popular, and therefore generates a limited bandwidth demand 3122'. Some of the additional bandwidth needed by program 3112 is taken from servers that stop serving assembling devices previously retrieving program 3121, such that the aggregated bandwidth of all three streams (3131'+3122'+3112') is still below the maximum possible bandwidth 3150, despite the fact that program 3112 is generating a large bandwidth demand. This example illustrates how the fractional-storage servers support almost any demand mixture, as long as the aggregated demand of all streams is kept below the aggregated maximum capacity of the servers 3150. Consequently, the distribution of all of the streams to the fractional-storage servers is approximately unrelated to the changes in bandwidth demand for programs carried by each stream; each stream can be regarded as a sequence that is segmented, erasure-encoded, and distributed to the participating servers. There is no need to account for demand variations during the distribution of each stream, nor is there a need to know in advance the bandwidth demand for each stream or for each program within each stream. It is noted that the demand variations are illustrated as instant variations, but may also be gradual and may occur during a program and not necessarily when one program ends and the other begins.

By using a pull protocol or a push protocol with multiple sub-transmissions, the assembling device can obtain erasure-coded fragments from one, two or more different arrays of CDN servers and/or bandwidth amplification devices seamlessly.

Figure 50:
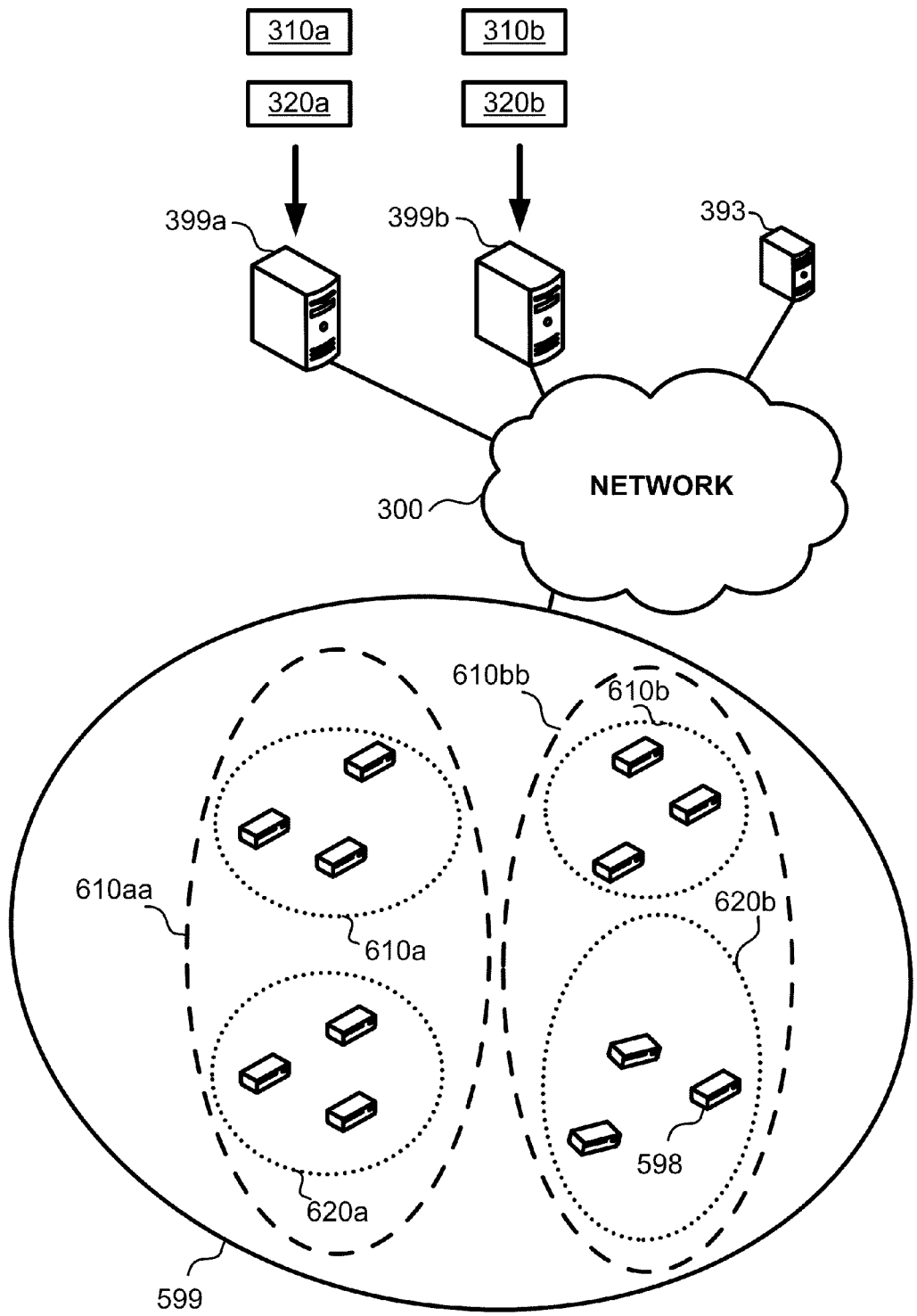
FIG. 50 illustrates a server array managing a pool of bandwidth amplification devices.

FIG. 50 illustrates one embodiment in which fractional-storage servers 399a and 399b are part of a server array. Fractional-storage servers 399a and 399b store erasure-coded fragments 310a and 310b of a first content, and erasure-coded fragments 320a and 320b of a second content. Server 393 is a control server that manages a pool of twelve registered bandwidth amplification devices surrounded by ellipse 599. One or more of the twelve bandwidth amplification devices may be assigned to one or more of the fractional-storage servers participating in the array. In the initial stage, no assignments have been made, and the twelve bandwidth amplification devices in pool 599 are ready to receive instructions. Next, the control server 393 allocates six bandwidth amplification devices of group 610aa to server 399a, and six bandwidth amplification devices of group 610bb to server 399b. Registering the bandwidth amplification devices with the servers may be processed using any appropriate method. From groups 610aa and 610bb, three bandwidth amplification devices 610a and 610b are allocated to store erasure-coded fragments 310a and 310b respectively (and, optionally, other erasure-coded fragments associated with consequent segments of the content); and three bandwidth amplification devices 620a and 620b are allocated to store erasure-coded fragments 320a and 320b respectively (and, optionally, other erasure-coded fragments associated with consequent segments of the content). After these allocations have been made, fractional-storage server 399a forwards erasure-coded fragment 310a to group 610a, and erasure-coded fragment 320a to group 620a. Fractional-storage server 399b forwards erasure-coded fragment 310b to group 610b, and erasure-coded fragment 320b to group 620b. At the end of the allocation and forwarding process, the bandwidth amplification devices are ready to act as bandwidth amplifiers to the fractional-storage server array 399a and 399b. Optionally, the allocation of bandwidth amplification devices to specific contents is performed by either the control server 393, or each fractional-storage server 399a and 399b.

It is noted that each bandwidth amplification device is not restricted to storing and serving erasure-coded fragments associated with a single content, and it is possible for each bandwidth amplification device to store and serve multiple erasure-coded fragments associated with multiple contents. The tradeoff in this case is that the more erasure-coded fragments from more contents are stored and served, the lower the bandwidth amplification factor, since the rate of forwarding fragments from the server to the bandwidth amplification devices increases, while the outgoing bandwidth available for each bandwidth amplification device remains the same.

In one embodiment, when a CDN server receives a request for an erasure-coded fragment, it may supply the erasure-coded fragment or supply an address of a bandwidth amplification device having an image of the requested erasure-coded fragment. Optionally, a bandwidth amplification device storing one erasure-coded fragment of a specific content also stores an image of some or all other erasure-coded fragments associated with the specific content (which are stored on the specific CDN server). Alternatively, the bandwidth amplification device stores unique erasure-coded fragments generated from the same segments used for generating the erasure-coded fragments stored on the specific CDN server. In these cases, the assembling device may approach the bandwidth amplification devices instead of the CDN server for the relevant erasure-coded fragments of the specific content until (i) the end of the content; (ii) a predefined time period elapses; (iii) receiving an appropriate message; or (iv) a combination of the aforementioned.

In one embodiment, an assembling device tries to obtain an erasure-coded fragment or sub-transmission from the relevant server, and if the server does not have the necessary bandwidth to respond with fragment/s, the server relays the fragment request/s to relevant bandwidth amplification devices. The relevant bandwidth amplification devices can then send the fragment/s directly to the assembling device.

In one embodiment, unique erasure-coded fragments can be distributed between two types of devices: (i) high bandwidth fractional-storage servers, such as CDN servers, and (ii) relatively low bandwidth and storage devices acting as bandwidth amplification devices, such as peer-to-peer (P2P) devices. Since the fragments distributed between the two types of devices are unique, any combination of devices, from both types, can be used to obtain a decodable set of fragments, if the combination of devices stores a decodable set of fragments. In one embodiment, there are at least ten times more bandwidth amplification devices than high bandwidth servers, and the redundancy factor used in decoding the fragments is greater than 10. In this case, the servers can be used all or most of the time, and the bandwidth amplification devices can be used from time to time, according to bandwidth requirements, and according to the availability of the bandwidth amplification devices. In one embodiment, the processes of obtaining a fragment from a server and from a bandwidth amplification device are essentially the same, and the fragments are essentially identical in construction and format. In one embodiment, the high redundancy factor needed to support a large hybrid array of servers and bandwidth amplification devices is achieved using rateless coding techniques.

Figure 51:
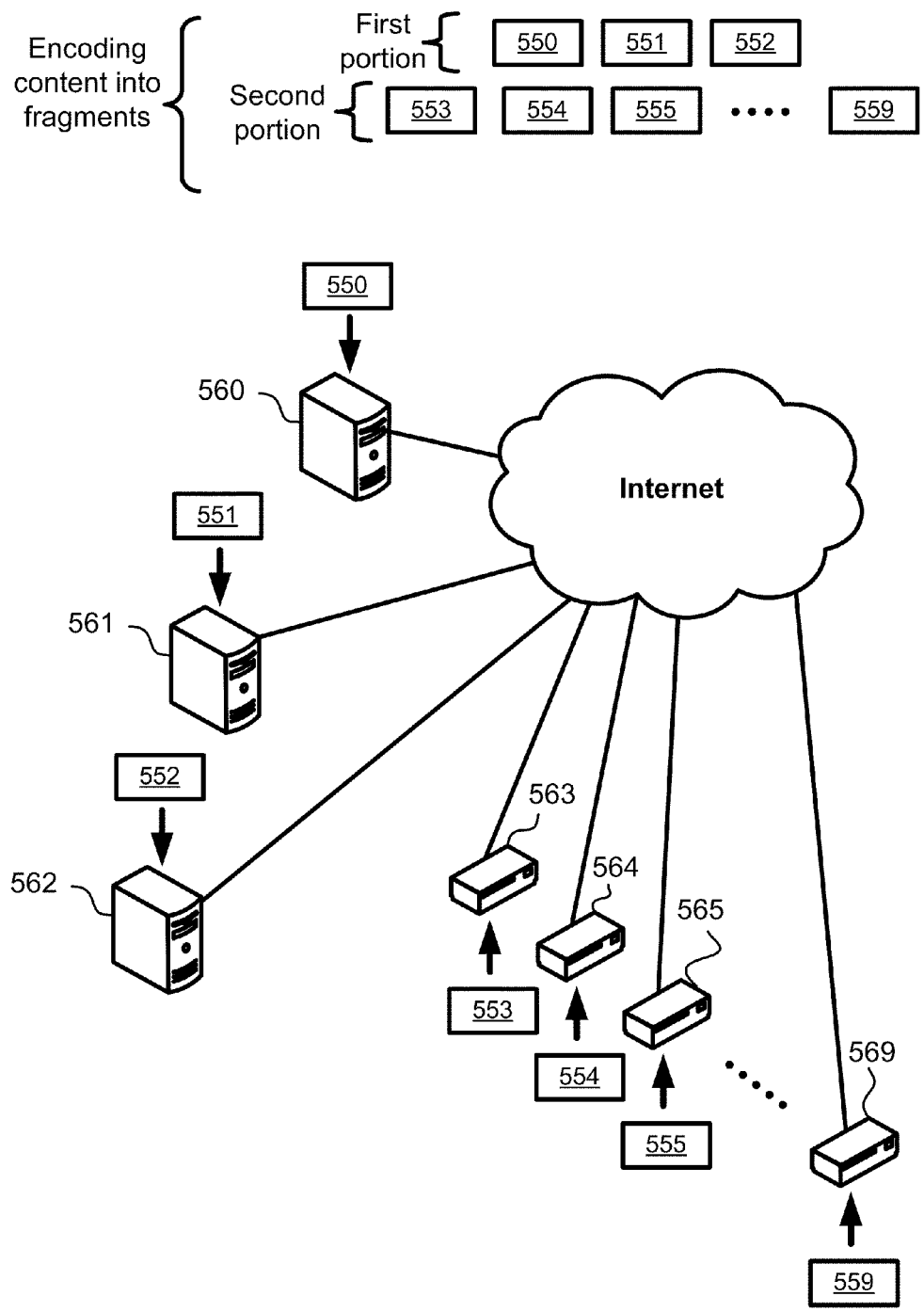
FIG. 51 illustrates a hybrid Servers-P2P system.

FIG. 51 illustrates one embodiment of hybrid Servers-P2P system using N unique erasure-coded fragments 550 to 559, generated from the same segment belonging to content. The fragments are partitioned into two groups: server group comprising fragments 550 to 552; and P2P group, comprising fragments 553 to 559. Fragments belonging to the first group (550 to 552) are distributed among fractional-storage servers 560 to 562 respectively. Fragments belonging to the second group (553 to 559) are distributed among P2P devices (acting as bandwidth amplification devices) 563 to 569 respectively. In one example, N=30,003, and there are close to 30,000 P2P devices. The following reconstruction modes assume that any three fragments are sufficient to reconstruct a segment:

In one reconstruction mode, the servers 560 to 562 have an aggregated fragment-delivery bandwidth sufficient to supply all fragment demands of assembling devices. In this case, the assembling devices obtain fragments only from the servers, and do not obtain any fragments from P2P devices.

In another reconstruction mode, the servers 560 to 562 have an aggregated fragment-delivery bandwidth that is insufficient to supply all fragment demands of assembling devices. In this case, the assembling devices obtain fragments from both the servers and the P2P devices. Any combination of three fragments forms a decodable set of fragments. Selecting combinations for the different assembling devices, according to bandwidth availability of both servers and P2P devices, results in a fragment delivery bandwidth that may approach the aggregated bandwidth of both the servers and P2P devices. According to the N=30,003 example, each P2P device has a fragment delivery bandwidth of 100 Kbps, and each server has a fragment delivery bandwidth of 1 Gbps. The three servers 560 to 562 contribute 1 Gbps×3=3 Gbps of fragment throughput. The 30,000 P2P devices contribute 100 Kbps×30,000=3 Gbps. The total fragment delivery bandwidth of the hybrid system therefore approximately equals 3 Gbps+3 Gbps=6 Gbps. A Hybrid system comprising such a large number of P2P devices needs a large redundancy factor. In the above example, the redundancy factor needed is approximately 30,003/3=10,000. Such large factors can be realized using rateless codes. In the above example, the bandwidth amplification factor=the total possible bandwidth including both servers and P2P devices divided by the maximal possible bandwidth using only the servers=6 Gbps/3 Gbps=2.

In one example, 1,000 fractional-storage CDN servers, each having a fragment delivery bandwidth of 10 Gbps, are combined with 10 million P2P devices, each having a fragment delivery bandwidth of 1 Mbps, to produce a (1,000×10G)+(10M×1M)=20 Tbps streaming system.

In one embodiment, the bandwidth amplification devices are used to supplement the streaming capabilities of the servers during peak traffic periods. In this case, the aggregated bandwidth of the fixed bandwidth lines connecting the servers to the Internet need not account for the full bandwidth demand. In one example, 1,000 CDN servers are connected to the Internet via fixed bandwidth lines having a total capacity of 10 Tbps. Demands above 10 Tbps, which occur during a 3-hour period in the evening, are met by utilizing additional fragment delivery bandwidth of P2P devices acting as bandwidth amplification devices.

In one embodiment, the content is streaming content comprising approximately sequential segments, and the assembling devices attempt to obtain decodable sets of fragments from the servers. Upon failure or an estimated failure to obtain the sets, the assembling devices obtain the additionally needed fragments from one or more of the bandwidth amplification devices.

In one embodiment, the assembling devices receive an indication whether to use the bandwidth amplification devices as additional fragment sources to the servers. This indication may be received during periods of high fragment demands, exceeding the servers' capacity. The indication may be sent by the fractional servers or by a control server.

Figure 46:
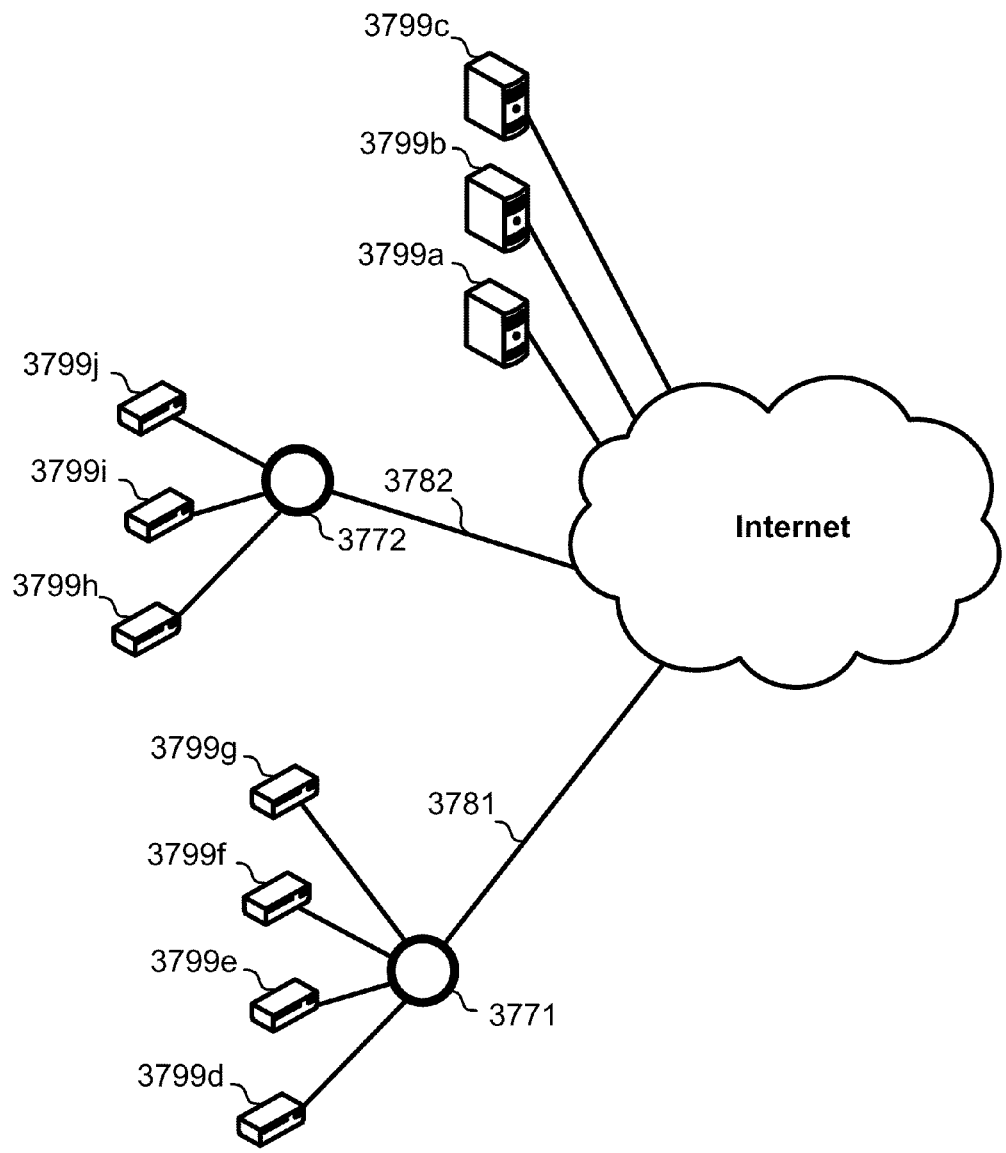
FIG. 46 illustrates boosting fractional-storage servers' bandwidth using P2P devices.

FIG. 46 illustrates one embodiment in which fractional-storage servers 3799a to 3799c store a first portion of rateless-coded fragments; and a large number of P2P bandwidth amplification devices 3799d to 3799j store a second portion of the rateless-coded fragments. Decodable sets of fragments can be obtained from combinations of fragments from the first and second portions of the fragments. Optionally, the fragments are obtained approximately only from P2P devices serviced by ISPs 3771, 3772 having communication lines estimated not to be overloaded by additional fragment traffic.

In one embodiment, the P2P devices are spread over different time zones spanning at least three hours, and the fragments are obtained approximately only from P2P devices located in time zones in which the current local Internet traffic is relatively low in comparison to peak local traffic.

In one example, ISP 3771 is located on the US west coast, and ISP 3772 is located in Europe. At 6 PM PST, the general Internet traffic associated with ISP 3771 is at its peak level, meaning that communication line 3781 used by ISP 3771 is at or close to its maximal traffic capacity. At that time, the local time in Europe is midnight, and the general Internet traffic associated with ISP 3772 is at a low level, meaning that communication line 3782 used by ISP 3772 has a significant unutilized bandwidth. In this case, fragments are obtained by assembling devices approximately only from device combinations comprising servers 3799a to 3799c, and amplification devices 3799h to 3799j. Fragment delivered by devices 3799h to 3799j pass via the uncongested communication line 3782, and thus pose no threat to ISP 3772. Communication line 3781 is not utilized for fragment delivery, and thus devices 3799d to 3799g do not contribute additional traffic loads to the already congested line 3781. At a different time of day the situation is reversed, the European ISP becomes congested while the US ISP is at low capacity, and the fragments are obtained accordingly.

In one embodiment, all fractional-storage servers within the server array are replaced with client devices residing in customers' premises (CPEs). The CPEs perform the exact same functions as the server array, and in that respect may be referred to as a CPE array.

Figure 47:
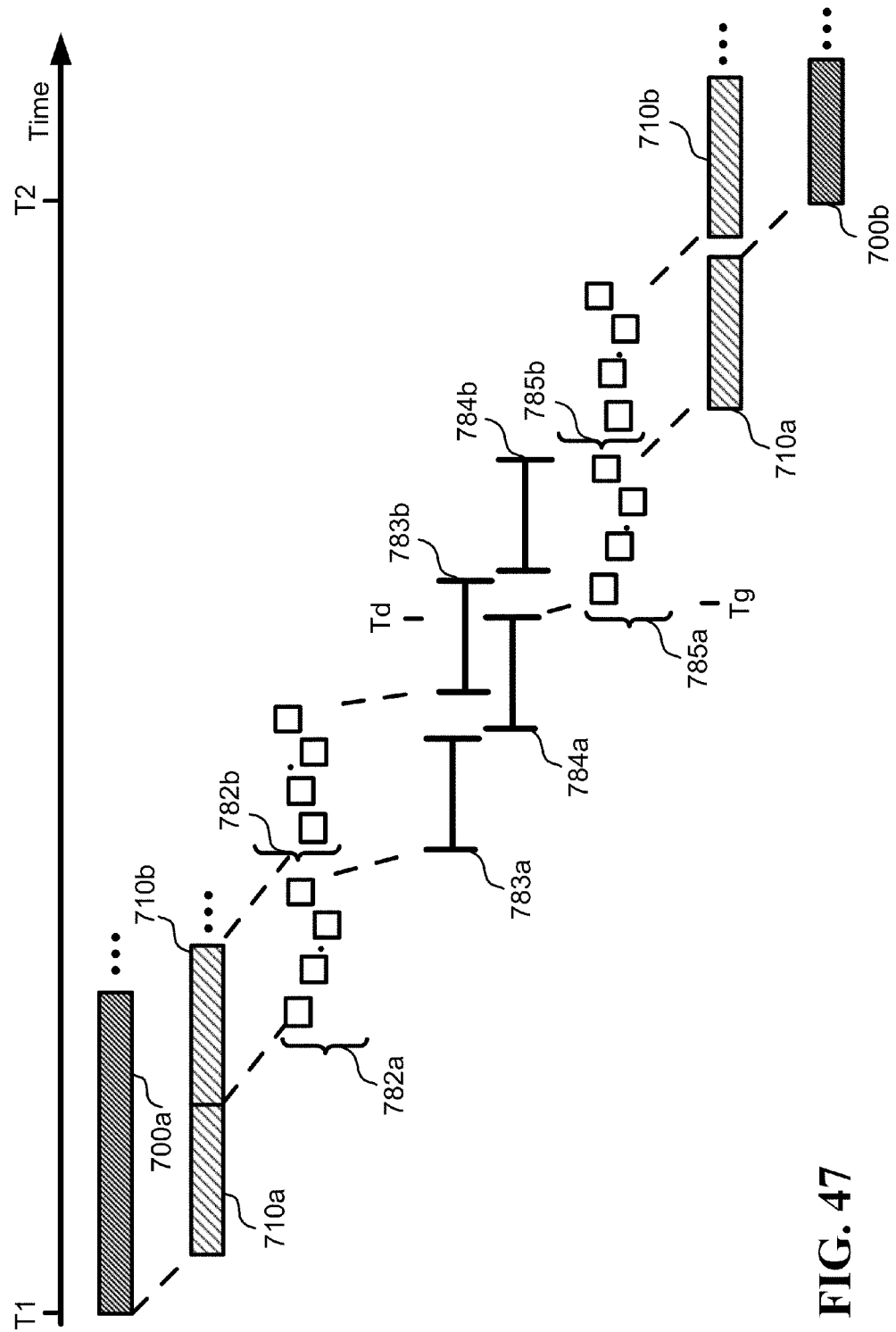
FIG. 47 illustrates a broadcast-like effect.

FIG. 47 illustrates one example of creating a broadcast-like effect (i.e. retrieving the content while it is distributed). Streaming content 700a, which may be ready in advance or received on-the-fly, is to be received and presented by multiple assembling devices at approximately the same time. Content 700a is segmented into segments on-the-fly, such that the first segment 710a is ready shortly after the data is available, and subsequent segment 710b is ready right after that. Segments 710a and 710b are sequentially encoded into erasure-coded fragments 782a and 782b correspondingly, such that the average rate of encoding segments into erasure-coded fragments does not fall below the average rate of introducing new segments (as content 700a is being received for broadcast).

As the erasure-coded fragments 782a are ready, they are distributed 783a to the fractional-storage servers. Subsequent erasure-coded fragments 782b are similarly distributed 783b to the servers, such that the average rate of distributing the erasure-coded fragments associated with each segment does not fall below the rate of introducing new segments (or in other words, such that there is approximately no piling-up of undistributed segments). Optionally, the erasure-coded fragments 782a are also distributed 784a by the servers to bandwidth amplification devices at an average distribution rate per segment that does not fall below the average rate of introducing new segments.

The assembling devices obtain erasure-coded fragments 785a associated with segment 710a from the fractional-storage servers, and optionally also from the bandwidth amplification devices. Subsequent erasure-coded fragments, such as 785b associated with segment 710b, are obtained at an average rate that does not fall below the average rate of introducing the new segments. The segment 710a is then reconstructed from the obtained erasure-coded fragments 785a. The subsequent segment 710b is reconstructed from the obtained erasure-coded fragments 785b, such that reconstructing each segment is performed at an average rate that does not fall below the average rate of introducing the new segments.

Then, the reconstructed segments are presented, optionally on-the-fly, as reconstructed content 700b. In one embodiment, the entire process end-to-end is performed in real time, such that the presentation of 700b starts at T2 minus T1 after the availability of content 700a, and such that the delay of T2 minus T1 (between the availability of new segments and their subsequent presentation by the assembling device) is kept approximately constant throughout the entire presentation of the streaming content 700b, once begun.

In one example, the content 700a is a 4 Mbps video stream, and the segment size is 96 Kbytes, meaning that new segments 710a, 710b are made available at a rate of one every 0.19 seconds. Assuming that each process as described takes 0.19 seconds, and that all processes are performed sequentially (with no overlapping in time, which may be possible for some of the processes), then the accumulated process time, which includes 710a, 782a, 783a, 784a, 785a and 710a, takes about 6×0.19=1.14 seconds. This means that an assembling device may begin with content presentation 1.14 seconds after the content is first made available to the system.

Still referring to FIG. 47, in one embodiment, the fragments are obtained from the servers using multiple sub-transmissions, such that each transmitting server sends a fraction of the needed fragments to the assembling device, according to the sequential order of segments. Each sub-transmission transmits the fragments approximately at a rate at which the fragments are being created on-the-fly from segments of the content to be received by the assembling device. According to another embodiment, the fragments are obtained from the servers using fragment requests made by the assembling device using a fragment pull protocol.

The Audio/Video compression utilized in creating content 700a is not necessarily a fixed rate compression, meaning that the various resulting segments do not necessarily contain the same amount of presentation time.

In one embodiment, once starting to retrieve a broadcast-like stream, the assembling device may use one of the following methods to synchronize the retrieval of the stream's segments with the ongoing availability of new segments of the stream: (i) The assembling device retrieves additional segments such that the average rate of obtaining new frames approximately equals the average rate of presenting frames. (ii) The assembling device retrieves additional segments such that it does not try to retrieve segments that are not yet indicated as being available. And (iii) The assembling device retrieves additional segments so as to approximately maintain a constant distance (in segments) between the most currently available segment and the segment currently being retrieved.

In one embodiment, the assembling device presents the broadcast-like stream at approximately the same frame rate as the rate of producing new frames for the broadcast-like stream. In one example, the frame rate is constant throughout the stream, such as the case of fixed 24, 25, 50, or 60 frames per second.

In one embodiment, the assembling device obtains an indication regarding the most newly available segment (per specific broadcast-like stream) for retrieval. The assembling device then starts to retrieve from the most newly available segment. In one example, the most newly available segment is the last segment that was distributed to the fractional-storage servers. In another example, the most newly available segment is a segment that was recently distributed to the fractional-storage servers, but wherein there are newer distributed segments, which are not yet indicated as being available.

In one embodiment, the broadcast-like stream is of a pre-recorded content, such that it is possible to distribute the entire content to the fractional-storage servers, and after any period of time allow the real time consumption of the content by any number of assembling devices. In such a case, an indication is made to the assembling devices regarding the real time allowance to retrieve the related segments. The allowance can start at a certain point in time (which corresponds to the beginning of the broadcast-like "transmission") for the first segment, and then the allowance may continue for subsequent segments, at a rate that approximately corresponds to sustaining the frame rate of the broadcast-like stream.

Figure 48:
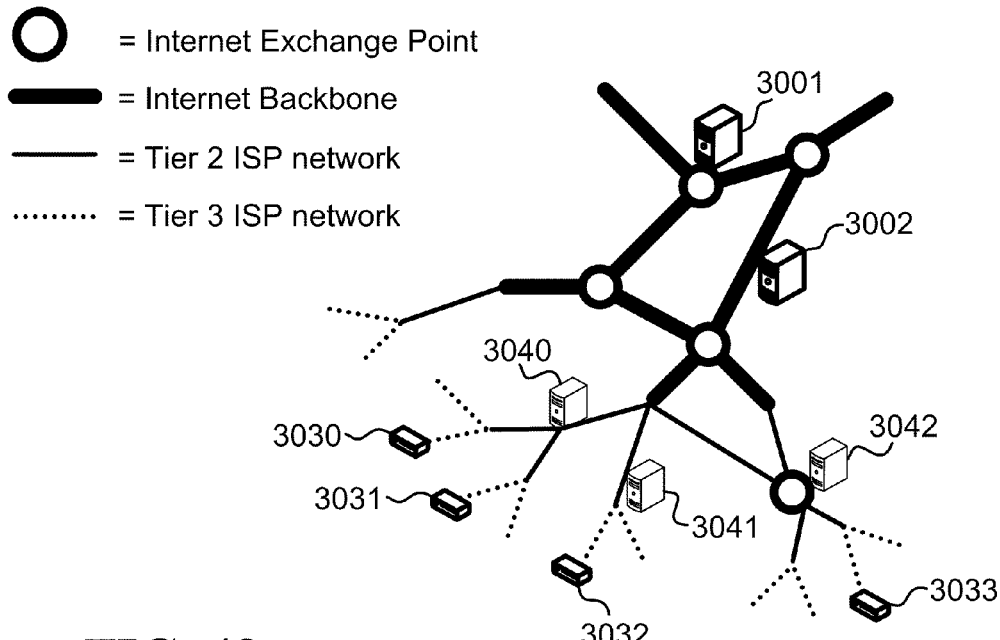
FIG. 48 illustrates fractional-storage servers located on an edge of the Internet, supported by servers located on the Internet backbone.

FIG. 48 illustrates one embodiment of a plurality of fractional-storage CDN servers 3040, 3041 and 3042 located on edges of the Internet, supported by CDN servers 3001, 3002 located close to or on the Internet backbone. Each of the edge servers 3040, 3041 and 3042 stores a small quantity of the erasure-coded fragments needed to reconstruct each of the contents that are available to the corresponding clients 3030 and 3031, 3032, and 3033; while the backbone servers 3001, 3002 store at least approximately enough erasure-coded fragments to reconstruct a plurality of contents. When a client device orders a content from its nearby edge server, the edge server obtains approximately the minimum quantity of erasure-coded fragments that, together with the zero or more fragments stored on the edge server, enable reconstruction of a required segment without retransmission from the backbone server to the edge server. In other words, the edge server uses its stored erasure-coded fragments to have enough fragments for reconstruction of the segment, thus avoiding the request of retransmission. In one embodiment, the edge server stores more fragments than needed to compensate for fragment loss. As a result, the edge server may reduce the quantity of fragments obtained from the backbone servers. Using the already stored fragments shortens the time to reconstruct the required segment and eliminates the need to transmit redundant data for dealing with unknown fragment loss. The edge server then reconstructs the segment and streams the reconstructed content, or a transcoded version of the content, to the client device.

Figure 49:
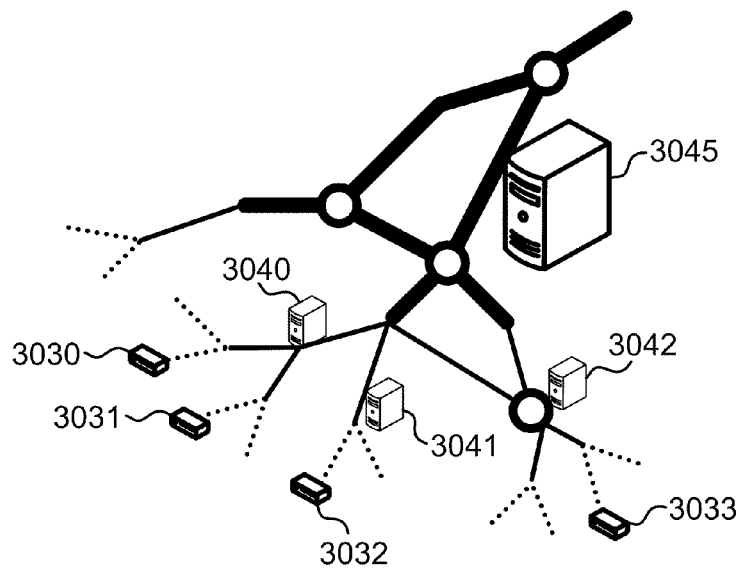
FIG. 49 illustrates fractional-storage servers located on an edge of the Internet, supported by a content delivery center located on the Internet backbone.

FIG. 49 illustrates one embodiment of a plurality of fractional-storage CDN servers 3040, 3041 and 3042 located on edges of the Internet, supported by a content delivery center 3045 housing ten to thousands of servers located close to or on the Internet backbone. Each of the edge servers 3040, 3041 and 3042 stores a small quantity of the erasure-coded fragments needed to reconstruct each of the contents that are available to the corresponding clients 3030 and 3031, 3032, and 3033; while the content delivery center 3045 stores at least approximately enough erasure-coded fragments to reconstruct a plurality of contents. When a client device orders a content from its nearby edge server, the edge server obtains approximately the minimum quantity of erasure-coded fragments from the content delivery center 3045 that, together with the zero or more fragments stored on the edge server, enable reconstruction of a required segment without retransmission from the backbone server to the edge server. Then the edge server reconstructs the segment and streams the reconstructed content or a transcoded version of the content to the client device.

In one embodiment, a real-time proxy server located at or close to an edge of the Internet, configured to obtain erasure-coded fragments from at least one CDN server located close to or on the Internet backbone. If the proxy server has less fragments than needed to reconstruct a segment, the proxy obtains the remaining fragments from at least one fractional-storage server having much lower latency to the proxy than the backbone servers. Optionally, the proxy and the close fractional-storage servers are the same server. Optionally, the fractional-storage CDN server is further configured to reconstruct the segment and stream the segment or a transcoded version of the segment to a client device, whereby the latency between the edge server and the client device is much lower than the average latency between the edge server and the at least one backbone server. Optionally, the erasure-coded fragments are rateless-coded fragments, the segments are approximately sequential segments, and the fractional-storage CDN server is further configured to obtain fragments associated with a future segment while reconstructing a current segment. Optionally, the erasure-coded fragments are rateless-coded fragments, and the at least one CDN server located close to or on the Internet backbone pushes the erasure-coded fragments to the fractional-storage CDN server located at an edge of the Internet. Optionally, the erasure-coded fragments are obtained using a pull protocol. Optionally, the pull protocol is a fragment pull protocol for high latency, and the erasure-coded fragments are rateless-coded fragments. Optionally, the erasure-coded fragments are rateless-coded fragments, and the CDN servers located close to or on the Internet backbone are fractional-storage CDN servers. Optionally, the erasure-coded fragments are generated from segments of streaming content; and wherein the majority of the fragments stored on the edge server are associated with the segments designed for trick play. Optionally, the erasure-coded fragments are rateless-coded fragments, and the edge server stores less than 20 percent of the fragments it obtains from the at least one backbone server.

In the claims, a sentence such as "the erasure-coded fragments support source-selection diversity" is to be interpreted as fragments encoded using any kind of erasure-code that can produce N unique fragments, from which C combinations of decodable sets of fragments can be selected, wherein C is much greater than N. Standard parity checks, standard checksums, and standard cyclic redundancy checks (CRC) are examples of codes that do not support source-selection diversity.

In this description, numerous specific details are set forth. However, the embodiments of the invention may be practiced without some of these specific details. In other instances, well-known hardware, software, materials, structures and techniques have not been shown in detail in order not to obscure the understanding of this description. In this description, references to "one embodiment" mean that the feature being referred to may be included in at least one embodiment of the invention. Moreover, separate references to "one embodiment" or "some embodiments" in this description do not necessarily refer to the same embodiment. Illustrated embodiments are not mutually exclusive, unless so stated and except as will be readily apparent to those of ordinary skill in the art. Thus, the invention may include any variety of combinations and/or integrations of the features of the embodiments described herein.

Although some embodiments may depict serial operations, the embodiments may perform certain operations in parallel and/or in different orders from those depicted. Moreover, the use of repeated reference numerals and/or letters in the text and/or drawings is for the purpose of simplicity and clarity and does not in itself dictate a relationship between the various embodiments and/or configurations discussed. The embodiments are not limited in their applications to the details of the order or sequence of steps of operation of methods, or to details of implementation of devices, set in the description, drawings, or examples. Moreover, individual blocks illustrated in the figures may be functional in nature and do not necessarily correspond to discrete hardware elements. While the methods disclosed herein have been described and shown with reference to particular steps performed in a particular order, it is understood that these steps may be combined, sub-divided, or reordered to form an equivalent method without departing from the teachings of the embodiments. Accordingly, unless specifically indicated herein, the order and grouping of the steps is not a limitation of the embodiments. Furthermore, methods and mechanisms of the embodiments will sometimes be described in singular form for clarity. However, some embodiments may include multiple iterations of a method or multiple instantiations of a mechanism unless noted otherwise. For example, when a controller or an interface are disclosed in an embodiment, the scope of the embodiment is intended to also cover the use of multiple controllers or interfaces.

Certain features of the embodiments, which may have been, for clarity, described in the context of separate embodiments, may also be provided in various combinations in a single embodiment. Conversely, various features of the embodiments, which may have been, for brevity, described in the context of a single embodiment, may also be provided separately or in any suitable sub-combination.

Embodiments described in conjunction with specific examples are presented by way of example, and not limitation. Moreover, it is evident that many alternatives, modifications and variations will be apparent to those skilled in the art. It is to be understood that other embodiments may be utilized and structural changes may be made without departing from the scope of the embodiments. Accordingly, it is intended to embrace all such alternatives, modifications and variations that fall within the spirit and scope of the appended claims and their equivalents.

What is claimed is:

1. A streaming system comprising:
a plurality of fractional-storage CDN servers, configured to store erasure-coded fragments associated with streaming contents,
wherein a fractional-storage CDN server is configured to store less than a minimum amount of data required to decode the erasure-coded fragments; and
a plurality of assembling devices configured to obtain the erasure-coded fragments from subsets of the plurality of fractional-storage CDN servers, wherein:
the plurality of assembling devices are scattered over different time zones, and a subset of the plurality of fractional-storage CDN servers comprises less than all of the plurality of fractional-storage CND servers,
at peak times of a day of the most loaded time zone corresponding to the plurality of assembling devices, the plurality of assembling devices belonging to the most loaded time zone are configured to generate a content demand greater than a predefined percent of the total fragment delivery bandwidth available to the plurality of fractional-storage CDN servers, and
the plurality of assembling devices are further configured to generate a content demand greater than the predefined percent over a duration of at least two times the duration of the peak times of the most loaded time zone.

2. The streaming system of claim 1, wherein the plurality of assembling devices located at different time zones are configured to generate their daily peak streaming demand at different times.

3. The streaming system of claim 2, wherein the majority of the plurality of fractional-storage CDN servers are connected to the Internet via a plurality of guaranteed bandwidth connections having an aggregated bandwidth B.

4. The streaming system of claim 3, wherein the plurality of assembling devices are further configured to balance essentially any bandwidth load among the plurality of fractional-storage CDN servers, provided that the throughput at which the plurality of fractional-storage CDN servers provide erasure-coded fragments does not exceed B.

5. The streaming system of claim 3, wherein the streaming system is configured to increase the total amount of fragments transmitted during a day via the guaranteed bandwidth connections and decrease the peak to average streaming traffic ratio as the plurality of assembling devices are scattered over more time zones.

6. The streaming system of claim 3, wherein the streaming system is configured to have a peak to average streaming traffic ratio of the plurality of fractional-storage CDN servers essentially approaching one if the demand created by different assembling devices located around the globe is distributed essentially uniformly over the day.

7. The streaming system of claim 3, wherein the plurality of assembling devices are configured to balance the bandwidth load among the plurality of fractional-storage CDN servers by selecting from which fractional-storage CDN servers to obtain the erasure-coded fragments by themselves.

8. The streaming system of claim 2, wherein the plurality of assembling devices are configured to use a fragment pull protocol to control the obtained fragment rate.

9. The streaming system of claim 2, wherein the plurality of assembling devices are configured to obtain the erasure-coded fragments using multiple streams from multiple fractional-storage CDN servers, each stream containing a fraction of the fragments, and the erasure-coded fragments support source-selection diversity.

10. The streaming system of claim 2, wherein the plurality of fractional-storage CDN servers are located close to or on the Internet backbone, and the plurality of assembling devices are further configured to obtain the erasure-coded fragments from subsets of the plurality of fractional-storage CDN servers essentially regardless of distances between the plurality of fractional-storage CDN servers and the clients.

11. The streaming system of claim 2, wherein the plurality of assembling devices are located at user premises, and the erasure-coding is rateless coding.

12. The streaming system of claim 2, wherein the streaming contents comprise segments from which the fragments are encoded, and the plurality of assembling devices are configured to first obtain fragments associated with segments belonging to the beginning of the content.

13. The streaming system of claim 2, wherein the plurality of fractional-storage CDN servers are scattered over at least two continents, and some of the fractional-storage CDN servers located in different continents are configured to store erasure-coded fragments associated with the same contents.

14. A streaming system comprising:
a plurality of servers connected to the Internet via multiple connections having an aggregated outgoing fragment delivery bandwidth B, configured to individually store at least one erasure-coded fragment associated with segment of streaming content but less than a minimum amount of data needed to decode the stored fragments; and
a plurality of assembling devices scattered over different time zones, wherein:
the plurality of assembling devices are configured to pull the erasure-coded fragments from the plurality of servers, each fragment pull request is associated with a specific segment, and
the plurality of assembling devices are further configured to balance bandwidth load among the plurality of servers via the fragment pull requests as long as the resulting throughput at which the servers provide erasure-coded fragments does not exceed B.

15. The streaming system of claim 14, wherein the at least one of the plurality of assembling devices is further configured to request most of the time fragments having sizes for which the time to transmit each fragment in response to the assembling device request, through the slowest communication link connecting the responding server and the assembling device, is smaller than the round trip communication delay between the assembling device and the responding server, excluding the processing time of the responding server.

16. The streaming system of claim 14, wherein the streaming system is configured to increase the total amount of fragments transmitted during a day via the outgoing bandwidth connections and decrease the peak to average streaming traffic ratio as the plurality of assembling devices are scattered over more time zones.

17. A distributed streaming system, comprising:
servers connected to the Internet via connections having an aggregated outgoing fragment delivery bandwidth B, configured to:
individually store at least one erasure-coded fragment associated with segment of streaming content but less than a minimum amount of data needed to decode the stored fragments, and
deliver the stored fragments at a combined rate that approaches B, to a large number of recipients scattered over at least one continent,
wherein the system is configured to allow a recipient to receive erasure-coded fragments from servers located in different time-zones relative to the recipient, and
the system is further configured to achieve a daily peak to average streaming traffic ratio that is lower than the daily peak to average streaming traffic ratio generated by demand of recipients in a single time zone.

18. The distributed streaming system of claim 17, wherein the recipients are configured to control the received fragment rate and identity using a fragment pull protocol.

19. The distributed streaming system of claim 17, wherein the streaming contents comprise segments from which the fragments are encoded, and the recipients are configured to first obtain the erasure-coded fragments associated with segments belonging to the beginning of the contents.

20. The distributed streaming system of claim 17, wherein the servers are located dose to or on the Internet backbone, the recipients are located at user premises, and erasure coding is rateless coding.

* * * * *